(12) United States Patent
Yi et al.

(10) Patent No.: US 7,622,899 B2
(45) Date of Patent: Nov. 24, 2009

(54) ORGANIC ELECTROLUMINESCENCE DISPLAY AND METHOD OF FABRICATING THE SAME

(75) Inventors: Seung Jun Yi, Seoul (KR); Kyung Hee Choi, Seoul (KR); Do Hyun Choi, Seoul (KR)

(73) Assignee: Daewoo Electronics Service Co., Ltd., Seoul (KR)

( * ) Notice: Subject to any disclaimer, the term of this patent is extended or adjusted under 35 U.S.C. 154(b) by 898 days.

(21) Appl. No.: 11/168,665

(22) Filed: Jun. 29, 2005

(65) Prior Publication Data

US 2006/0003266 A1    Jan. 5, 2006

Related U.S. Application Data

(63) Continuation-in-part of application No. PCT/KR2004/002366, filed on Sep. 19, 2004.

(30) Foreign Application Priority Data

Sep. 16, 2003 (KR) .................. 10-2003-0064253
Mar. 15, 2004 (KR) .................. 10-2004-0017477

(51) Int. Cl.
*H01J 9/227* (2006.01)
(52) U.S. Cl. .................. 320/321; 445/24
(58) Field of Classification Search .................. None
See application file for complete search history.

(56) References Cited

U.S. PATENT DOCUMENTS

| 6,306,559 | B1 | 10/2001 | Tanamura et al. ......... 430/315 |
| 6,630,785 | B1 | 10/2003 | Lu .................. 313/505 |
| 2003/0052596 | A1 | 3/2003 | Yi et al. .................. 313/504 |

FOREIGN PATENT DOCUMENTS

KR    2003-24565 A    3/2003

*Primary Examiner*—John A. McPherson
(74) *Attorney, Agent, or Firm*—Bacon & Thomas, PLLC

(57) ABSTRACT

The present invention relates to an organic electroluminescence display and a fabricating method thereof enabling to simplify a manufacturing process and reduce a product cost by separating devices with a single insulating pattern. The present invention includes the steps of: forming a plurality of stripe type first electrodes on a substrate; forming an insulating layer on the substrate including the first electrodes; forming a lattice type first insulating pattern on a first area crossing with the first electrodes and a second area between the first electrodes by patterning the insulating layer; forming a second insulating pattern by removing an upper portion of a part of the first insulating pattern on the first area at least and an upper portion of the first insulating pattern on the second area; forming organic light-emitting layers on the first electrodes; and forming a plurality of second electrodes on the organic light-emitting layers.

26 Claims, 46 Drawing Sheets

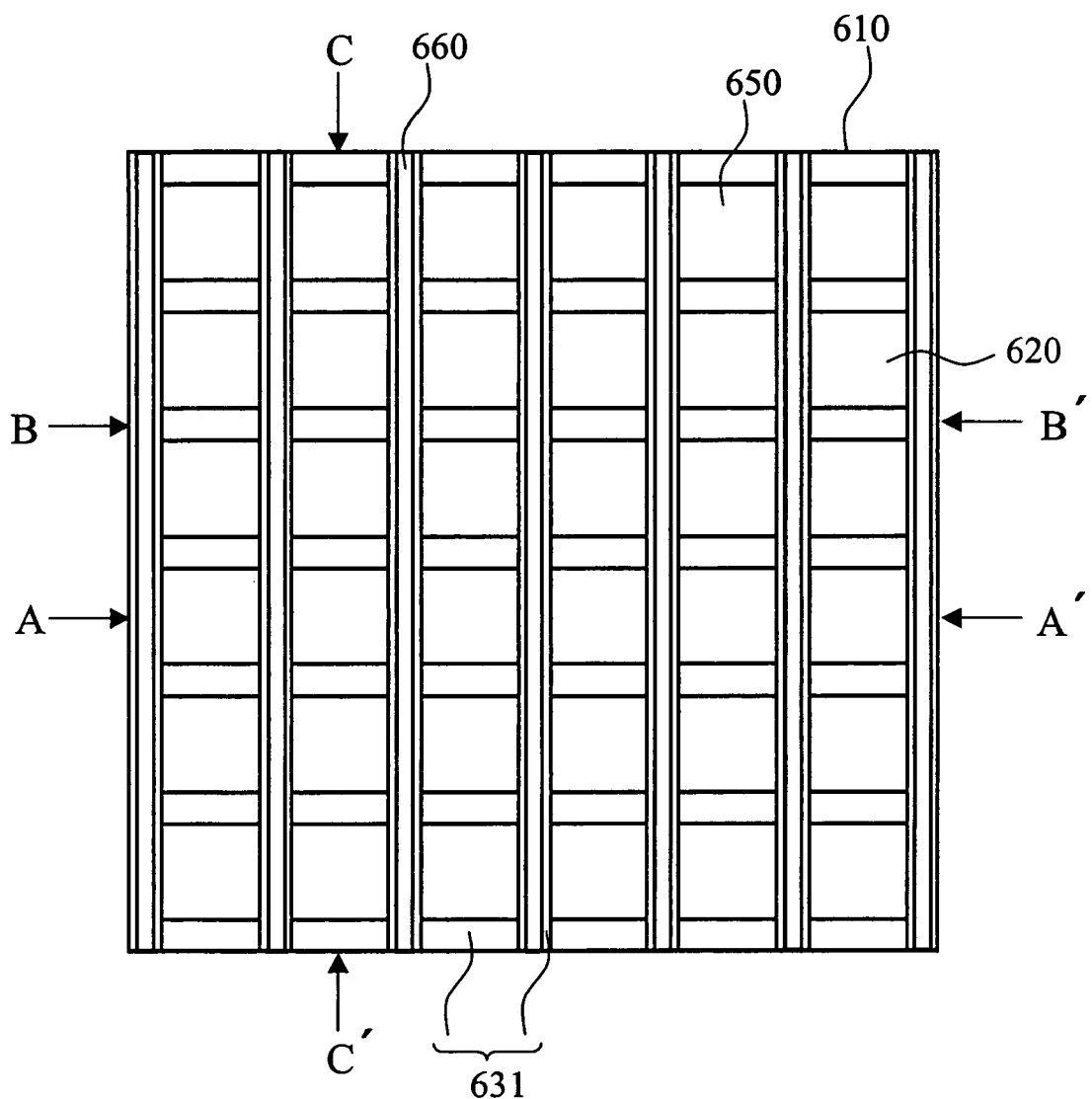

ORGANIC ELECTROLUMINESCENCE DISPLAY AND METHOD OF FABRICATING THE SAME

This application is a Continuation-In-Part Application of PCT International Application No. PCT/KR2004/002366 filed on Sep. 16, 2004, which designated the United States.

FIELD OF THE INVENTION

The present invention relates to an organic electroluminescence display and a fabricating method thereof; and, more particularly, to an organic electroluminescence display and a fabricating method thereof enabling to simplify a manufacturing process and reduce a product cost by separating devices with a single insulating pattern.

BACKGROUND OF THE INVENTION

Generally, an organic electroluminescence display, which is one of flat plate displays, is configured in a way that an organic electroluminescence layer is inserted between a cathode layer and an anode layer on a transparent substrate. The organic electroluminescence display has a very thin thickness and, further, can be formed in a matrix type. Further, the organic electroluminescence display can be driven by a low voltage below 15 V, and has more excellent characteristics in a brightness, a viewing angle, a response time, a power consumption, or the like in comparison with TFT-LCD. Especially, the organic electroluminescence display has a fast response time of 1 µs in comparison with other displays and, accordingly, is very suitable for a next generation multimedia display to which a function of moving pictures is essential.

Since, however, an organic light-emitting layer and a cathode layer of the organic electroluminescence display are vulnerable to oxygen and moisture, an exposure to outer air should be excluded during a fabricating process in order to secure a reliability of the organic electroluminescence display. Hence, the fabricating process of the organic electroluminescence display is unable in general to use a photolithography for a pixellation or a patterning process.

The pixellation of the organic layer and the cathode layer of the organic electroluminescence display uses a direct pixellation using a shadow mask instead of the photolithography including a masking process and an etching process in which the organic layer and the cathode layer are exposed to oxygen and moisture. However, such a method is inadaptable to use if a pitch between pixels, i.e., an interval between lines constituting the organic layer and the cathode layer, is reduced to realize a high resolution.

One of the general methods of patterning the organic electroluminescence display is carried out in a manner that an insulating layer of an electrically insulating material and a separator are formed on an anode layer and a substrate and, then, a cathode layer is patterned by using the separator.

In this method, the insulating layer is formed on an entire area of the anode layer except a dot-shaped opening. In this case, the insulating layer defines pixels by the opening and inhibits a leakage current from edges of the cathodes. Further, the insulating layer prevents the cathode layer from being short-circuited with the anode layer at a boundary since the stacked organic layer becomes thinner near the separator due to a shadow effect by the separator in a direction perpendicular to the anode layer formed for patterning of the cathode layer.

Furthermore, the insulating layer should not have an overhang structure in order to prevent a cathode layer that will be formed later from being cut. Therefore, the insulating layer is generally formed of a positive photoresist material so as to have a positive profile.

The separator formed on the insulating layer crosses with the anode layer to be arranged so as to separate by a predetermined distance from each other as well as has the overhang structure so as not to make the cathode layer be short-circuited with an adjacent component. Especially, unlike a general patterning process, a negative profile should be constantly maintained in the separator in order to prevent the short circuit between adjacent cathode layer lines. If the separator is lost, there occurs a short-circuit between adjacent pixels. A negative photoresist material is used for the separator having the overhang structure.

In order to fabricate the organic electroluminescence display stably, both of the insulating layer and the separator are necessary. Yet, the photolithographic process is required for each process for fabricating the insulating layer and the separator, so that a fabricating process of the organic electroluminescence display becomes complicated and a product cost thereof increases.

Hereinafter, a fabricating method of a first conventional organic electroluminescence display will be described with reference to the accompanying drawings.

FIG. 1 is a plan view of the first conventional organic electroluminescence display.

As illustrated in FIG. 1, a plurality of first electrodes 12 that have a specific width and are formed of indium tin oxide (ITO) or the like are arranged on a transparent substrate 11 in a stripe type. An insulating pattern 13 of lattice type is stacked on the transparent substrate 11 having the first electrodes 12 in an area between the adjacent first electrodes 12 and an area crossing with the first electrodes 12. Moreover, separators 14 are formed in an area of the insulating pattern 13 crossing with the first electrodes 12.

Furthermore, organic light-emitting layers and second electrodes (not shown) are formed on the first electrodes 12 including the insulating pattern 13 and the separators 14.

Referring to FIGS. 2A to 2C and 3A to 3C, the fabricating method of the first conventional organic electroluminescence display will be described in detail as follows.

FIGS. 2A to 2C provide cross-sectional views illustrating a process of the fabricating method of the first conventional organic electroluminescence display, which are taken along the line A-A in FIG. 1.

FIGS. 3A to 3C depict cross-sectional views illustrating the process of the fabricating method of the first conventional organic electroluminescence display, which are taken along the line B-B in FIG. 1.

As shown in FIGS. 2A and 3A, an anode layer (not shown) made of indium tin oxide (ITO) or the like is stacked with a predetermined thickness on the transparent substrate 11 by a sputtering. A photoresist (not shown) is coated on the entirely deposited anode layer. The photoresist is exposed with a mask and developed, thereby forming a stripe type photoresist pattern (not shown). The anode layer is etched by using the photoresist pattern as a mask and a remaining photoresist is removed, thereby forming the stripe type first electrodes 12.

As illustrated in FIGS. 2B and 3B, an electrically insulating layer (not shown) is stacked on the transparent substrate 11 including the first electrodes 12. The insulating layer can be formed of an organic or an inorganic material. As for the organic material, an acrylic-, a novolak-, an epoxy- and a polyimide-based photoresist or the like is used. As the inorganic material, a silicon oxide film, a silicon nitride film, a silicon oxynitride film, or the like is used. Next, by patterning the insulating layer, the lattice type insulating pattern 13 except the dot-shaped openings formed on the first electrodes 12 is formed on the first electrodes 12 and the transparent substrate 11 in an area between the adjacent first electrodes 12 and an area crossing with the first electrodes 12 at regular intervals.

As depicted in FIGS. 2C and 3C, an organic photoresist of negative type (not shown) as an electrically insulating material is stacked on the insulating pattern 13, and then a patterning process is carried out, thereby forming the separators 14 having a negative profile. In this case, the separators 14 cross with the first electrodes 12 and are arranged at regular intervals on the insulating pattern 13 between the dot-shaped openings. Further, the separators 14 have the overhang structure so as to prevent second electrodes 16 from being short-circuited with adjacent components. Thereafter, organic light-emitting layers 15 and the second electrodes 16 are stacked in order on an entire surface including the first electrodes 12 by using a shadow mask (not shown). In this connection, if the organic light-emitting layers 15 are stacked on the first electrode 12, a thickness of the organic light-emitting layers 15 become thinner near the separators due to the shadow effect by the separators, so that the second electrodes 16 stacked on the organic light-emitting layers 15 can be short-circuited at a boundary with the first electrodes 12. The insulating pattern 13 serves to prevent such short circuit.

Next, an encapsulation plate formed of a metal, a glass, or the like or a passivation layer formed of an organic or an inorganic thin film is formed on an entire surface including the second electrodes 16 in order to airtightly protect the organic light-emitting layers 15 and the second electrodes 16 vulnerable to moisture and oxygen from an outside.

In the aforementioned first conventional organic electroluminescence display and the fabricating method thereof, the photolithographic process needs to be carried out twice in order to form the insulating pattern and the separators, which results in a complex fabricating process and a high cost of materials. In addition, since the two layers of the insulating pattern and the separators are formed by respective patterning processes, an adhesion therebetween becomes poor.

FIG. 4 depicts a plan view of a second conventional organic electroluminescence display. FIGS. 5A, 5B and 5C present cross-sectional views illustrating the second conventional organic electroluminescence display, which are taken along the lines A-A', B-B' and C-C' in FIG. 4, respectively.

As shown in FIGS. 4 and 5A to 5C, a plurality of first electrodes 42 that have a specific width and are formed of indium tin oxide (ITO) or the like are arranged on a transparent substrate 41 in a stripe type. A lattice type insulating pattern 43 is stacked on the transparent substrate 41 having the first electrodes 42 in an area between the adjacent first electrodes 42 and an area crossing with the first electrodes 42. Moreover, formed on the first electrodes 42 are openings 45 for exposing an area where pixels are formed. Therefore, the insulating pattern 43 in which the openings 45 where pixels are formed is exposed has a lattice shape.

Further, an insulating pattern 43a stacked in a direction in parallel with the plurality of first electrodes 42 is formed by using a half tone exposure mask having a rectangular-, a slit- and a chevron-shaped half tone pattern. An insulating pattern 43b formed in a direction crossing with the first electrodes 42 is formed in a normal tone pattern. At this time, the insulating pattern 43a has a thickness thinner than that of the insulating pattern 43b. This is for excluding a possibility of an open circuit occurring since a thickness of the second electrodes formed in a direction crossing with the first electrodes 42 becomes thinner when the second electrodes (not shown) are deposited at a boundary between edges of the photoresist and the first electrodes 42.

Hereinafter, a fabricating method of the second conventional organic electroluminescence display illustrated in FIG. 4 will be described in detail with reference to FIGS. 6A to 6D and 7A to 7D.

FIGS. 6A to 6D represent cross-sectional views showing a process of the fabricating method of the second conventional organic electroluminescence display, which is taken along the line A-A' in FIG. 4. FIGS. 7A to 7D offer cross-sectional views illustrating the process of the fabricating method of the second conventional organic electroluminescence display, which is taken along the line B-B' in FIG. 4.

As shown in FIGS. 6A and 7A, the transparent substrate 41 that has been cleaned is prepared. In the present invention, a transparent glass substrate is used for the transparent substrate 41. An anode layer (not shown) composed of indium tin oxide (ITO) or the like is entirely deposited on the transparent substrate 41 with a uniform thickness, and a photoresist (not illustrated in the drawing) is coated thereon. Then, an exposure and a development are carried out, thereby forming a photoresist pattern. The anode layer is etched by using such photoresist pattern as a mask and the photo-resist layer is removed, thereby forming the stripe type first electrodes 42.

As depicted in FIGS. 6B and 7B, an insulating layer forming process is carried out to inhibit a leakage current from the edges of the first electrodes 42 and to use, as a device separating layer, a photoresist (not shown) for an insulation between the first electrodes and the second electrode 48 that will be formed later.

In order to do so, a photoresist is coated on the transparent substrate 41, and the insulating pattern 43 is formed by using an exposure mask (not illustrated in the drawing). At this time, the insulating pattern 43a stacked in a direction in parallel with the first electrode 42 is formed by using the half tone exposure mask of a rectangular-, a slit- and a chevron-shaped half tone pattern. Further, the insulating pattern 43a formed in the half tone pattern is formed with a thickness thinner than that of the insulating pattern 43b stacked in the direction crossing with the second electrodes. The thickness of the insulating pattern 43a formed in the half tone pattern is determined by controlling an opening ratio of the half tone area described in the exposure mask.

The reason for reducing the thickness of the insulating pattern 43a is to exclude a possibility of the open circuit occurring since a film thickness of the plurality of the second electrodes 48 running on the openings 45 where organic light-emitting layers 47 are formed and crossing with the first electrodes 42 becomes thinner at a boundary between edges of the insulating pattern 43a and the first electrodes 42 when the second electrodes 48 are evaporated.

Thereafter, as shown in FIGS. 6C and 7C, the transparent substrate 41 is transferred inside a vacuum deposition apparatus. Then, the organic light-emitting layers 47 are formed on the first electrodes 42 through the openings of a first shadow mask 49 by using the insulating pattern 43b as a support of the first shadow mask 49. If the insulating pattern 43b is used as the support, it is possible to adhere closely to the first shadow mask 49 without causing any damage on the first electrodes 42, thereby enabling to prevent a lateral diffusion of the organic light-emitting layers 47.

In this case, the organic light-emitting layers 47 are formed of a fluorescent and a phosphorescent organic luminescent material with low molecular weight such as $Alq_3$, Anthracene, $Ir(ppy)_3$, or the like.

Next, as illustrated in FIGS. 6D and 7D, the second electrodes 48 are formed on the organic light-emitting layers 47 by using the insulating pattern 43b as a support of a second shadow mask 50 having a stripe type electrode pattern. If the insulating pattern 43b is used as the support, it is possible to adhere closely to the second shadow mask 50 without causing any damage on the organic light-emitting layers 47, thereby enabling to prevent a lateral diffusion of the second electrodes 48.

The second electrodes 48 mainly use a metal having an excellent electric conductivity such as Al, Li/Al, MgAg, Ca, or the like, and are stacked by a sputtering, an e-beam deposition, a thermal evaporation, or the like. And, an encapsulation layer made of a metal, a glass, or the like or a passivation layer formed of an organic or an inorganic material is formed on an entire surface including the second electrodes 48 so as to airtightly protect the organic light-emitting layers 47 vulnerable to moisture and oxygen from the outside.

In the aforementioned second conventional organic electroluminescence display and the fabricating method thereof, a single photolithographic process is carried out to form the insulating layer and the separators by using the half tone mask, so that the fabricating process becomes simple. Since the insulating layer and the separator are formed as a single layer, there is no problem of an adhesive strength therebetween. Further, since an alignment margin required for forming two separate layers of the insulating pattern and the separator is not needed, it is possible to increase an opening ratio of the organic electroluminescence display and a yield thereof.

However, there exist drawbacks in that it is difficult to design the half tone mask and, further, a product cost thereof increases in comparison with a conventional mask by about 1.5 times or more. Further, since there no overhang structure of the separators, a shadow mask is required for a patterning of the second electrodes. However, no shadow mask adaptable to a mass production of the organic electroluminescence display has been suggested.

FIG. 8 is a plan view of a third conventional organic electroluminescence display.

The third conventional organic electroluminescence display is formed by a method for forming a device separating layer of an electrically insulating property composed of an area having a thin thickness and a positive profile and an area having a negative profile and serving as a separator by employing an image reversal process using a half tone mask and an image reversal photoresist.

In general, in case of a positive photoresist, an exposed area is removed by a developer, and an area shielded by a mask pattern is formed as a pattern, wherein the pattern has a property of a positive profile. Meanwhile, in case of a negative photoresist, an exposed area is formed as a pattern that is insoluble in the developer by a cross-linking, wherein the pattern has a property of a negative profile.

However, in order that a single layer of insulating pattern serves as a general insulating layer and a separator as well, it should be made to have a positive profile in an area acting as the insulating layer and a negative profile in an area acting as the separator. To do so, a pattern having the positive profile needs to be formed in the single layer of the insulating pattern in advance. Then, by carrying out an image reversal, a flood exposure and a development thereto, the layer of the insulating pattern should be patterned to form the negative profile. Herein, the image reversal is carried out by an image reversal process using an image reversal photoresist or a general positive photosensitive material. Next, the image-reversed insulating pattern undergoes the flood exposure and the development so as to be patterned to form the negative profile.

In case of the typical image reversal using the image reversal photoresist, an initially formed photoresist has characteristics that a non-exposed portion does not dissolve and an exposed portion is developed, as in case of using the general positive photosensitive material. However, once the exposed portion of the photoresist is heated at a temperature over 115° C., the exposed portion becomes insoluble and, thus, the exposed portion is not developed by the developer. Herein, the change in the property of the exposed photoresist, i.e., from being soluble to being insoluble, by a heating is referred to as an image reversal and, further, the heating process for the image reversal is referred to as an image reversal baking. In the meantime, since the shield area still has a property of the positive photosensitive material, it does not dissolve in the developer. If the flood exposure is carried out on the photoresist, a portion having the changed property of being insoluble in the developer by the image reversal baking after the exposure has the same property even after the flood exposure. On the other hand, a portion shielded during the exposure has the property of the positive photosensitive material and, thus, is developed after the flood exposure. Accordingly, if the image reversal photoresist is used, the property of the positive photosensitive material is maintained at the beginning. However, after carrying out the exposure, the image reversal baking and the flood exposure, the exposed portion remains and the negative profile can be obtained, as same as the negative photosensitive material.

The image reversal method other than the method using the image reversal photoresist includes a method using an organic solvent instead of an aqueous developer and a method involving: coating and exposing a general positive photoresist; diffusing an image reversal base catalyst into the photoresist; carrying out an image reversal on the photoresist by performing the image reversal baking; and developing an unexposed area by carrying out the flood exposure.

A third conventional organic electroluminescence display employing the image reversal process using the image reversal photoresist will be described with reference to FIGS. 9A to 9C.

FIGS. 9A, 9B and 9C provide cross-sectional views of the third conventional organic electroluminescence display, which are taken along the lines A-A', B-B' and C-C' in FIG. 8, respectively.

A plurality of first electrodes 62 that have a specific width and are formed of indium tin oxide (ITO) or the like are arranged on a transparent substrate 61 in a stripe type. A lattice type insulating pattern 63 is stacked on the transparent substrate 61 including the first electrodes 62 in an area between the adjacent first electrodes 62 and an area crossing with the first electrodes 62. Moreover, formed on the first electrodes 62 are openings 65 for exposing an area where pixels are formed. Therefore, the insulating pattern 63 in which the openings 45 where the pixels are formed is exposed has a lattice shape.

An insulating pattern 63a stacked in parallel with the first electrodes 62 is formed by using a half tone exposure mask having a rectangular-, a slit- or a chevron-shaped half tone pattern. Further, an insulating pattern 63b stacked in a direction crossing with the first electrodes 62 is formed in a normal tone pattern. The insulating pattern 63a formed in the half tone pattern is formed with a thickness thinner than that of the insulating pattern 63b stacked in a direction crossing with the first electrodes. The thickness of the insulating pattern 63a is determined by controlling an opening ratio of the half tone area described in the exposure mask.

Trenches 66 are formed at a central portion of the insulating pattern 63b stacked in a direction crossing with the first electrodes 62. Herein, an area having the trenches thereon is formed in a manner that the insulating pattern 63b undergoes an exposure using a stripe type mask, an image reversal by a heating, a flood exposure and a development. A certain portion of the photoresist remains inside such area thus formed, thereby forming the trenches 66 of the negative profile having the overhang structure.

The trenches 66 have a function of preventing a short circuit between the second electrodes adjacent to each other. Herein, organic light-emitting layers and the second electrodes (cathode layers) (not shown) are formed on the transparent substrate 61 including the openings 65.

Referring to FIGS. 10A to 10C and 11A to 11C, the third conventional organic electroluminescence display illustrated in FIG. 8 will be described in detail.

FIGS. 10A to 10C present cross-sectional views illustrating a process of a fabricating method of the third conventional organic electroluminescence display, which are taken along the line A-A' in FIG. 8.

FIGS. 11A to 11C represent cross-sectional views illustrating the process of the fabricating method of the third conventional organic electroluminescence display, which are taken along the line B-B' in FIG. 8.

As can be seen from FIGS. 10A and 11A, an anode layer formed of indium tin oxide (ITO) or the like is stacked on the transparent substrate 61, and a photoresist (not shown) is coated thereon. Then, an exposure and a development to the photoresist are carried out, thereby forming a stripe type photoresist pattern. Thereafter, the anode layer is etched by using such photoresist pattern as a mask and the photoresist pattern is removed, to thereby form the stripe type first electrodes 62.

As can be seen from FIGS. 10B and 11B, an insulating layer forming process is carried out inhibit a leakage current from edges of the first electrodes 62 and use, as a device separation structure layer, a photoresist (not shown) having an electrically insulating characteristic to prevent an electrical connection between the first electrodes 62 and the second electrodes 68 that will be formed later.

The image-reversed photoresist is coated on the transparent substrate 61 having the first electrodes 62 formed thereon. After coating the photoresist on the transparent substrate 61, a prebaking is carried out at 100° C. for about 60 seconds so as to dry the photoresist. And, the insulating pattern 63 is formed by using a first exposure mask. The insulating pattern 63a stacked in parallel with the first electrodes 62 is formed in a half tone pattern by using an exposure mask having a rect-angular-, a slit- or a chevron-shaped half tone pattern. The insulating pattern 63a is formed with a thickness thinner than that of the insulating pattern 63b crossing with the first electrodes 62. The thickness of the half tone insulating pattern 63a is determined by controlling an opening ratio of a half tone area described in the exposure mask.

The reason for lowering the insulating pattern 63a in a direction in parallel with the first electrodes 61 than the insulating pattern 63b in a direction crossing with the first electrodes 62 is to exclude a possibility of the open circuit occurring since a thickness of the second electrode 68 becomes thinner when the second electrode 68 is deposited at a boundary between edges of the insulating pattern 63a and the first electrodes 62.

As depicted in FIGS. 10C and 11C, after the completion of the development, a dry process such as an air knife or a spin dry is carried out on the transparent substrate 61 at a temperature lower than 100° C. And, a second exposure process is carried out by using a second exposure mask for use in a device separating layer. After the completion of the second exposure process, a reversal baking is carried out for about 120 seconds at 120° C. A flood exposure is then carried out so as to change the property of the photoresist. Since the reversal baking for an image reversal and then the flood exposure are carried out, the property of the photoresist is changed in a manner that an exposed portion remains but a non-exposed portion is developed. In the second exposure process, the trenches are formed at a central portion of the normal tone insulating pattern 63b stacked in a direction perpendicular to the first electrodes 62 by carrying out an exposure with a width narrower than that of the insulating pattern 63b.

The trenches 66 for an isolation of adjacent pixels are formed at the central portion of the normal tone insulating pattern 63b stacked in a direction perpendicular to the first electrodes 62 by a development process, wherein the trenches have a negative profile of an overhang structure. When the trenches 66 for the isolation of the adjacent pixels are formed, a depth of the trenches 66 is preferably greater than a sum of a deposition thickness of the organic light-emitting layers 67 and the second electrodes 68 that will be deposited later in order to exclude a possibility of a short circuit with the adjacent pixels. Specifically, the depth of the trenches 66 is preferably greater than the sum of the thickness of the organic light-emitting layers 67 and the second electrodes 68 by 1.5 to 5 times.

Subsequently, the transparent substrate 61 is subject to a post baking process and is transferred to a vacuum deposition apparatus. The organic light-emitting layers 67 are formed on the transparent substrate 61.

Next, the second electrodes 68 are formed on the transparent substrate 61 including the organic light-emitting layers 67. The second electrodes 68 mainly use a metal having an excellent electric conductivity such as Al, Li/Al, MgAg, Ca, or the like, and are stacked by a sputtering, an e-beam deposition, a thermal evaporation, or the like. And, an encapsulation layer made of a metal, a glass, or the like or a passivation layer made of an organic or an inorganic material is formed on an entire surface including the second electrodes 68 so as to make the organic light-emitting layers 67 vulnerable to moisture and oxygen airtight from the outside.

Moreover, a certain amount of the photoresist should remain at a bottom of the trenches 66 to prevent a short circuit between the first electrodes 62 and the metal of the second electrodes 68 deposited inside the trenches 66. Therefore, a thickness of the photoresist remaining inside the trenches 66 is controlled by controlling a flood exposure amount or a development time. In this case, the remaining thickness of the photoresist is preferably about 1 μm.

In the aforementioned third conventional organic electroluminescence display and the fabricating method thereof, a single process is carried out to form the insulating layer and the separators by using the half tone mask and the image-reversal photoresist, and the trenches are formed at the central portion of the separators, thereby simplifying the fabricating process. Further, since an adhesive strength problem between the insulating pattern and the separators and an alignment margin problem are not occurred, an opening ratio of the organic electroluminescence display can increase. However, it is difficult to design the half tone mask and, further, a product cost thereof increases in comparison with a conventional mask by about 1.5 times or more.

Such fabricating methods of the conventional organic electroluminescence display have following drawbacks.

In the first conventional organic electroluminescence display and the fabricating method thereof, the photolithographic process is carried out twice to form the insulating pattern and the separators. Therefore, the alignment margin needs to be guaranteed, which results in a decrease in the opening ratio. Further, the adhesive strength between the insulating layer and the separators becomes poor, and the fabricating process becomes complex, thereby increasing the product cost.

In the second and the third conventional organic electroluminescence display and the fabricating method thereof, a single process is carried out to form the insulating pattern and the separators by using the half tone mask. However, in this case, it is difficult to design the half tone mask, and a product cost thereof increases in comparison with a conventional mask by 1.5 times or more. Besides, in case of the second conventional organic electroluminescence display, since there is no overhang structure of the separators, a shadow mask having a stripe type pattern is required for a patterning of the second electrode. However, such shadow mask is not adaptable to currently mass-produced organic electroluminescence displays.

SUMMARY OF THE INVENTION

It is, therefore, an object of the present invention to provide an organic electroluminescence display and a fabricating method thereof enabling to achieve an easy fabricating process using a general mask without requiring a special mask design technique; and a simple fabricating process and a reduced product cost by separating devices with a single insulating pattern.

In accordance with one aspect of the invention, there is provided a method of fabricating an organic electroluminescence display includes the steps of: (a) forming a plurality of stripe type first electrodes on a substrate; (b) forming an insulating layer on the substrate including the first electrodes; (c) forming a lattice type first insulating pattern in a first area crossing with the first electrodes and a second area between the first electrodes by patterning the insulating layer; (d) carrying out an image reversal on the first insulating pattern on the first area; (e) etching an upper portion of the first insulating pattern on the second area to form a second insulating pattern; (f) forming a plurality of organic light-emitting layers on the first electrodes; and (g) forming a plurality of second electrodes on the organic light-emitting layers.

In accordance with another aspect of the invention, there is provided a method of fabricating an organic electroluminescence display includes the steps of: (a) forming a plurality of stripe type first electrodes on a substrate; (b) forming an insulating layer on the substrate including the first electrodes; (c) forming a lattice type first insulating pattern in a first area crossing with the first electrodes and a second area between the first electrodes by patterning the insulating layer; (d) exposing the first insulating pattern on the first area by using an exposure mask having a light-transmitting area whose width is narrower than that of the first insulating pattern on the first area; (e) carrying out an image reversal by performing a heat treatment on the exposed first insulating pattern on the first area; (f) forming an exposed photoresist at an upper portion of the first insulating pattern on the second area and an upper portion of both sides of the first insulating pattern on the first area by carrying out a flood exposure; (g) forming a second insulating pattern having a negative profile in a way that the exposed insulating layer is removed by a developing process; (h) forming a plurality of organic light-emitting layers on the first electrodes; and (i) forming a plurality of second electrodes on the organic light-emitting layers.

In accordance with further another aspect of the invention, there is provided a method of fabricating an organic electroluminescence display includes the steps of: (a) forming a plurality of stripe type first electrodes on a substrate; (b) forming an insulating layer on the substrate including the first electrodes; (c) forming a lattice type first insulating pattern in a first area crossing with the first electrodes and a second area between the first electrodes by patterning the insulating layer; (d) exposing the first insulating pattern while aligning one side of a light-transmitting area of an exposure mask with an inner portion of the first, insulating pattern on the first area and the other side of the light-transmitting area with an outer portion of the first insulating pattern on the first area; (e) carrying out an image reversal by performing a heat treatment on the exposed first insulating pattern on the first area; (f) forming an exposed photoresist at an upper portion of the first insulating pattern on the second area and an upper portion of one side of the first insulating pattern on the first area by carrying out a flood exposure; (g) forming a second insulating pattern in a way that the exposed insulating layer is removed by a developing process; (h) forming a plurality of organic light-emitting layers on the first electrodes; and (i) forming a plurality of second electrodes on the organic light-emitting layers.

In accordance with still further another aspect of the invention, there is provided a method of fabricating an organic electroluminescence display includes the steps of: (a) forming a plurality of stripe type first electrodes on a substrate; (b) forming an insulating layer on the substrate including the first electrodes; (c) forming a lattice type first insulating pattern in a first area crossing with the first electrodes and a second area between the first electrodes by patterning the insulating layer; (d) exposing the first insulating pattern on the first area; (e) diffusing an image reversal base catalyst containing an amine group into the first insulating pattern; (f) carrying out an image reversal on the exposed first insulating pattern on the first area by performing a baking process; (g) forming an exposed photoresist at an upper portion of the first insulating pattern on the second area and an upper portion of both sides of the first insulating pattern on the first area by carrying out a flood exposure; (h) forming a second insulating pattern in a way that the exposed insulating layer is removed by a developing process; (i) forming a plurality of organic light-emitting layers on the first electrodes; and (j) forming a plurality of second electrodes on the organic light-emitting layers.

In accordance with yet further another aspect of the invention, there is provided a method of fabricating an organic electroluminescence display includes the steps of: (a) forming a plurality of stripe type first electrodes on a substrate; (b) forming an insulating layer on the substrate including the first electrodes; (c) forming a lattice type first insulating pattern in a first area crossing with the first electrodes and a second area between the first electrodes by patterning the insulating layer; (d) exposing the first insulating pattern on the first area by using an exposure mask having a shield area for shielding a portion corresponding to a central portion of the first insulating pattern on the first area and a light-transmitting area at a portion corresponding to a peripheral portion thereof; and (e) carrying out an image reversal by performing a heat treatment on the peripheral portion of the exposed first insulating pattern on the first area; (f) forming an exposed photoresist at an upper portion of the first insulating pattern on the second area and an upper central portion and an upper portion of both sides of the first insulating pattern on the first area by carrying out a flood exposure; (g) forming a second insulating pattern in a way that the exposed insulating layer is removed by a developing process; (h) forming a plurality of organic light-emitting layers on the first electrodes; and (i) forming a plurality of second electrodes on the organic light-emitting layers.

BRIEF DESCRIPTION OF THE DRAWINGS

The above and other objects and features of the present invention will become apparent from the following description of the preferred embodiments given in conjunction with the accompanying drawings, in which:

FIG. 24 demonstrates a plan view of an organic electroluminescence display in accordance with a fourth preferred embodiment of the present invention;

DETAILED DESCRIPTION OF THE PREFERRED EMBODIMENTS

Hereinafter, an organic electroluminescence display in accordance with a first, a second and a third preferred embodiment of the present invention and a fabricating method thereof will be described in detail with reference to the accompanying drawings.

Figure 1:
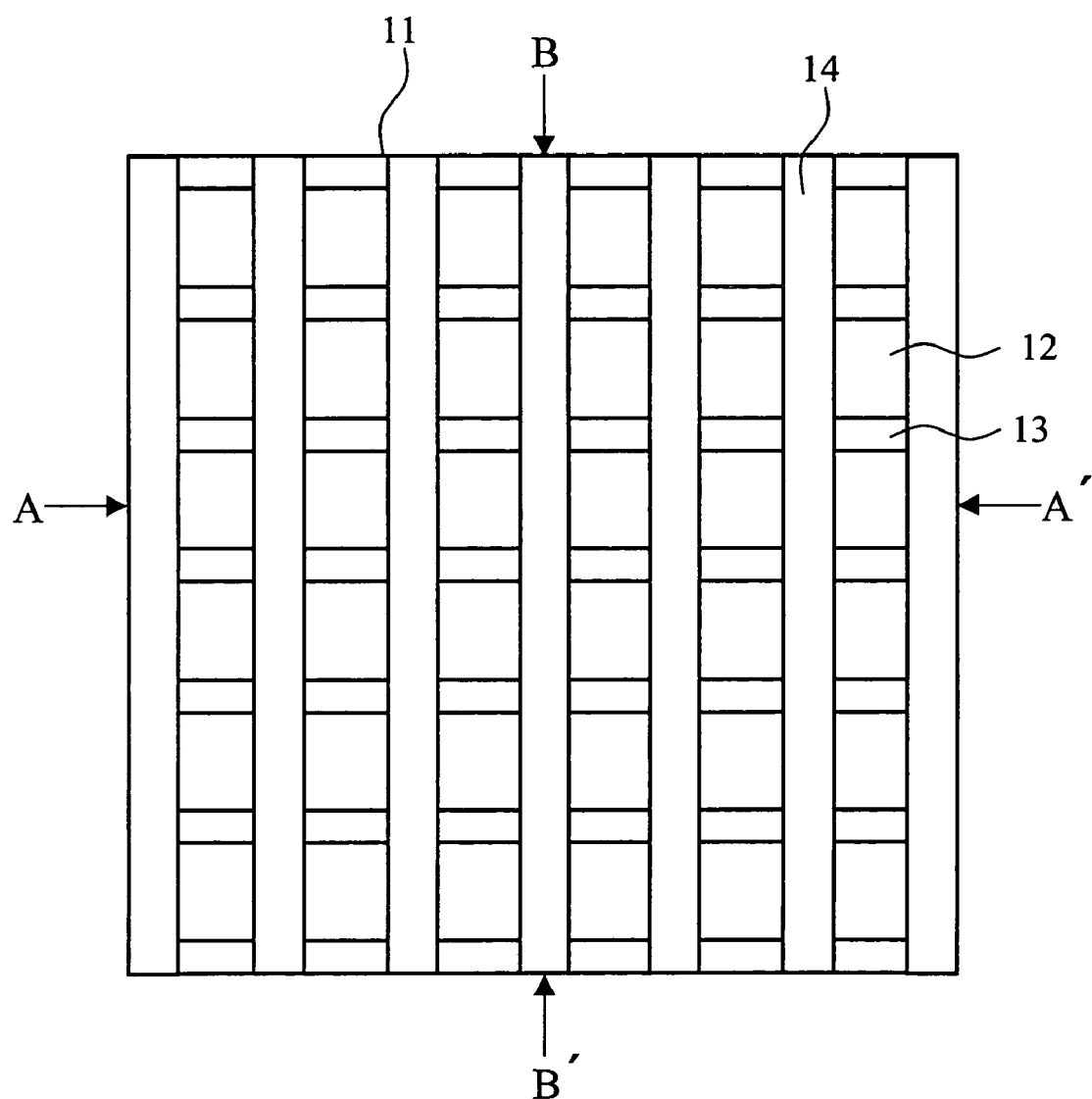
FIG. 1 is a plan view of a conventional organic electroluminescence display.
Figure 2A:
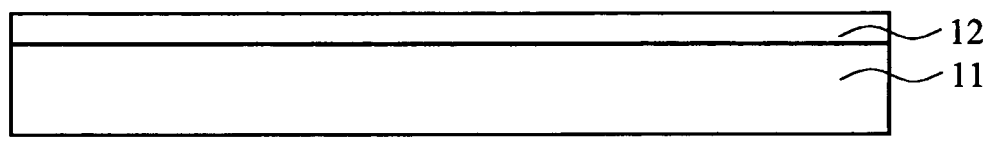
FIGS. 2A to 2C show cross-sectional views illustrating a process of a fabricating method of a first conventional organic electroluminescence display, which are taken along the line A-A' in FIG. 1.
Figure 2B:
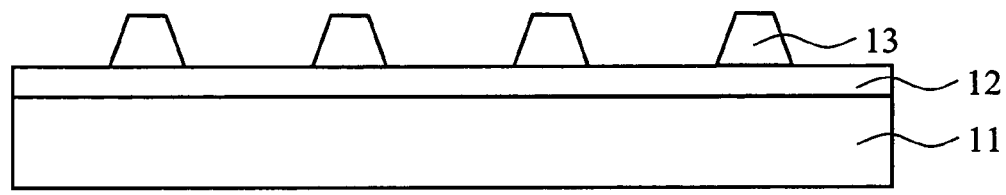
Figure 2C:
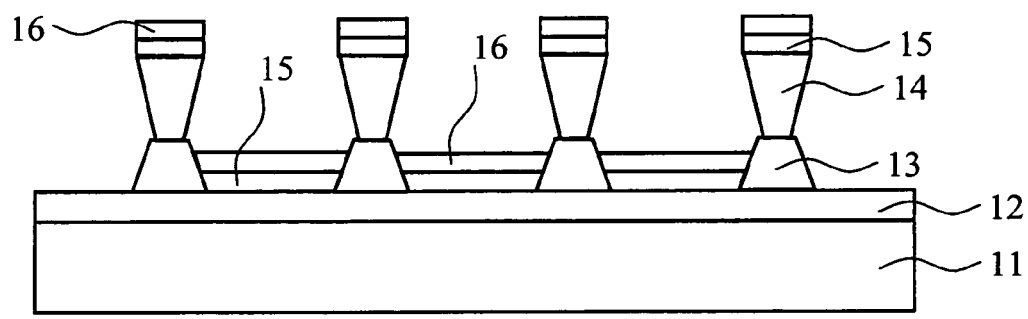
Figure 3A:
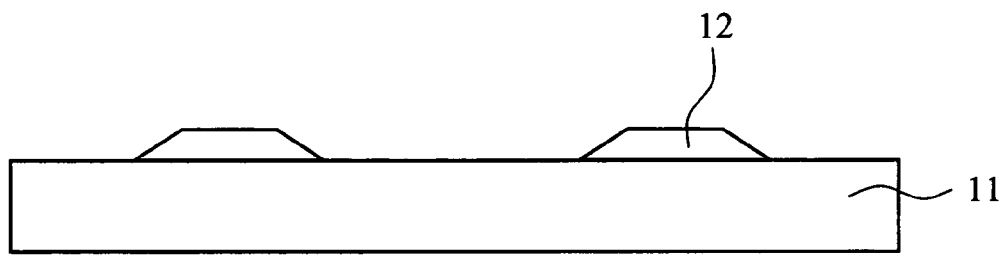
FIGS. 3A to 3C depict cross-sectional views illustrating the process of the fabricating method of the first conventional organic electroluminescence display, which are taken along the line B-B' in FIG. 1.
Figure 3B:
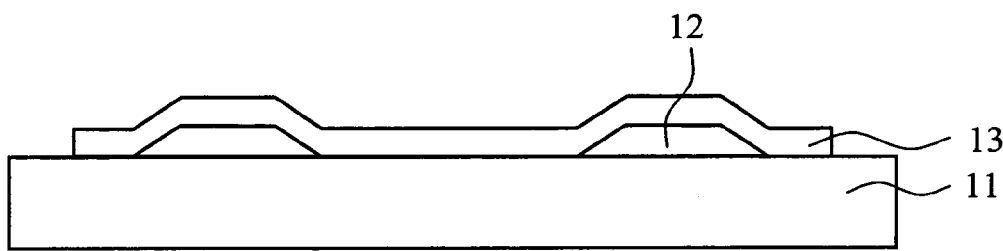
Figure 3C:
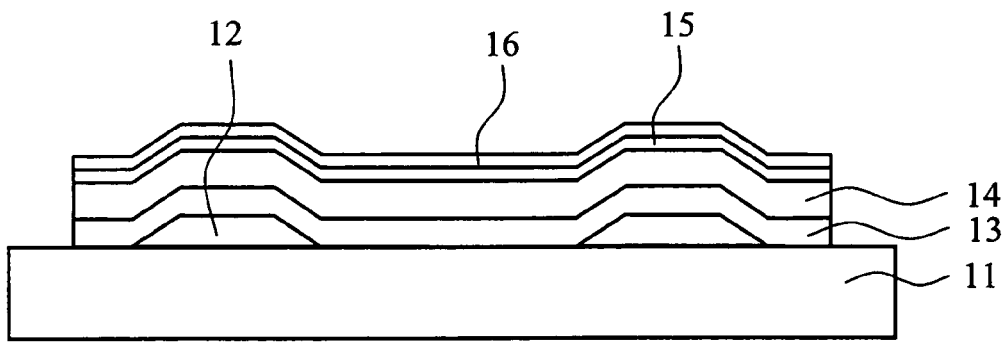
Figure 4:
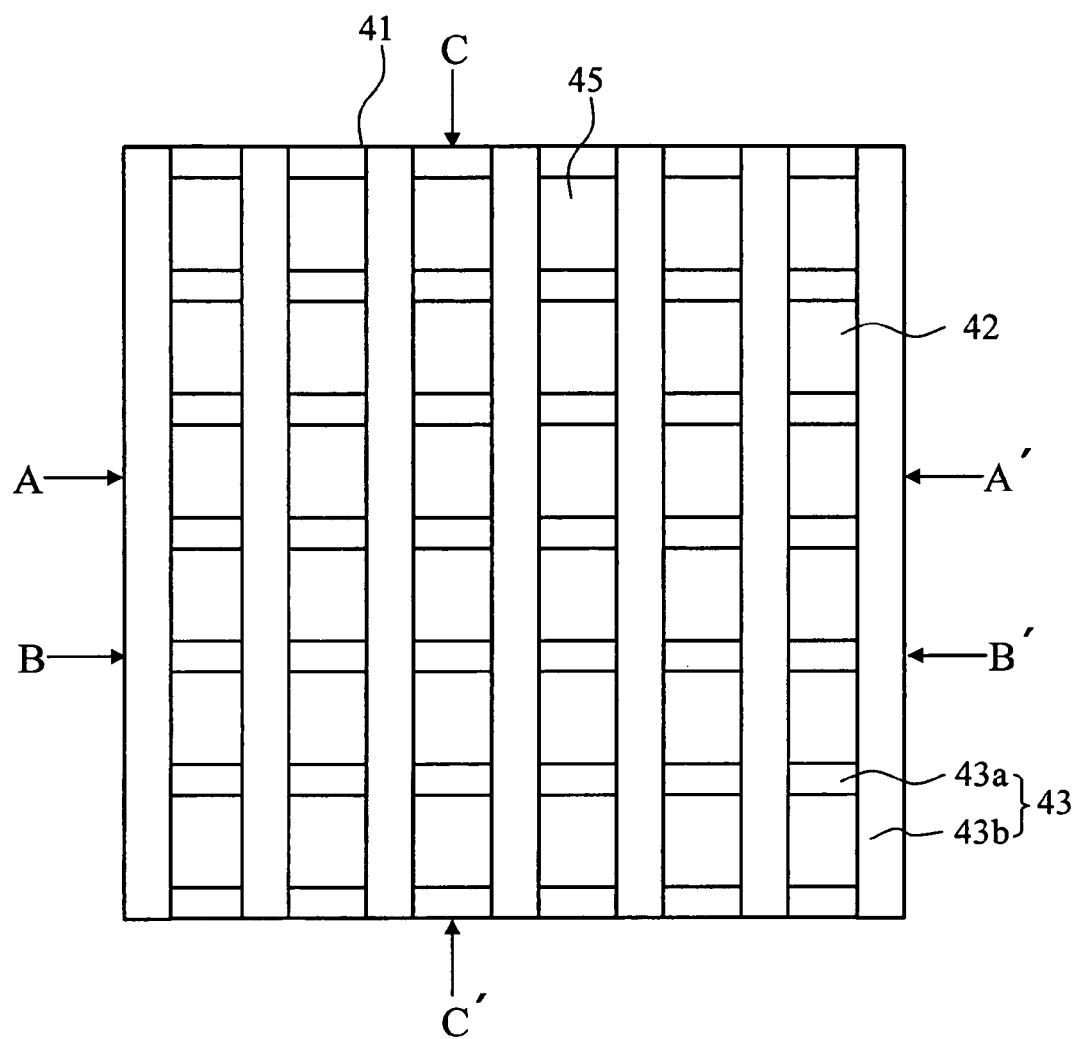
FIG. 4 describes a plan view of a second conventional organic electroluminescence display.
Figure 5A:
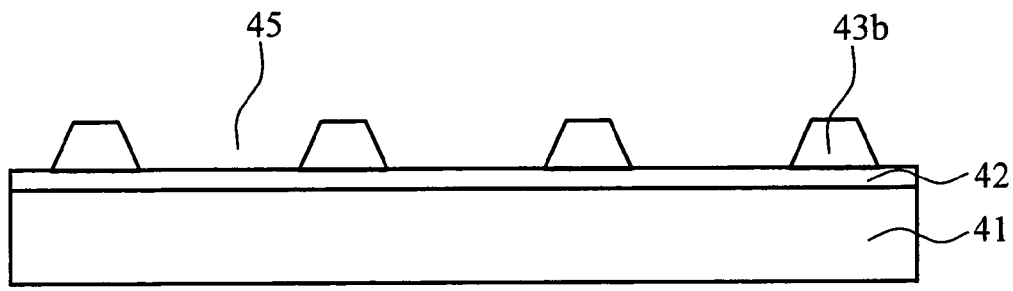
FIGS. 5A, 5B and 5C provide cross-sectional views of the second conventional organic electroluminescence display, which are taken along the lines A-A', B-B' and C-C' in FIG. 4, respectively.
Figure 5B:
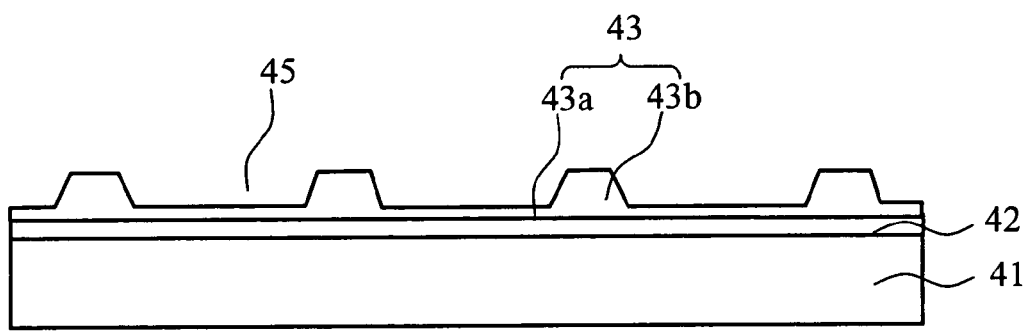
Figure 5C:
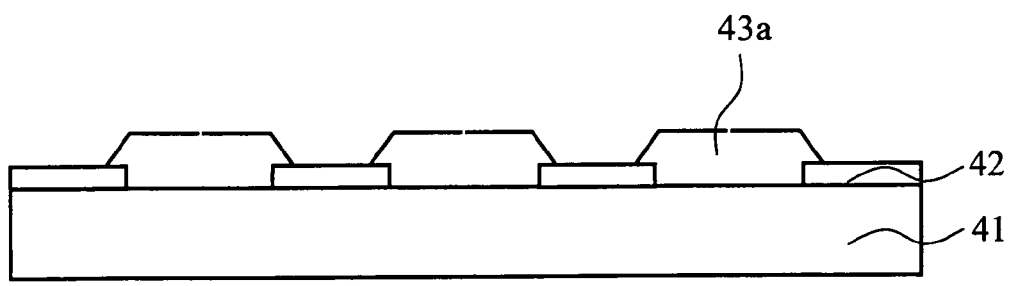
Figure 6A:
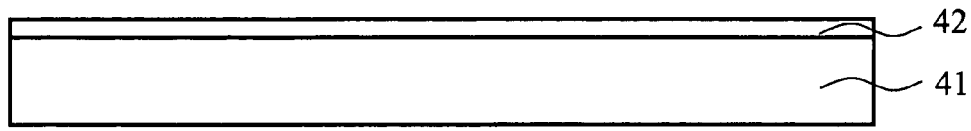
FIGS. 6A to 6D illustrate cross-sectional views illustrating a process of a fabricating method of the second conventional organic electroluminescence display, which are taken along the line A-A' in FIG. 4.
Figure 6B:
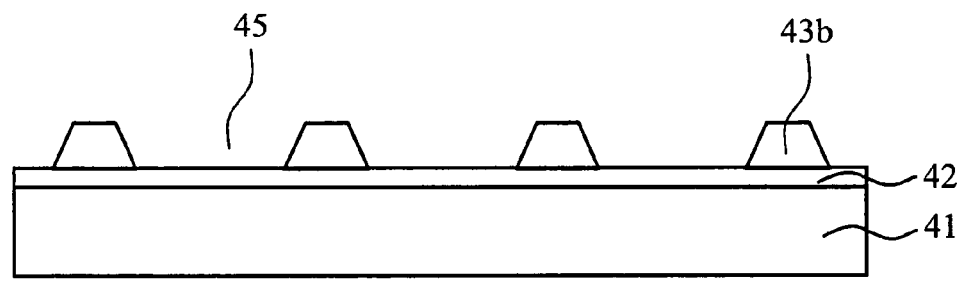
Figure 6C:
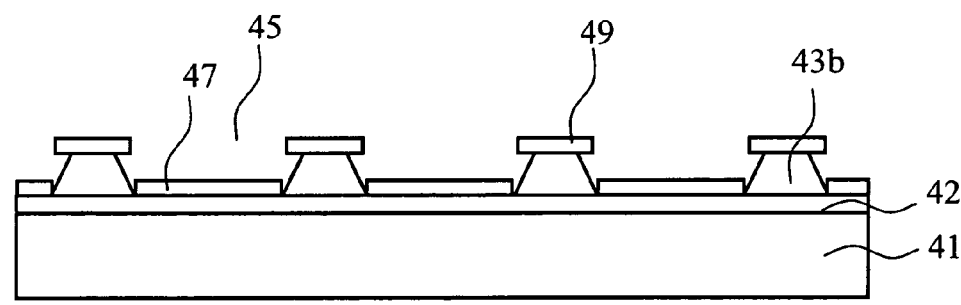
Figure 6D:
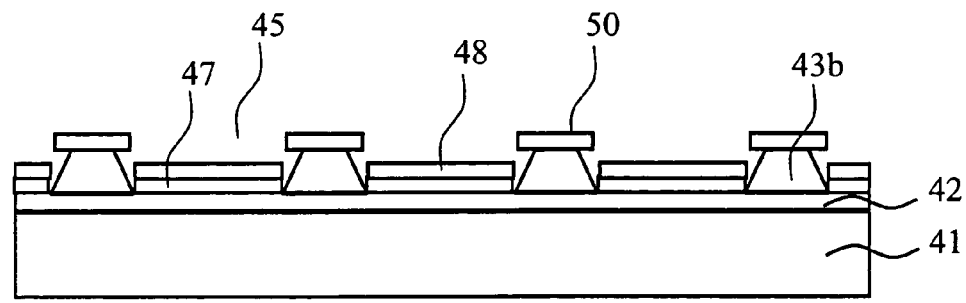
Figure 7A:
FIGS. 7A to 7D present cross-sectional views illustrating the process of the fabricating method of the second conventional organic electroluminescence display, which are taken along the line B-B' in FIG. 4.
Figure 7B:
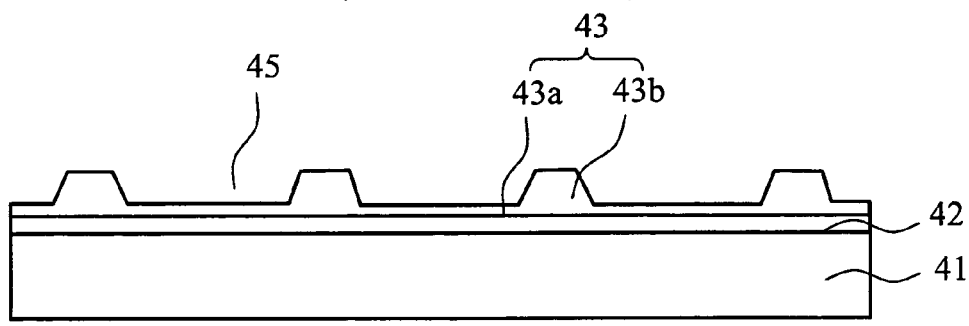
Figure 7C:
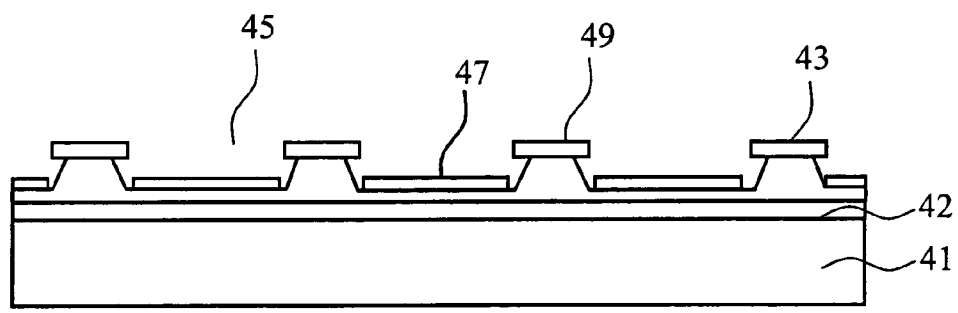
Figure 7D:
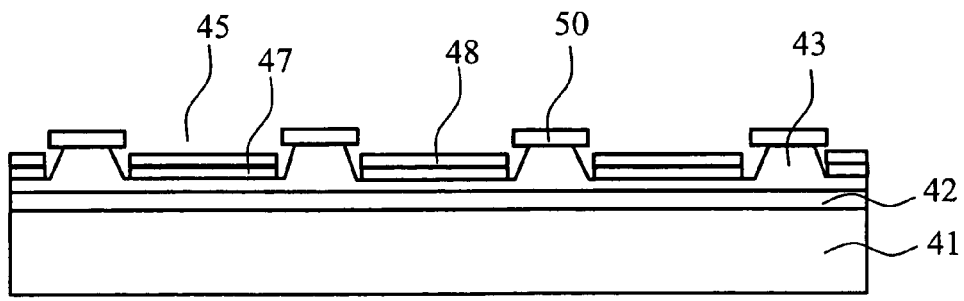
Figure 8:
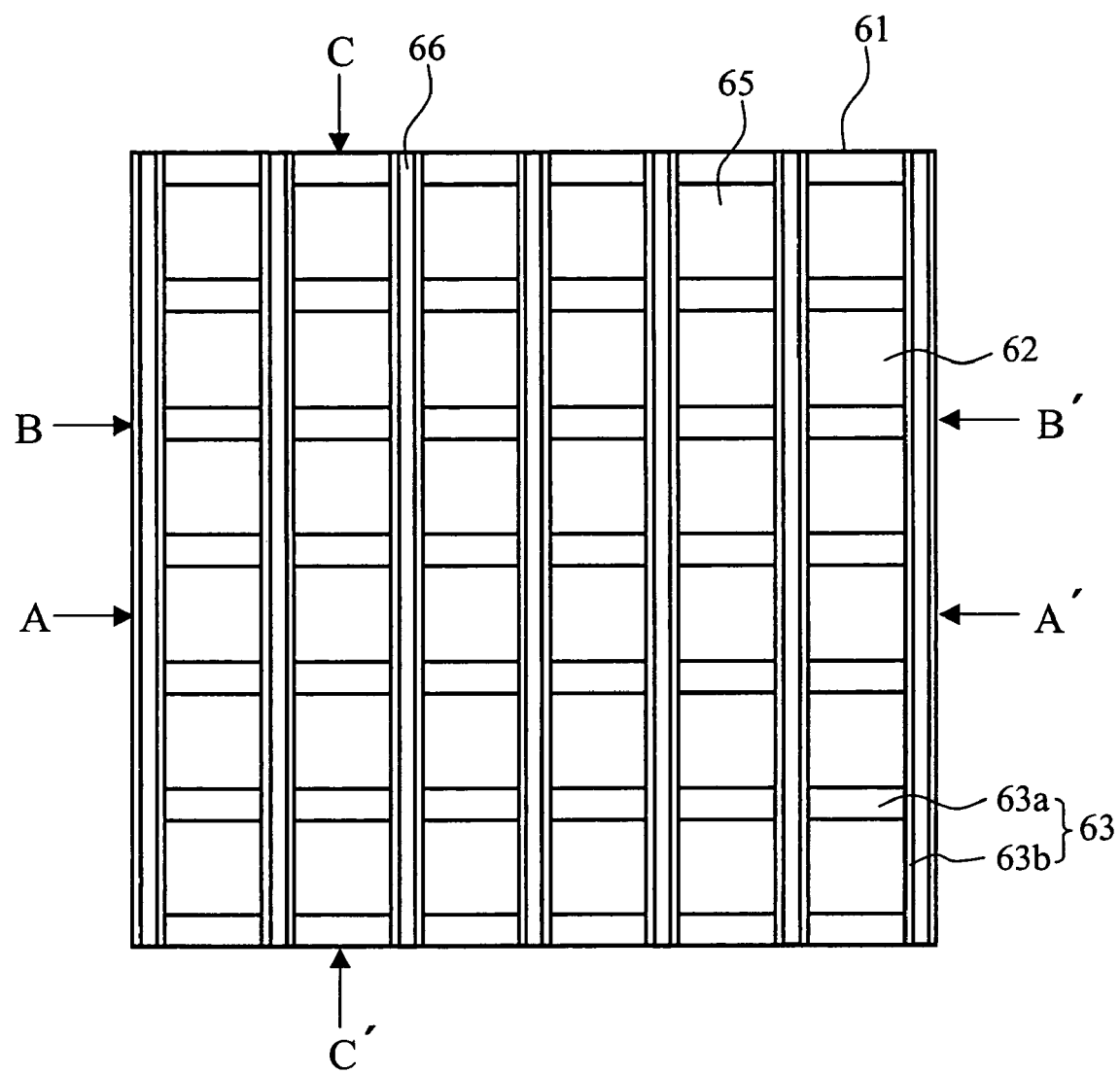
FIG. 8 represents a plan view of a third conventional organic electroluminescence display.
Figure 9A:
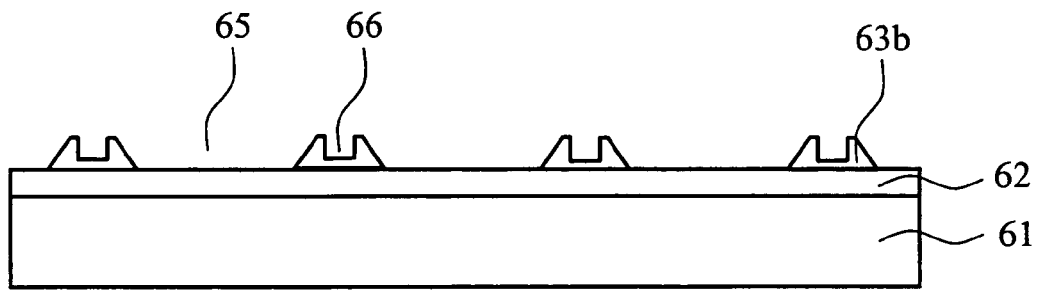
FIGS. 9A, 9B and 9C depict cross-sectional views of the third conventional organic electroluminescence display, which are taken along the lines A-A', B-B' and C-C' in FIG. 8, respectively.
Figure 9B:
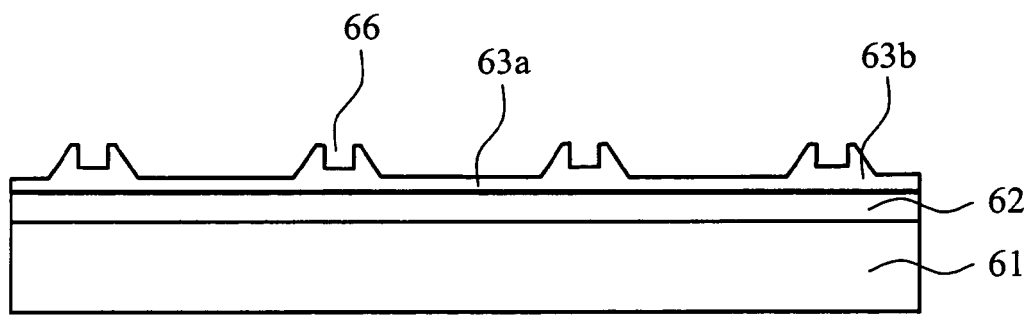
Figure 9C:
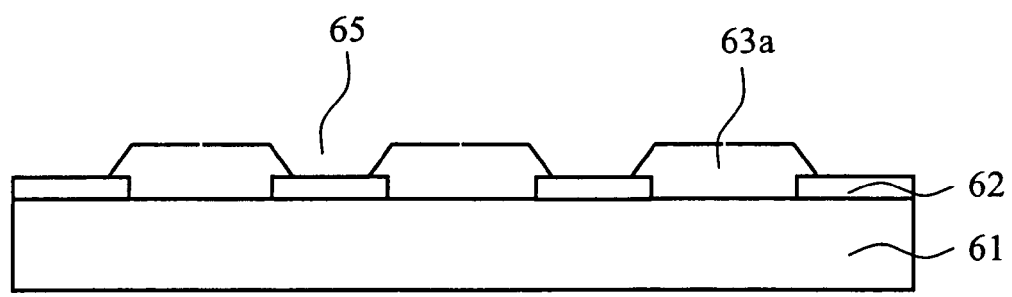
Figure 10A:
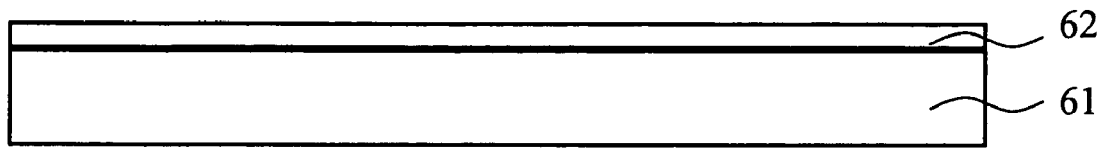
FIGS. 10A to 10C offer cross-sectional views illustrating a process of a fabricating method of the third conventional organic electroluminescence display, which are taken along the line A-A' in FIG. 8.
Figure 10B:
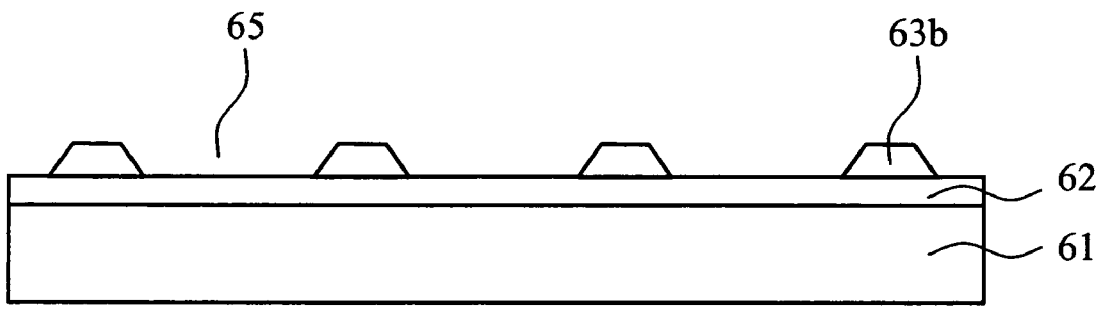
Figure 10C:
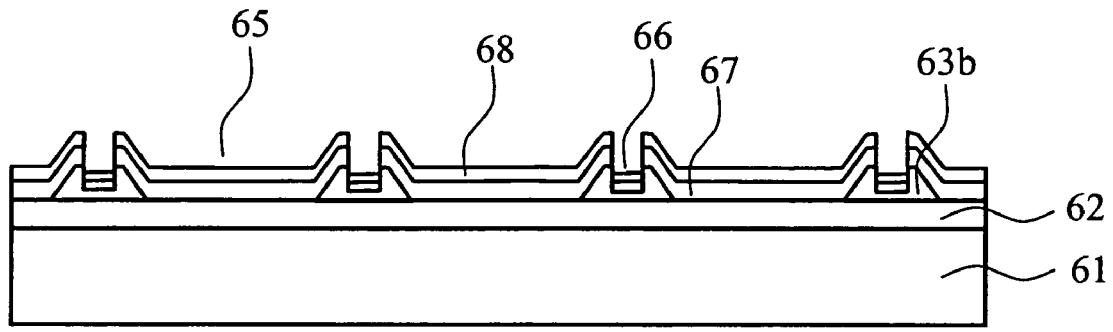
Figure 11A:
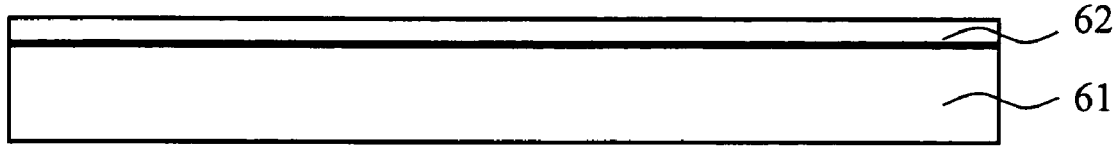
FIGS. 11A to 11C sets forth cross-sectional views illustrating the process of the fabricating method of the third conventional organic electroluminescence display, which are taken along the line B-B' in FIG. 8.
Figure 11B:
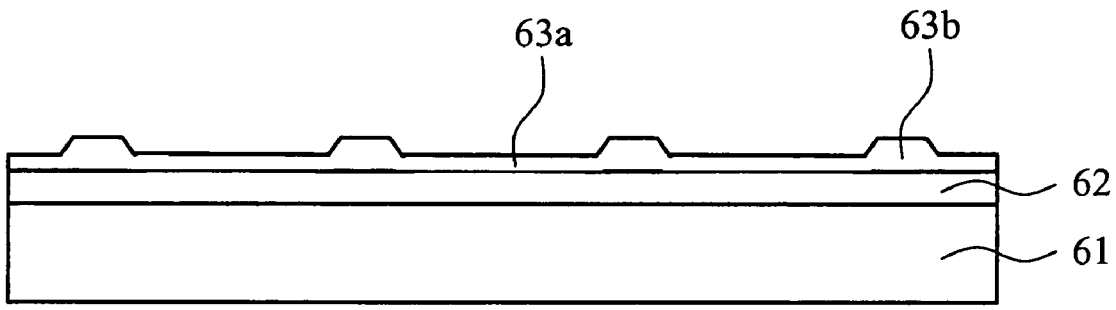
Figure 11C:
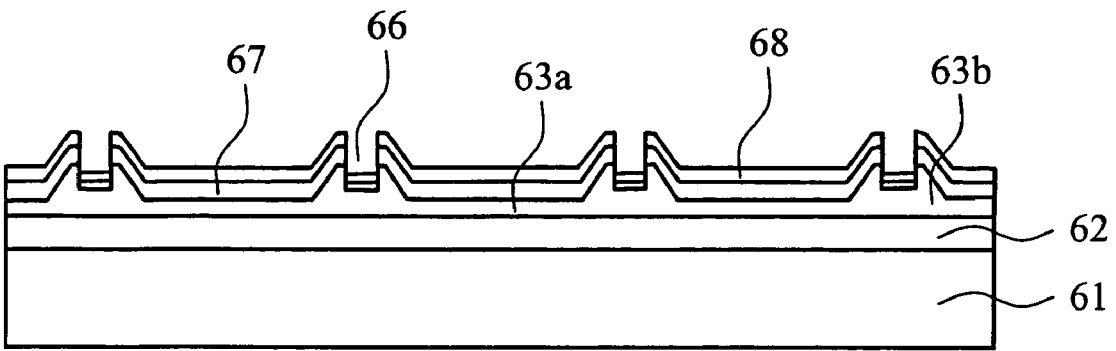
Figure 12:
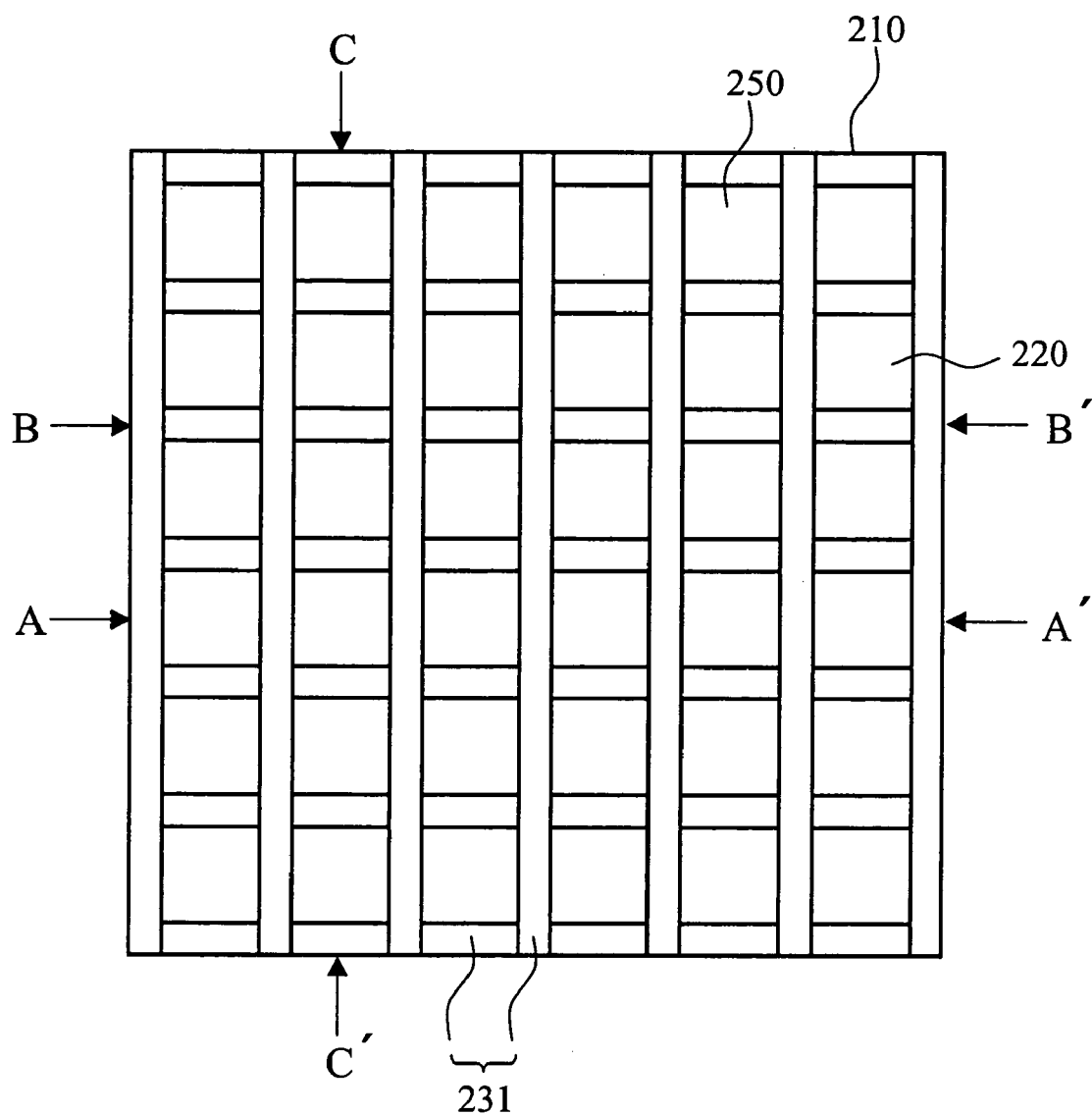
FIG. 12 illustrates a plan view of an organic electroluminescence display in accordance with a first, a second, and a third preferred embodiment of the present invention.

FIG. 12 illustrates a plan view of an organic electroluminescence display in accordance with a first, a second, and a third preferred embodiment of the present invention.

A plurality of first electrodes 62 that have a specific width and are made of indium tin oxide (ITO), indium-doped zinc oxide (IZO or IXO), or the like are arranged on a transparent substrate 210 in a stripe type. A lattice type of insulating pattern 231 is stacked on the first electrodes 220 and the transparent substrate 210 in an area between the adjacent first electrodes 220 and an area crossing with the first electrodes 220. Moreover, formed on the first electrodes 220 are openings 250 for exposing an area where pixels are formed.

Further, an insulating pattern 231 stacked in a direction in parallel with the first electrodes 220 is formed with a thickness thinner than that of an insulating pattern 231 in a direction perpendicular to the first electrodes 220. This is for excluding a possibility of a open circuit occurring since a film thickness of second electrodes (not shown) formed in a direction perpendicular to the first electrodes 220 becomes thinner when the second electrodes are deposited at a boundary between edges of the insulating pattern 231 and the first electrodes 220.

Figure 13A:
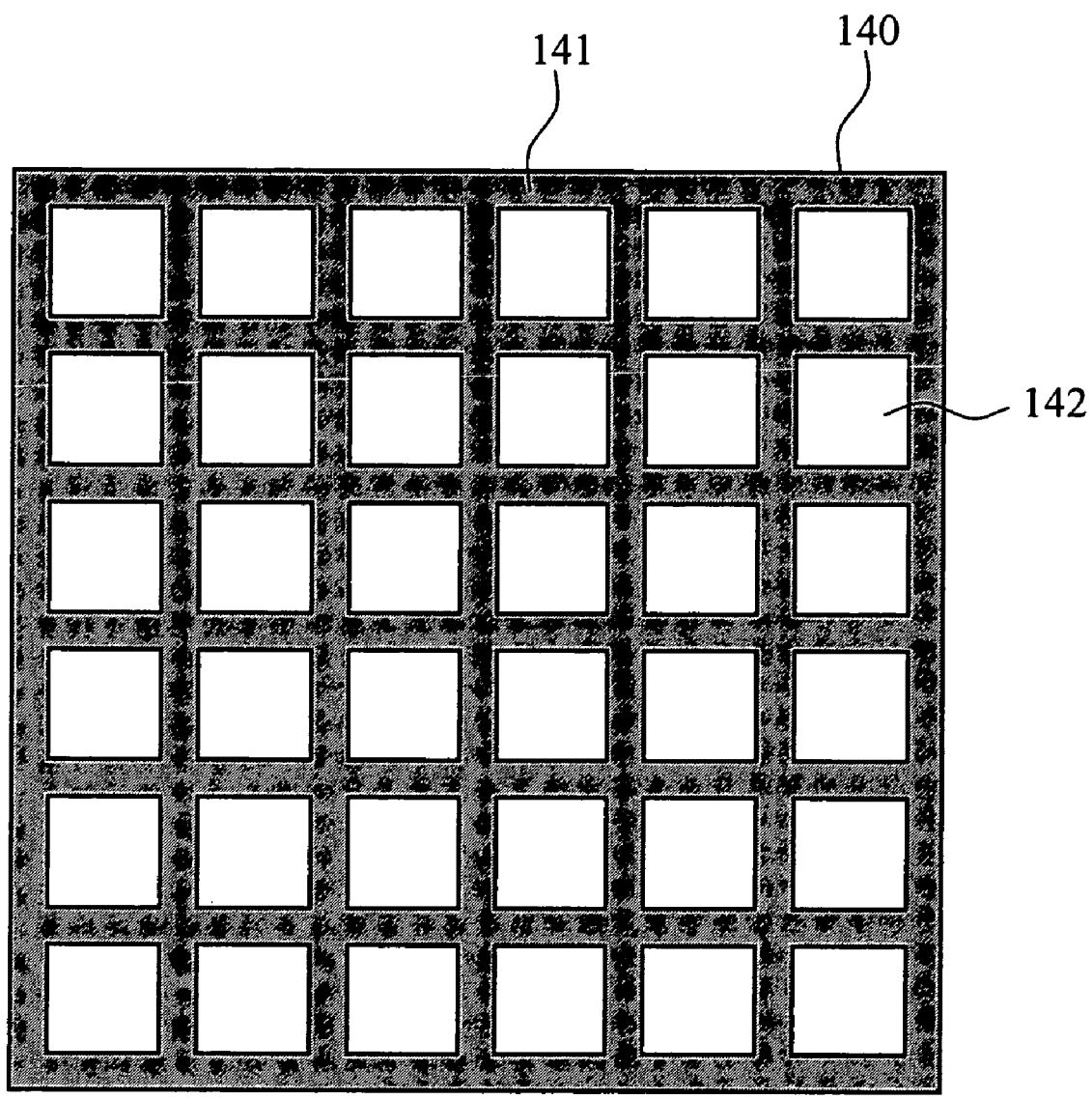
FIGS. 13A and 13B show plan views of an exposure mask used in a fabricating method of the organic electroluminescence display in accordance with the first, the second, and the third preferred embodiment of the present invention.
Figure 13B:
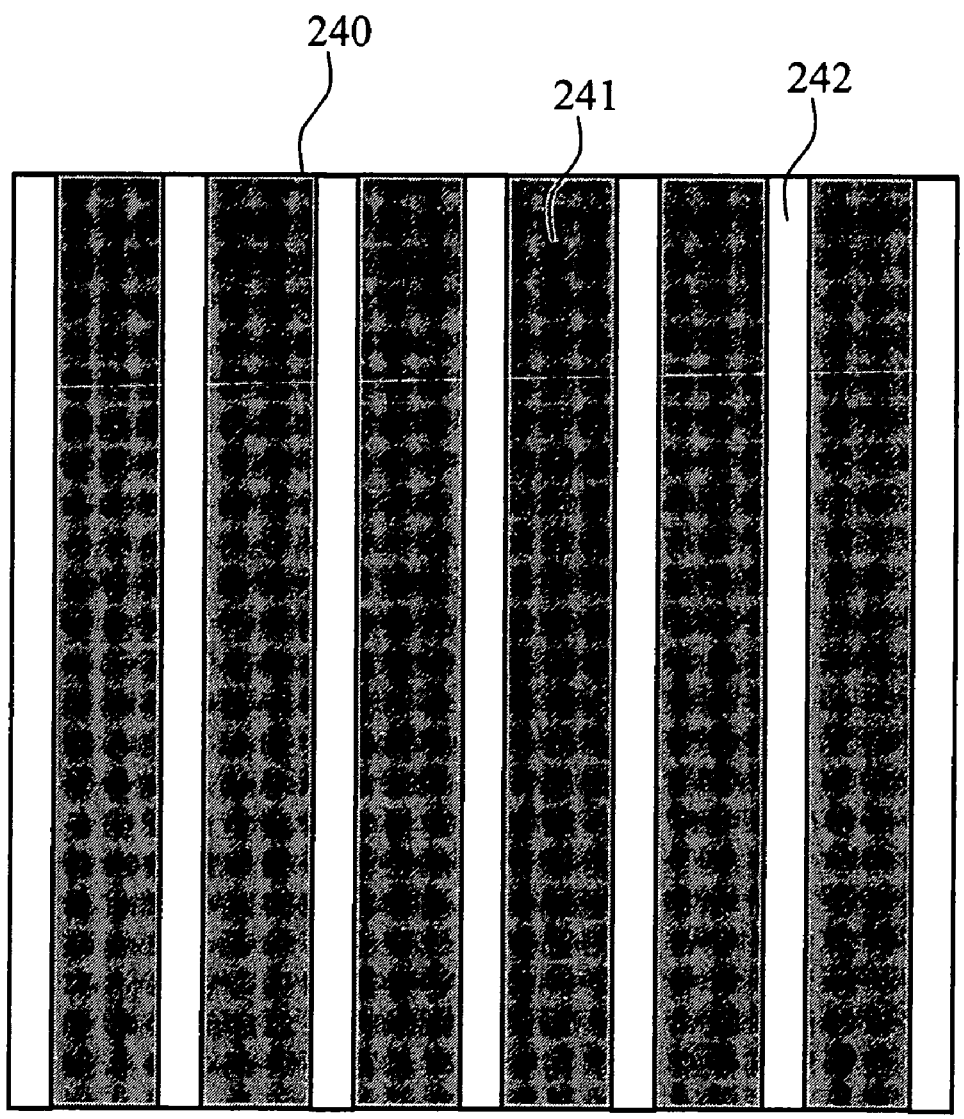

FIGS. 13A and 13B show plan views of an exposure mask used in a fabricating method of the organic electroluminescence display in accordance with the first, the second, and the third preferred embodiment of the present invention.

FIG. 13A is a plan view of a first exposure mask 140. In the first exposure mask 140, a shield area 141 corresponds to the insulating pattern 231 between the first electrodes 210 in FIG. 12 and the insulating pattern 231 in a direction perpendicular to the first electrodes 210, and a light-transmitting area 142 corresponds to an opening 250 in FIG. 12.

FIG. 13B illustrates a plan view of a second exposure mask 240. In the second exposure mask 240, a shield area 241 corresponds to the insulating pattern 231 in a direction perpendicular to the first electrodes 210 in FIG. 12, and a light-transmitting area 242 corresponds to an area between the insulating pattern 231 between the first electrodes 210 in FIG. 12 and the insulating pattern 231 in a direction perpendicular to the first electrodes 210.

The fabricating method of the organic electroluminescence display in accordance with the first preferred embodiment of the present invention will be described in detail with reference to FIGS. 14A to 14G, 15A to 15G and 16A to 16G.

FIGS. 14A to 14G provide cross-sectional views illustrating a process of the fabricating method of the organic electroluminescence display in accordance with the first preferred embodiment of the present invention, which are taken along the line A-A' in FIG. 12.

FIGS. 15A to 15G present cross-sectional views illustrating the process of the fabricating method of the organic electroluminescence display in accordance with the first preferred embodiment of the present invention, which are taken along the line B-B' in FIG. 12.

FIGS. 16A to 16G represent cross-sectional views illustrating the process of the fabricating method of the organic electroluminescence display in accordance with the first preferred embodiment of the present invention, which are taken along the line C-C' in FIG. 12.

Figure 14A:
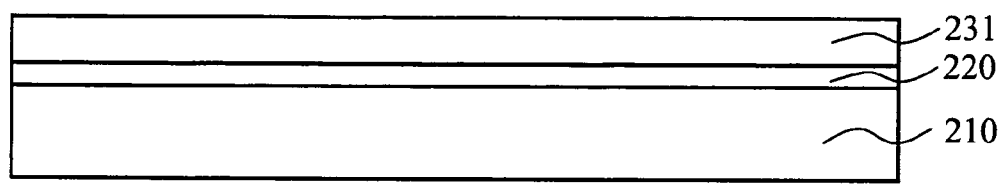
FIGS. 14A to 14G provide cross-sectional views illustrating a process of the fabricating method of the organic electroluminescence display in accordance with the first preferred embodiment of the present invention, which are taken along the line A-A' in FIG. 12.
Figure 15A:
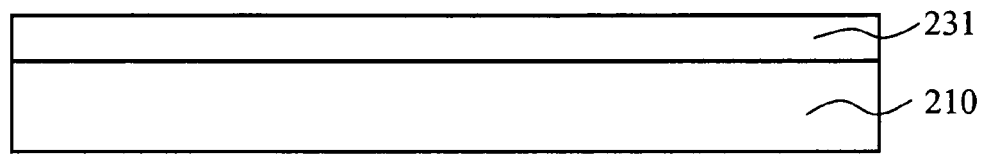
FIGS. 15A to 15G present cross-sectional views illustrating the process of the fabricating method of the organic electroluminescence display in accordance with the first preferred embodiment of the present invention, which are taken along the line B-B' in FIG. 12.
Figure 16A:
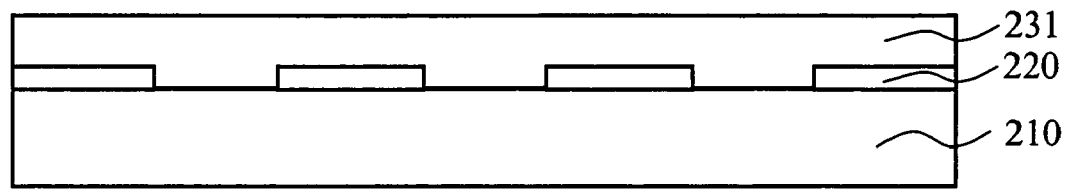
FIGS. 16A to 16G represent cross-sectional views illustrating the process of the fabricating method of the organic electroluminescence display in accordance with the first preferred embodiment of the present invention, which are taken along the line C-C' in FIG. 12.

As illustrated in FIGS. 14A, 15A and 16A, a transparent substrate 210 that has been cleaned is prepared. Generally, the transparent substrate 210 is formed of a transparent glass, a plastic substrate, or the like. An anode layer is stacked 1000 Å to 3000 Å thick on the transparent substrate 210 by depositing indium tin oxide (ITO) or the like. A sheet resistance of the anode layer is made to be equal to or lower than 10 $\Omega/cm^2$. The anode layer is stacked on the cleaned transparent substrate 210 by a sputtering or the like. Successively, a photoresist (not shown) is coated on the anode layer, and an exposure and a development are carried out to form a stripe type photoresist pattern (not illustrated in the drawing). The anode layer is etched by using the photoresist pattern as a mask and the photoresist pattern is removed, to thereby form the first electrodes 220 of a horizontal stripe pattern.

Thereafter, as will be described below, a process for forming an insulating layer is carried out in order to inhibit a leakage current from the edges of the first electrodes 220. Further, the insulating pattern having an electrically insulating characteristic is used to prevent an electrical connection of the first electrodes 220 to the second electrodes 280 that will be formed later.

The photoresist 231 having a characteristic of an image reversal is coated on the transparent substrate 210 having the first electrodes 220 formed thereon. AZ 5214E (Clariant) is used for the photoresist 231. The photoresist 231 is formed to have 1 μm to 5 μm thickness and, preferably, 3 μm to 5 μm thickness. Such photoresist 231 basically has a property of a positive photosensitive material. Yet, once the heat is applied at a certain temperature, generally, from 115° C. to 125° C. for 90 to 120 seconds after the exposure, an exposed portion is image-reversed and then becomes insoluble in a developer.

Figure 14B:
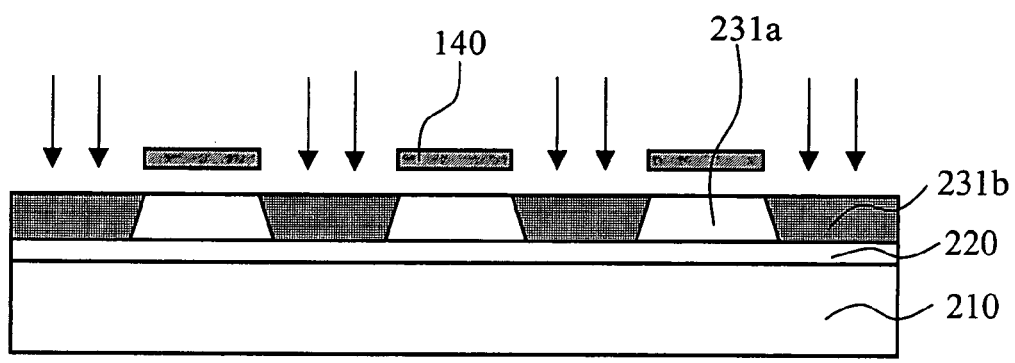
Figure 15B:
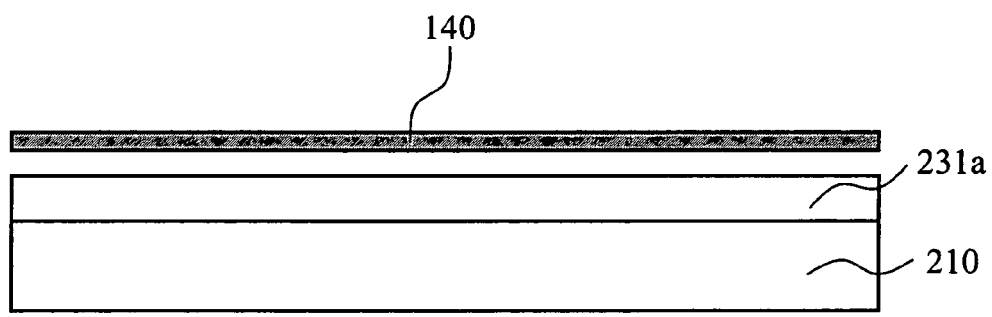
Figure 16B:
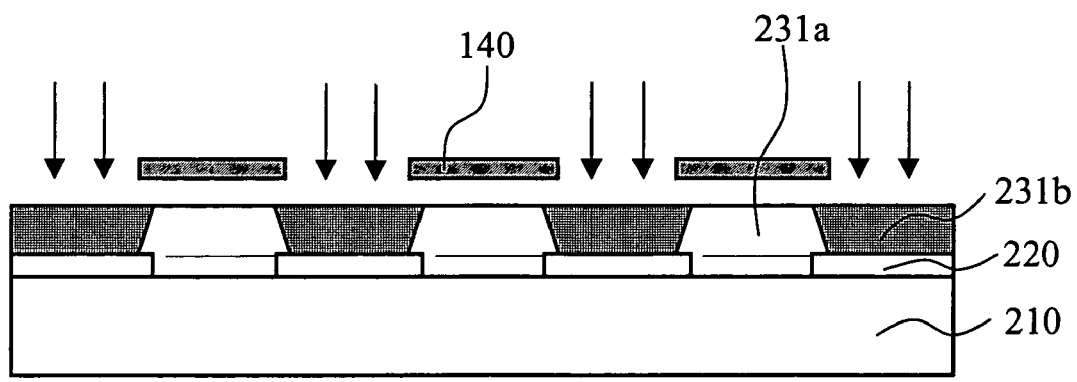

As can be seen from FIGS. 14B, 15B and 16B, after the photoresist 231 is coated about 4 μm thick, a prebaking is carried out at 100° C. for about 60 seconds so as to dry the photoresist 231. Then, an area between the first electrodes 220 and an area crossing with the first electrodes 220 are shielded by using the first exposure mask 140 in FIG. 13A and, then, the photoresist 231 is exposed over 330 $mJ/cm^2$ to 500 $mJ/cm^2$, thereby carrying out a first exposure process.

The photoresist 231 is divided into a non-exposure photoresist 231a and a first exposure photoresist 231b by the first exposure process. The non-exposure photoresist 231a has a property of being insoluble in a base developer, and the first exposure photoresist 231b has a property of being removable by the base developer.

Figure 14C:
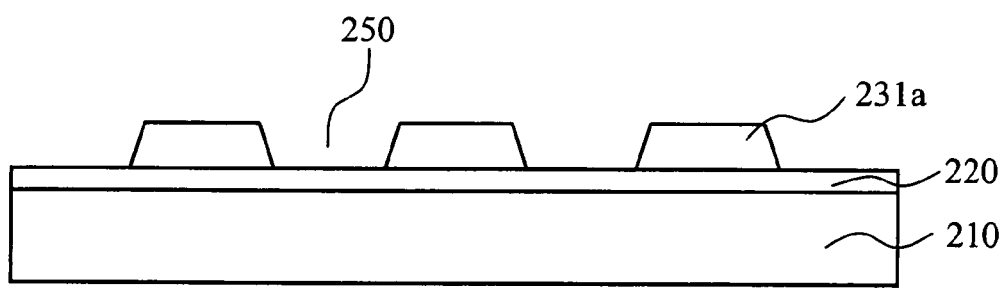
Figure 15C:
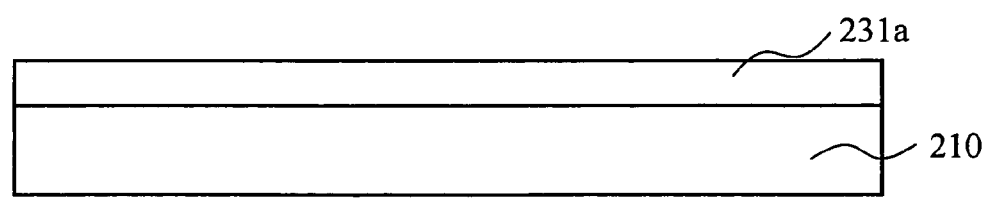
Figure 16C:
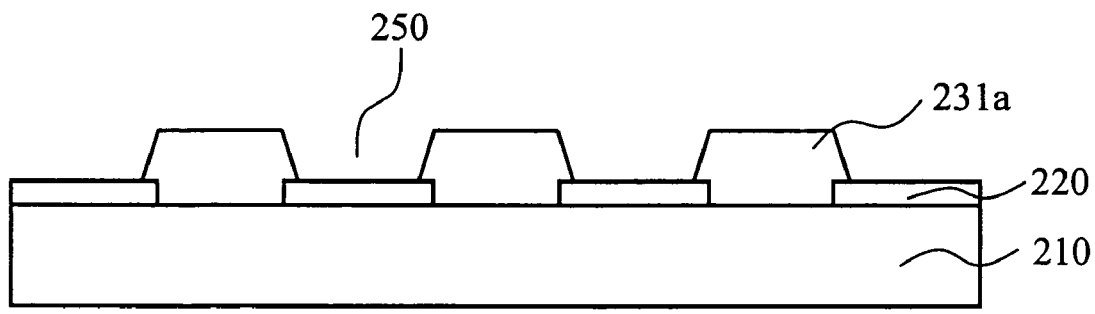

As depicted in FIGS. 14C, 15C and 16C, if the first exposure photoresist 231b is removed by the base developer, the non-exposure photoresist 231a remains in an area between the first electrodes 220 and an area crossing with the first electrodes 220, thereby forming on the first electrodes 220 a lattice type of insulating pattern having the openings 250 for exposing an area where pixels are formed. In this case, the photoresist pattern has a positive profile.

Figure 14D:
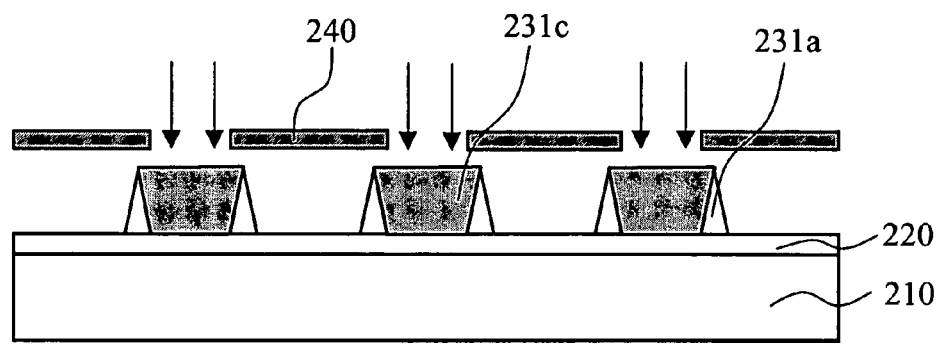
Figure 15D:
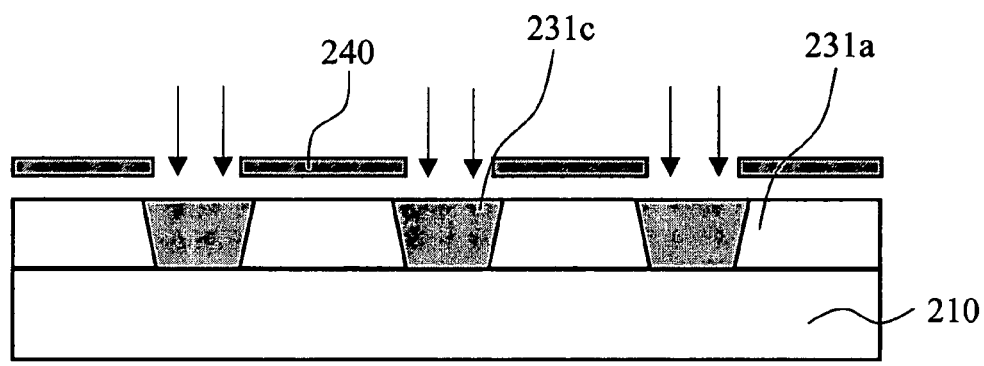
Figure 16D:
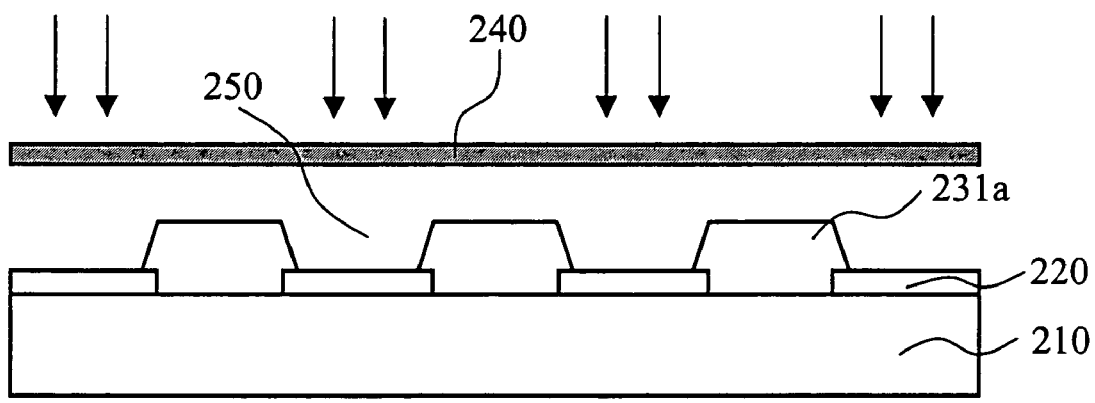

As described in FIGS. 14D, 15D and 16D, a second exposure process is carried out to expose the non-exposure layer 231a crossing with the first electrodes 220 at about 13 to 35 $mJ/cm^2$ by using the second exposure mask in FIG. 13B. In this case, a width of a light-transmitting area of the second exposure mask 240 is designed to be narrower than that of the non-exposure photoresist 231a in an area crossing with the first electrodes 220.

After performing the second exposure process, the exposed portion is heated at 120° C. for about 120 seconds, thereby forming a second exposure photoresist 231c. In the second exposure photoresist 231a, an unexposed portion is generated at a side of the non-exposure photoresist 231a perpendicular to the first electrodes 220. The image-reversed second exposure photoresist 231c has a property of being insoluble in a developer. Further, since only the non-exposure photoresist 231a in an area crossing with the first electrodes 220 is exposed, the exposed portion is not shown in FIG. 16D taken along the line C-C' in FIG. 12.

Figure 14E:
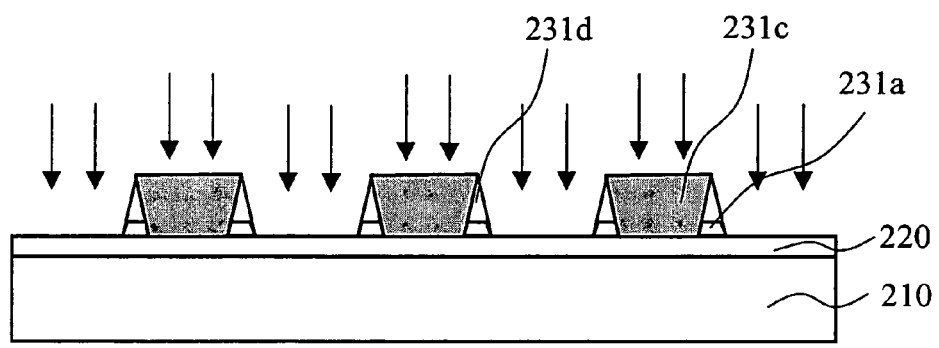
Figure 15E:
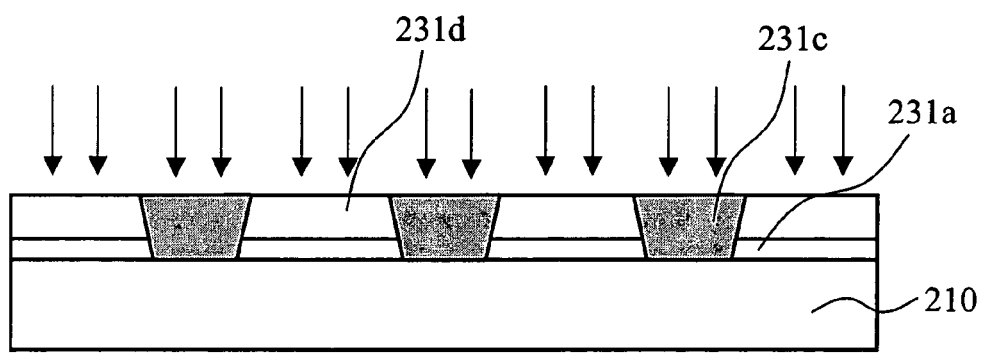
Figure 16E:
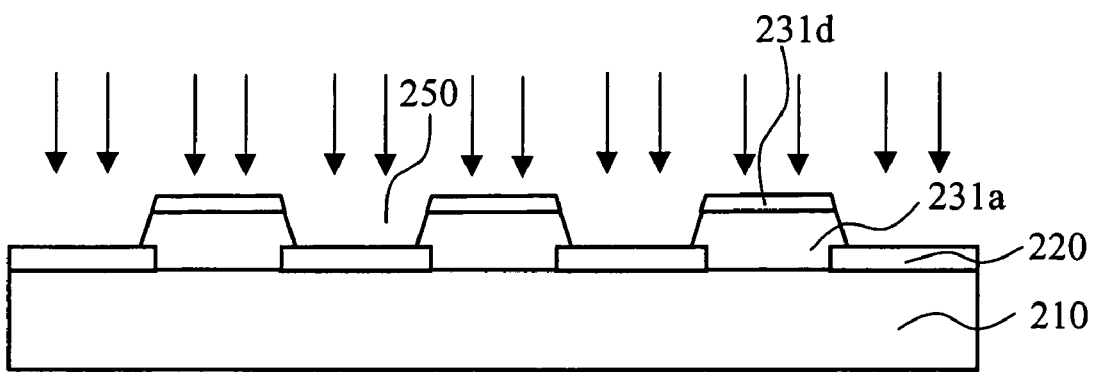

As illustrated in FIGS. 14E, 15E and 16E, a third exposure process in which a flood exposure is carried out at about 140 mJ/cm$^2$ to 230 mJ/cm$^2$ without using a mask is performed. If the third exposure process is carried out, the property of the second image-reversed exposure photoresist 231c in an area perpendicular to the first electrodes 220, which is insoluble in a developer, is maintained. However, the non-exposure photoresist 231a formed at the side of the second exposure photoresist 231c or the like is exposed, thereby forming a third exposure photoresist 231d. Since a uniform thickness of an insulating layer in parallel with the first electrodes 220 needs to remain in the third exposure process, the uniform thickness of the insulating layer in parallel with the first electrodes 220 remains by controlling an exposure amount. Accordingly, a lower side portion of the insulating layer perpendicular to the first electrodes 220 still remains as the non-exposure photoresist 231a after the development.

Figure 14F:
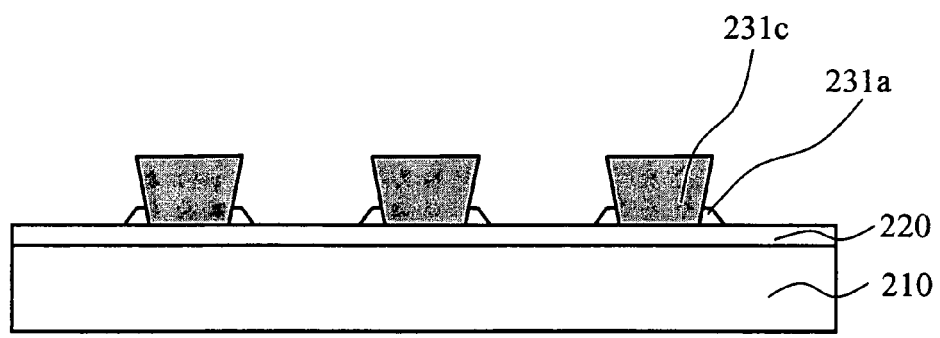
Figure 15F:
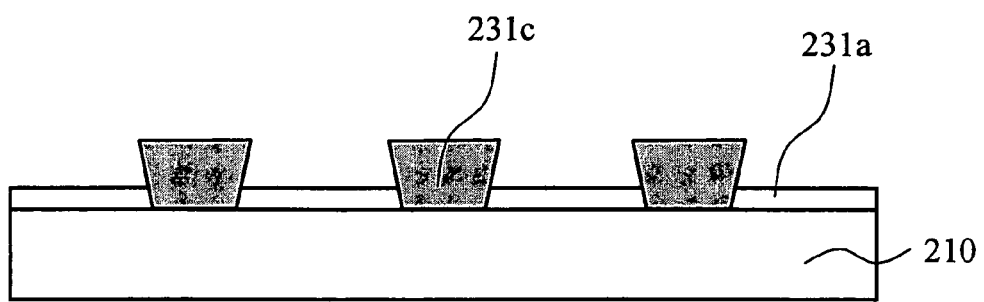
Figure 16F:
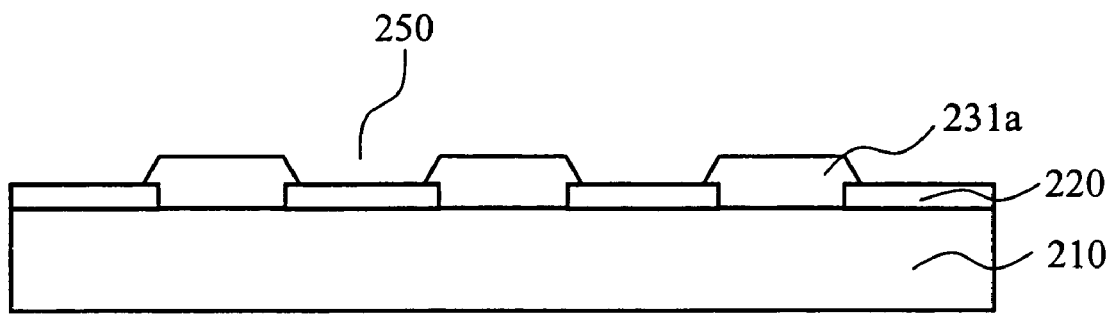

As illustrated in FIGS. 14F, 15F and 16F, if the development process is carried out, the second exposure photoresist 231c and the non-exposure photoresist 231a do not dissolve in a developer, whereas only the third exposure photoresist 231d is removed. Therefore, as illustrated in FIG. 14F, the photoresist pattern in an area crossing with the first electrodes has a negative profile after the third exposure photoresist 231b is developed, and the non-exposure photoresist remains thereunder.

Figure 17:
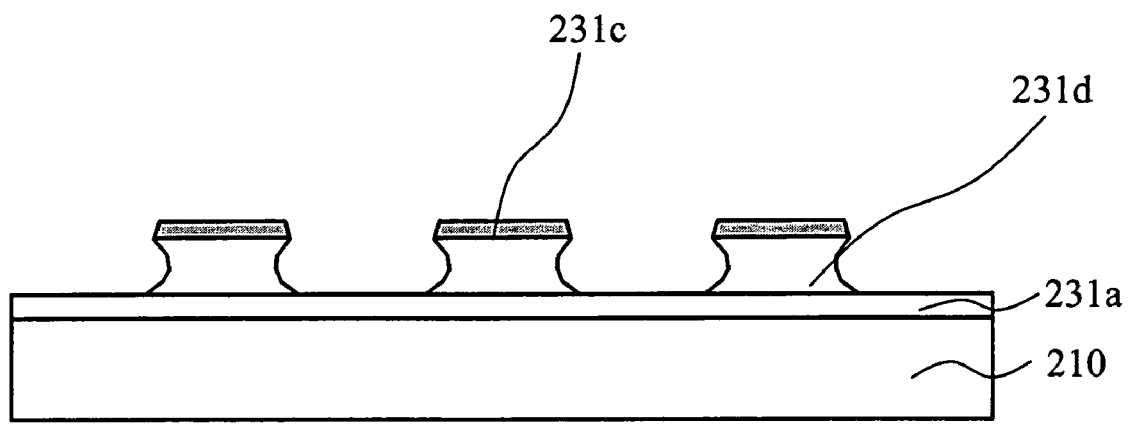
FIG. 17 describes a cross-sectional view of a process in which an exposure amount is controlled in a second exposure process of the first preferred embodiment of the present invention.

FIG. 17 provides a cross-sectional view of a process in which an exposure amount is controlled in the second exposure process of the first preferred embodiment of the present invention.

As illustrated in FIG. 17, the insulating pattern in an area crossing with the first electrodes 220 has a T-shaped structure according to an exposure amount used in the second exposure process.

Figure 14G:
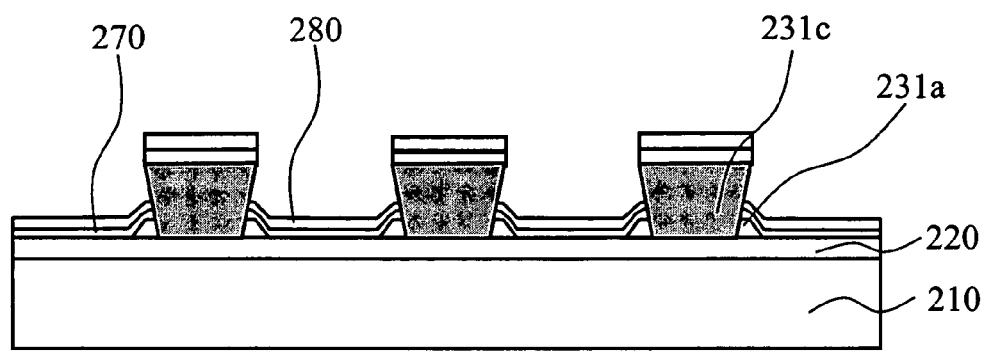
Figure 15G:
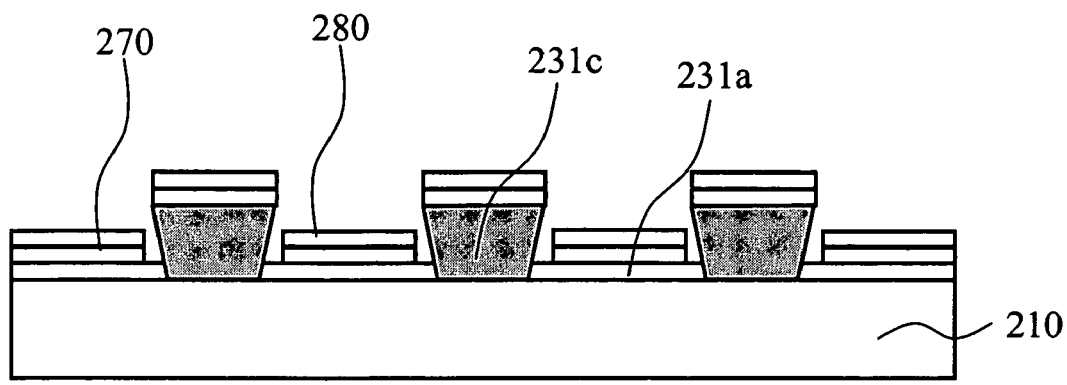
Figure 16G:
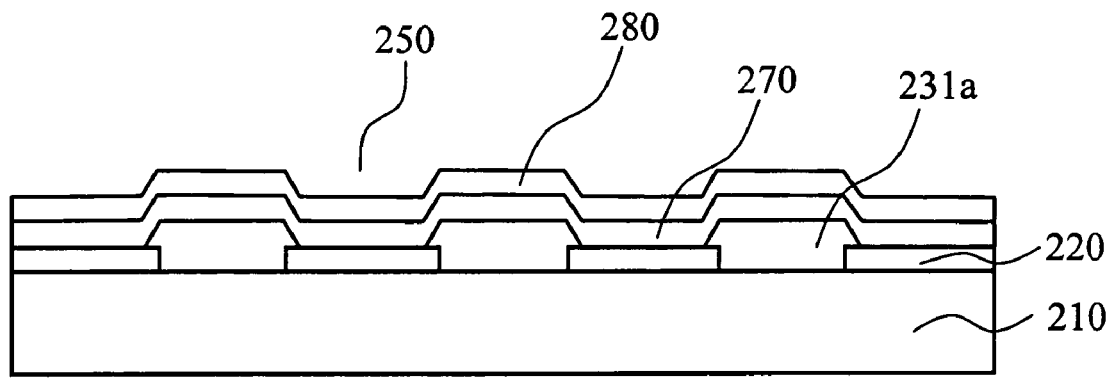

As shown in FIGS. 14G, 15G and 16G, after the development process has been completed, a dry process such as an air knife or a spin dry is carried out on the transparent substrate 210 at a temperature lower than 100° C. Then, the transparent substrate 210 undergoes a postbaking process and is then transferred to a vacuum deposition apparatus. In the vacuum deposition apparatus, the organic light-emitting layers 270 are stacked on the transparent substrate 210 including the photoresist pattern 231 in the vacuum deposition apparatus. In this case, the organic light-emitting layers 270 are formed of low molecular fluorescent and phosphorescent organic light-emitting materials such as Alq$_3$, Anthracene, Ir(ppy)$_3$, or the like and polymeric light-emitting materials such as PPV(polyphenylenevinylene), PT(polythiophene), or the like and their derivatives. The low molecular based organic material is patterned through the use of a thermal evaporation in which a shadow mask is installed inside a chamber. And, the polymer based organic material is patterned by a spin coating, a transcription, an ink jet printing, or the like.

In case of the low molecular materials, it is possible to form a hole injection layer and a hole transfer layer thereon before the organic light-emitting layers 270 are formed. Further, an electron transport layer and an electron injection layer can be formed on the organic light-emitting layers. When a hole injection electrode having a high work function is used, the hole injection layer is an organic thin film layer having properties of enabling to have massive holes injected therein as well as let the injected hole move therein. Even if being unable to have electrons injected therein, or if the injection is possible, the hole injection layer is the organic thin film layer having a property of being unable to have the electrons move therein. Moreover, when an electron injection electrode having a low work function is used, the electron transport layer is an organic thin film layer having properties of enabling to have massive electrons injected therein as well as let the injected electrons move therein. Even if being unable to have holes injected therein, the electron transfer layer is the organic thin film layer having a property of being unable to let the holes move therein. In case of the polymer based materials, the hole transfer layer is formed before the formation of the organic light-emitting layers 270.

Next, the second electrodes 280 are formed on the transparent substrate 210 including the organic light-emitting layers 270. The second electrodes 280 mainly use a metal having an excellent electric conductivity such as Al, Li/Al, MgAg, Ca, or the like, and are stacked by a sputtering, an e-beam deposition, a thermal evaporation, or the like. And, an encapsulation layer formed of a metal, a glass, or the like or a passivation layer made of an organic or an inorganic material is formed on the transparent substrate 210 including the second electrodes 280 so as to airtightly protect the organic light-emitting layers 270 vulnerable to moisture and oxygen from the outside.

Hereinafter, a fabricating method of an organic electroluminescence display in accordance with a second preferred embodiment of the present invention will be described in detail with reference to FIGS. 18A to 18G, FIGS. 19A to 19G and FIGS. 20A to 20G.

FIGS. 18A to 18G show cross-sectional views illustrating a process of the fabricating method of the organic electroluminescence display in accordance with the second preferred embodiment of the present invention, which are taken along the line A-A' in FIG. 12.

FIGS. 19A to 19G illustrate cross-sectional views illustrating the process of the fabricating method of the organic electroluminescence display in accordance with the second preferred embodiment of the present invention, which are taken along the line B-B' in FIG. 12.

FIGS. 20A to 20G offer cross-sectional views illustrating the process of the fabricating method of the organic electroluminescence display in accordance with the second preferred embodiment of the present invention, which are taken along the line C-C' in FIG. 12.

Figure 18A:
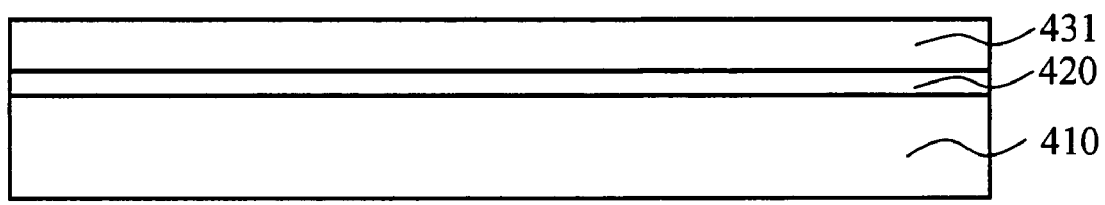
FIGS. 18A to 18G show cross-sectional views illustrating a process of the fabricating method of the organic electroluminescence display in accordance with the second preferred embodiment of the present invention, which are taken along the line A-A' in FIG. 12.
Figure 19A:
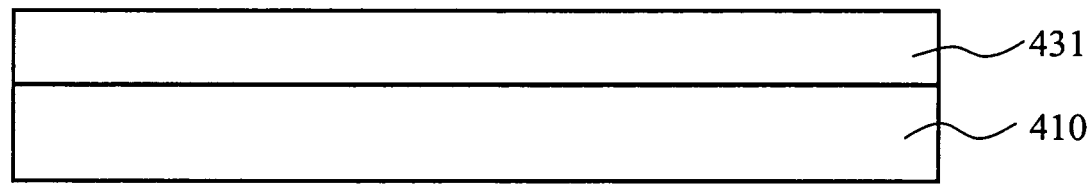
FIGS. 19A to 19G illustrate cross-sectional views illustrating the process of the fabricating method of the organic electroluminescence display in accordance with the second preferred embodiment of the present invention, which are taken along the line B-B' in FIG. 12.
Figure 20A:
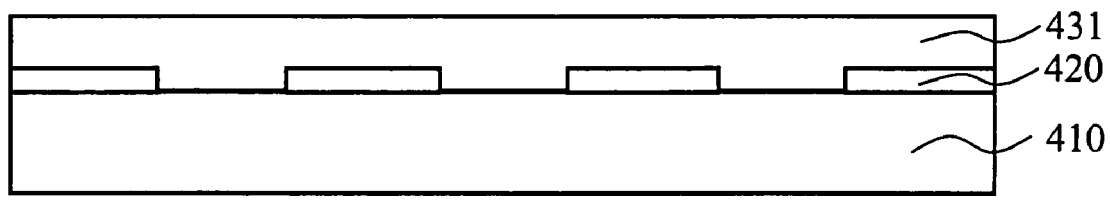
FIGS. 20A to 20G offer cross-sectional views illustrating the process of the fabricating method of the organic electroluminescence display in accordance with the second preferred embodiment of the present invention, which are taken along the line C-C' in FIG. 12.

As shown in FIGS. 18A, 19A and 20A, a transparent substrate 410 that has been cleaned is prepared. The transparent substrate 410 generally includes a glass substrate. An anode layer is stacked on the transparent substrate 410 by a sputtering, and a photoresist (not shown) is applied thereon. Then, an exposure and a development to the photoresist are carried out, thereby forming a stripe type of photoresist pattern (not shown). The anode layer is etched by using the photoresist pattern as a mask, thereby forming stripe type first electrodes 420.

A process for forming an insulating layer is carried out in order to inhibit a leakage current from the edges of the first electrodes 420. Further, the insulating pattern having an electrically insulating characteristic is used to prevent an electrical connection of the first electrodes 420 to the second electrodes 480 that will be formed later. A photoresist 431 having a characteristic of an image reversal is coated on the transparent substrate 410 having the first electrodes 420 formed thereon. AZ 5214E (Clariant) is used for the photoresist 431. The photoresist 431 is formed 1 μm to 5 μm thickness. Such photoresist 431 basically has a property of a positive photosensitive material. Yet, once the heat is applied to the photoresist at a certain temperature, generally, from 115° C. to 125° C. for 90 to 120 seconds, an exposed portion thereof is image-reversed and, thus, becomes insoluble in a developer.

Figure 18B:
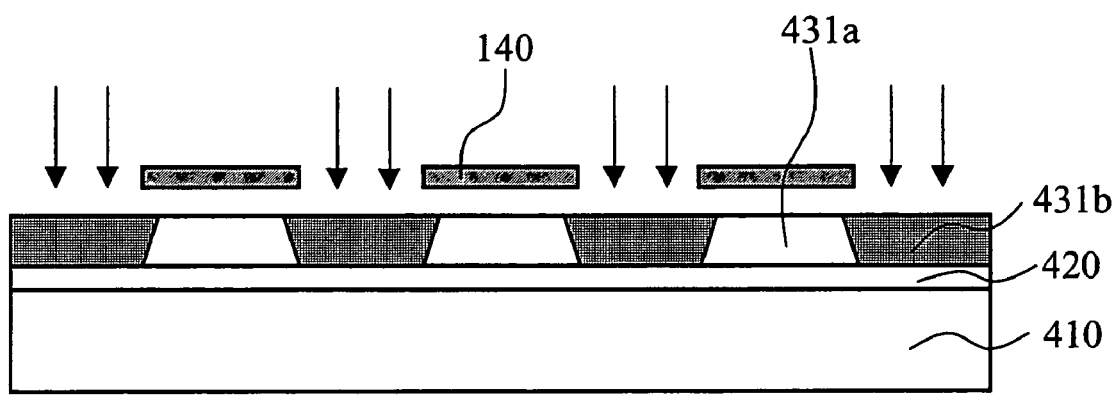
Figure 19B:
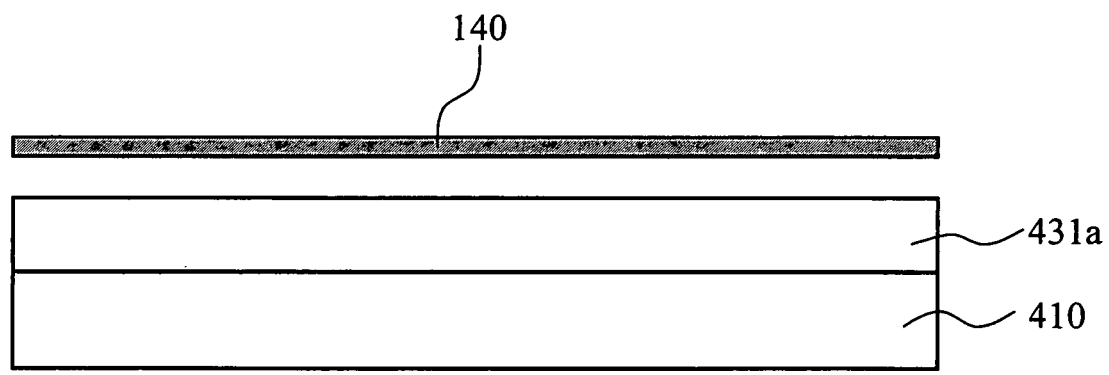
Figure 20B:
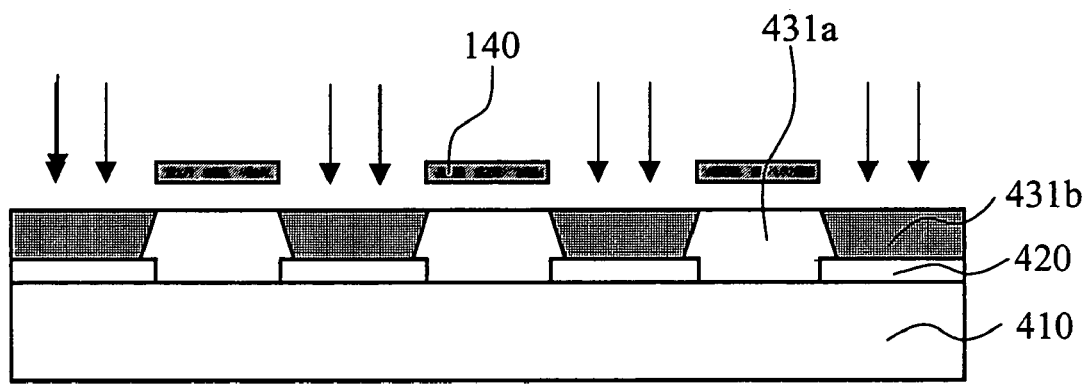

As can be seen from FIGS. 18B, 19B and 20B, after the photoresist 431 is applied about 3 µm to 5 µm thick, a prebaking is carried out at 100° C. for about 60 seconds so as to dry the photoresist 431. Then, an area between the first electrodes 420 and an area crossing with the first electrodes 420 are shielded by using the first exposure mask 140 in FIG. 13A and, then, the photoresist 431 is exposed over 330 mJ/cm² to 500 mJ/cm², thereby carrying out a first exposure process.

The photoresist 431 is divided into a non-exposure photoresist 431a and a first exposure photoresist 431b by the first exposure process. The non-exposure photoresist 431a becomes insoluble in a base developer, as same as the photoresist 431, and the first exposure photoresist 431b becomes removable by the base developer.

Figure 18C:
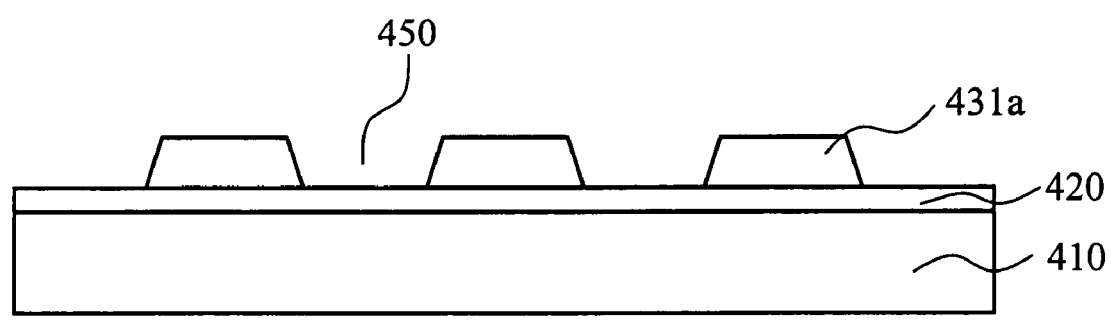
Figure 19C:
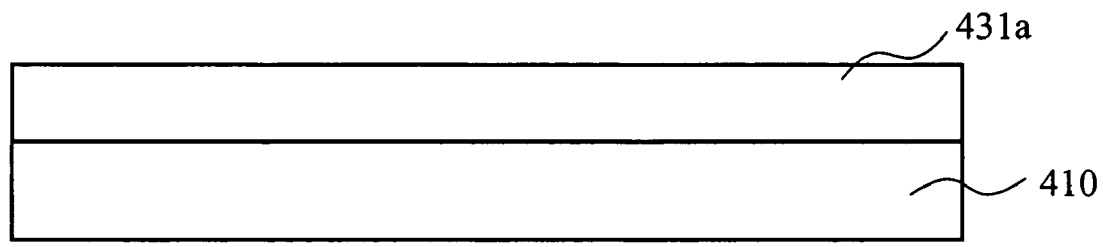
Figure 20C:
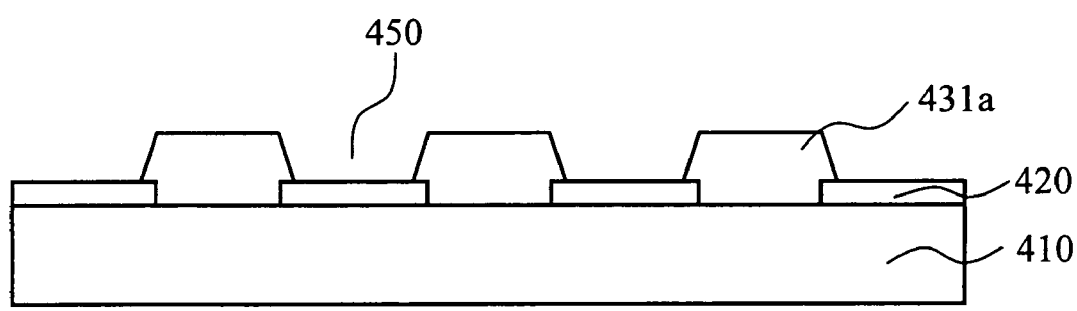

As depicted in FIGS. 18C, 19C and 20C, if the first exposure photoresist 431b is removed by the alkaline developer, the non-exposure photoresist 431a remains in an area between the first electrodes 420 and an area crossing with the first electrodes 420, thereby forming on the first electrodes 420 a lattice type of photoresist pattern having the openings 450 for exposing an area where pixels are formed. In this case, the photoresist pattern has a positive profile.

Figure 18D:
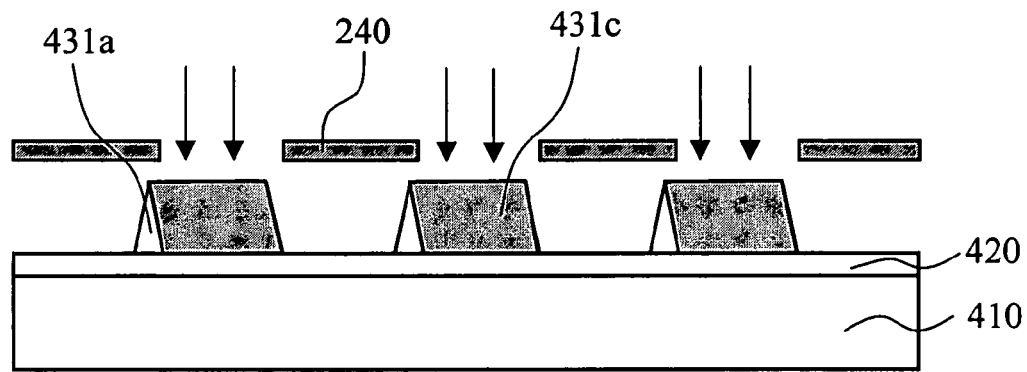
Figure 19D:
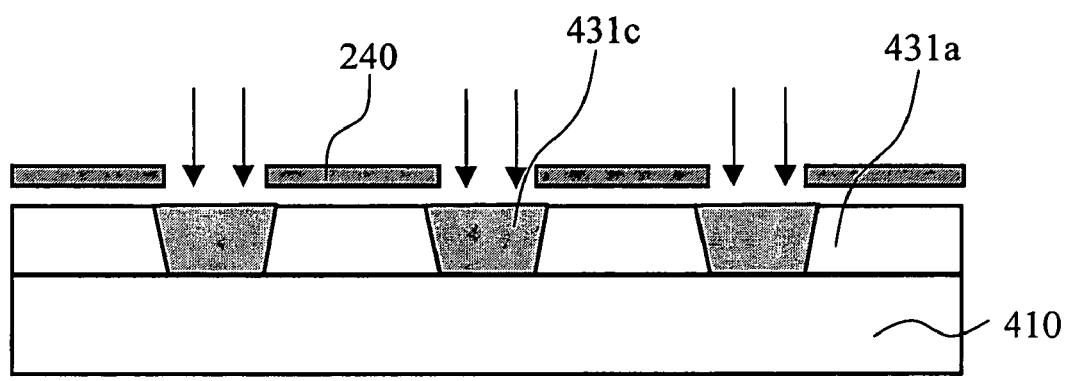
Figure 20D:
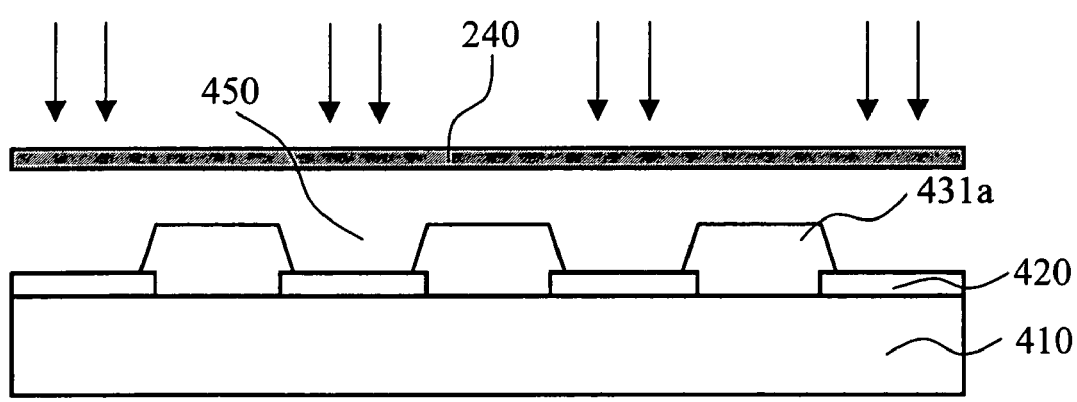

As described in FIGS. 18D, 19D and 20D, a second exposure process is carried out to expose the non-exposure layer 431a crossing with the first electrodes 420 at about 13 to 35 mJ/cm² by using the second exposure mask 240 illustrated in FIG. 13B. As can be seen from 19D, one side of a shield pattern of the second exposure mask 240 is aligned with an inner portion of the non-exposure photoresist 431a, and the other side of the shield pattern is aligned with an outer portion of the non-exposure photoresist 421a.

After carrying out the second exposure process, the exposed portion is image-reversed by carrying out a heat treatment at 120° C. for about 120 seconds, thereby forming a second exposure photoresist 431a. As described in FIG. 19D, the second exposure photoresist 431a perpendicular to the first electrodes 420 includes an unexposed portion formed at one side of the non-exposure photoresist 431a aligned with the inner portion of the shield pattern of the second exposure mask 240. The image-reversed second exposure photoresist 431c has a property of being insoluble in a developer. Further, since only the non-exposure photoresist 431a in an area crossing with the first electrodes 420 is exposed, the exposed portion is not shown in FIG. 20D taken along the line C-C' in FIG. 12.

Figure 18E:
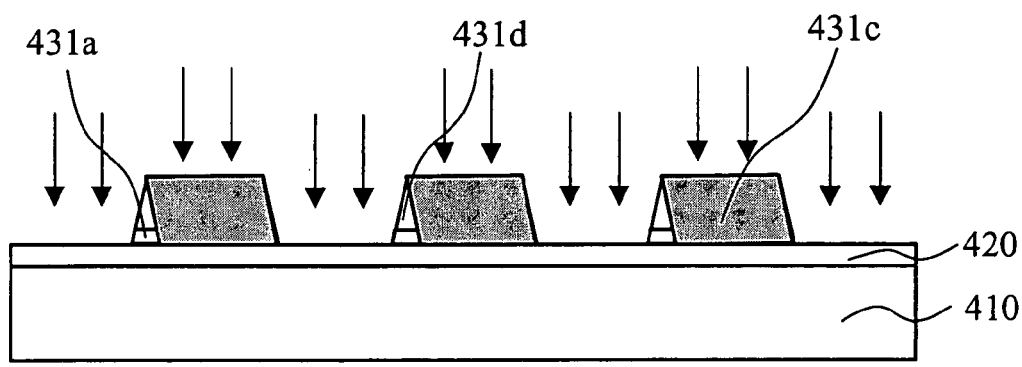
Figure 19E:
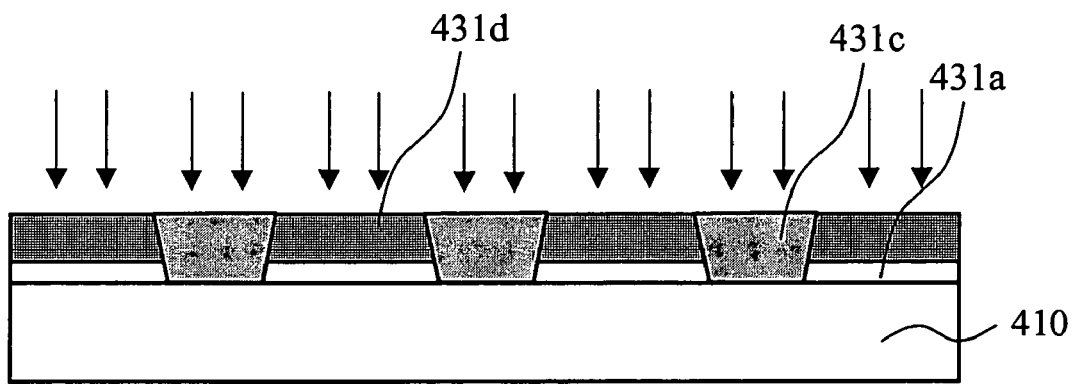
Figure 20E:
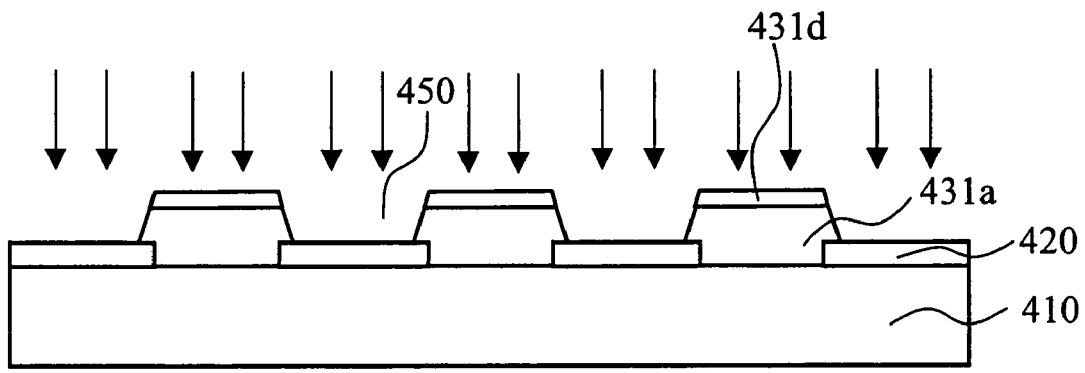

As illustrated in FIGS. 18E, 19E and 20E, a third exposure process in which a flood exposure is carried out at about 140 mJ/cm² to 230 mJ/cm² without using a mask is performed. If the third exposure process is carried out, the property of the image-reversed second exposure photoresist 431c in an area perpendicular to the first electrodes 420, which is insoluble in a developer, is maintained. However, the non-exposure photoresist 431a formed at one side of the second exposure photoresist 431c is exposed, thereby forming a third exposure photoresist 431d. And, the non-exposure photoresist 431a remains under the third exposure photoresist 431d. The other side of the non-exposure photoresist 431a is completely exposed and image-reversed in the second exposure process, so that the third exposure photoresist 431d is not formed.

Since a predetermined thickness of an insulating layer in parallel with the first electrodes 420 needs to remain in the third exposure process, an exposure amount is controlled to achieve the predetermined thickness of the insulating layer in parallel with the first electrodes 420. Thus, a lower side portion of the insulating layer perpendicular to the first electrodes 420 remains as the non-exposure photoresist 431a after the development.

Figure 18F:
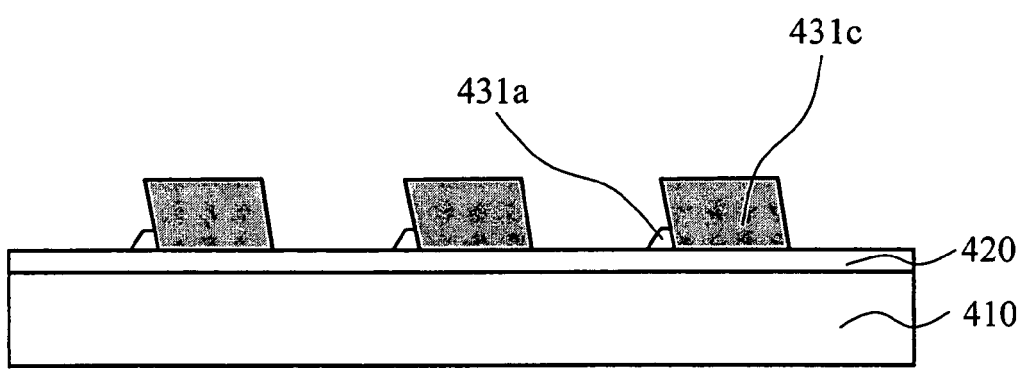
Figure 19F:
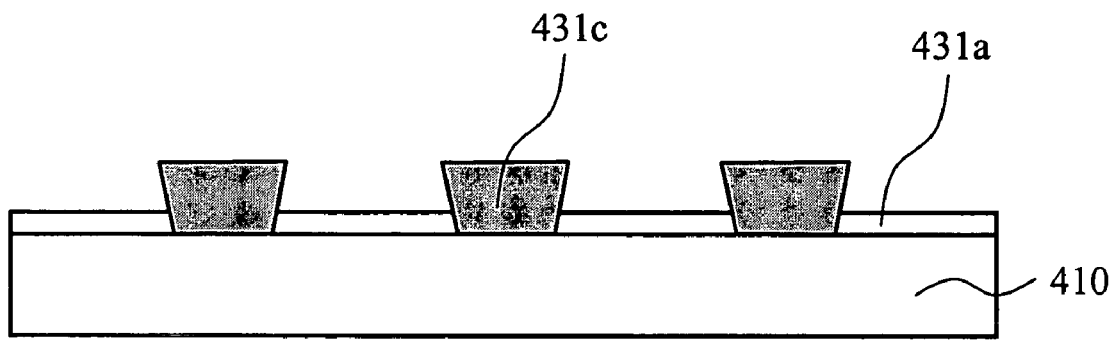
Figure 20F:
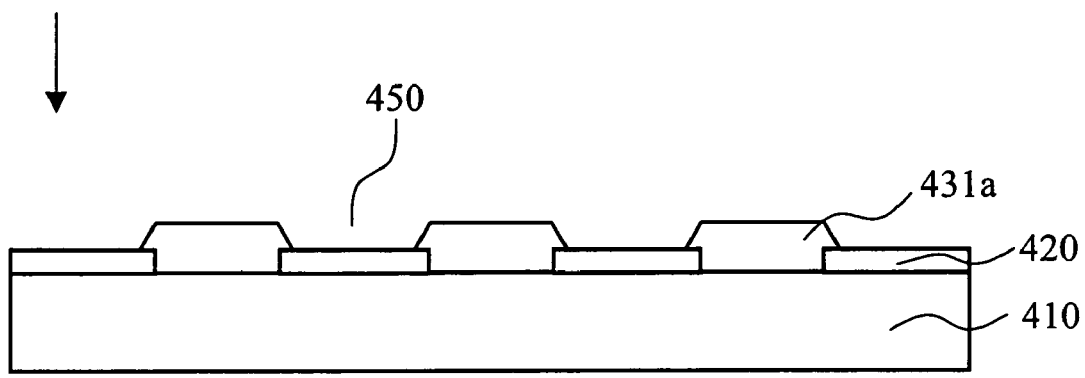

As illustrated in FIGS. 18F, 19F and 20F, if the development process is carried out, the second exposure photoresist 431c and the non-exposure photoresist 431a do not dissolve in a base developer, whereas only the third exposure photoresist 431d is removed. As a result, as illustrated in FIG. 18F, one side of the photoresist pattern in an area crossing with the first electrodes 420 forms a negative profile due to an etching of the third exposure photoresist 431b, and the non-exposure photoresist 431a remains thereunder.

Figure 21A:
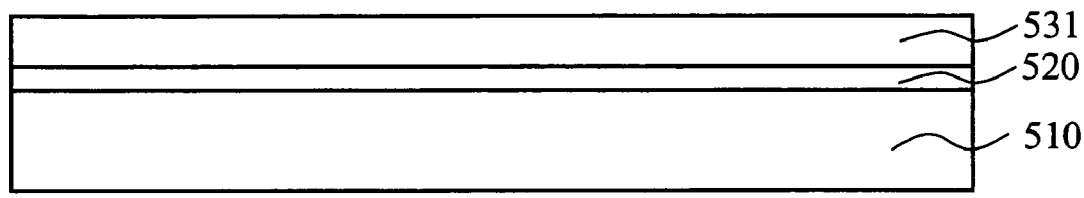
FIGS. 21A to 21H provide cross-sectional views illustrating a process of the fabricating method of the organic electroluminescence display in accordance with the third preferred embodiment of the present invention, which are taken along the line A-A' in FIG. 12.
Figure 21B:
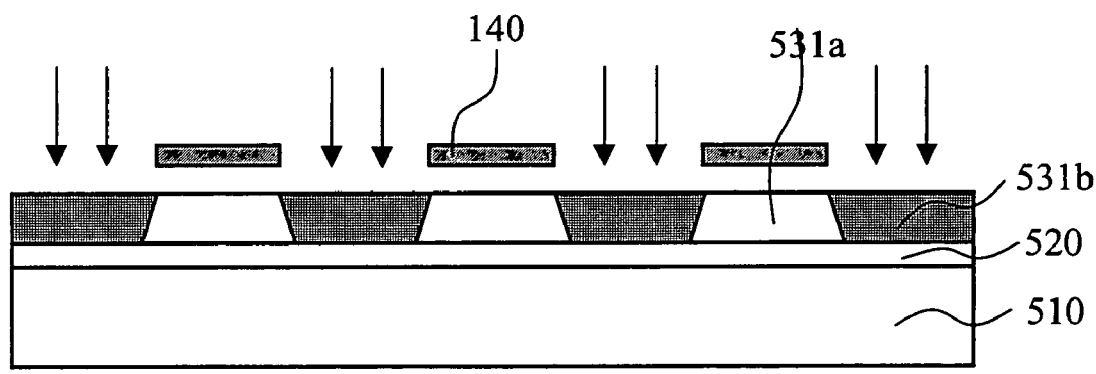
Figure 21C:
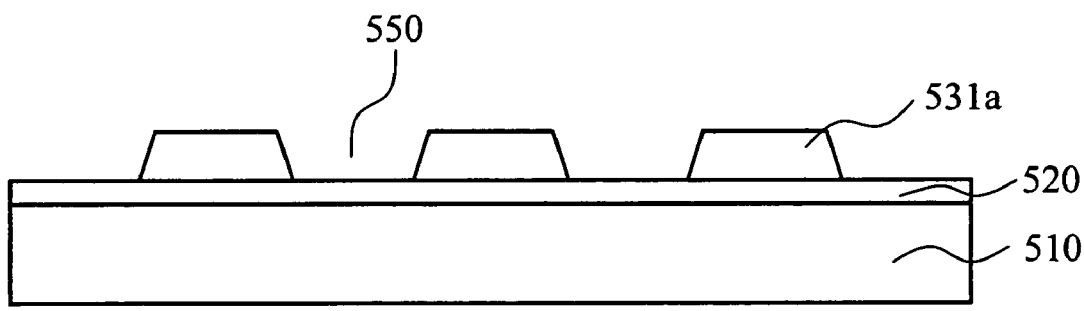
Figure 21D:
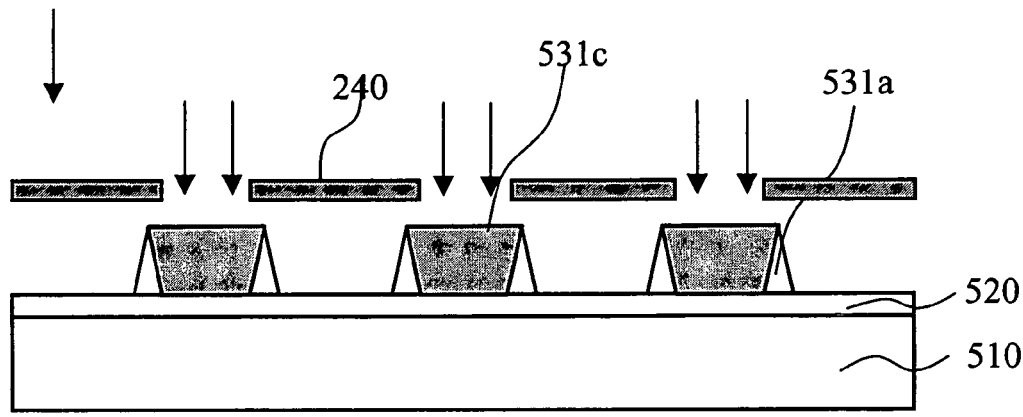
Figure 21E:
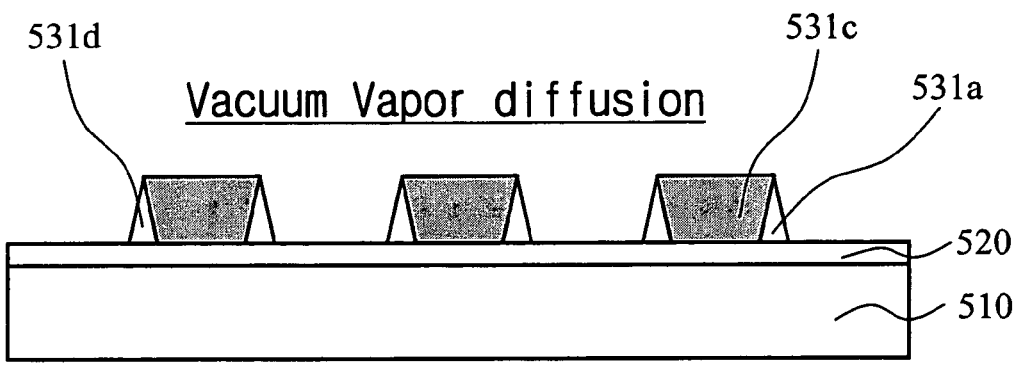
Figure 21F:
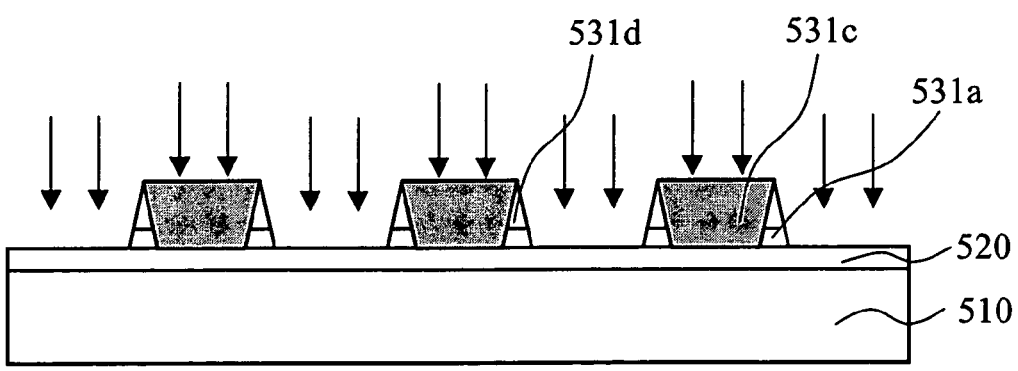

The photoresist pattern in parallel with the first electrodes 420, on which the second electrodes 480 run, is shielded by the second exposure mask 240 in the second exposure process and, thus, the second exposure photoresist mask 431c is not formed as shown in FIG. 21F. In the third exposure process, the third exposure photoresist 431d is formed and developed by controlling an exposure amount, thereby comparatively lowering a thickness of the photoresist pattern in parallel with the first electrodes 420 than that of the photoresist pattern crossing with the first electrodes 420.

The reason for lowering the thickness of the photoresist pattern in parallel with the first electrodes 420, on which the second electrodes 480 run, is to exclude a possibility of an open circuit occurring since a film thickness of the second electrodes 480 formed in a direction perpendicular to the first electrodes 420 becomes thinner when the second electrodes 480 are deposited at a boundary between edges of the photoresist pattern and the first electrodes 420. In this case, the remaining thickness of the non-exposure photoresist 231a is about 0.5 to 2 µm.

Figure 18G:
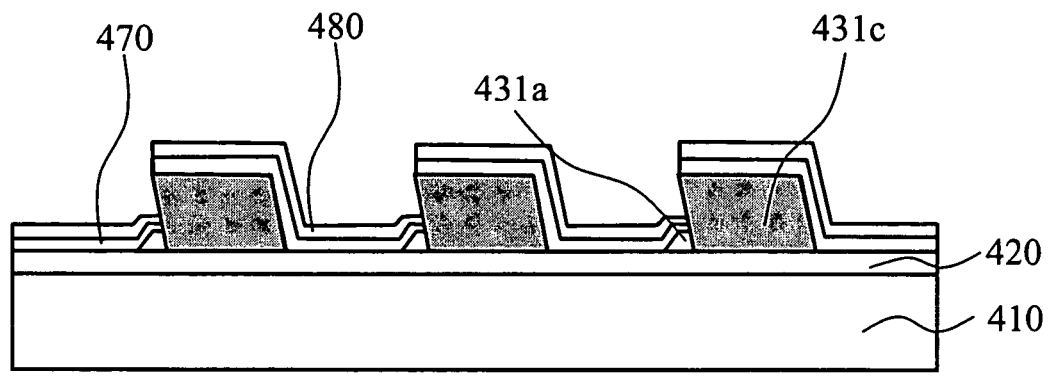
Figure 19G:
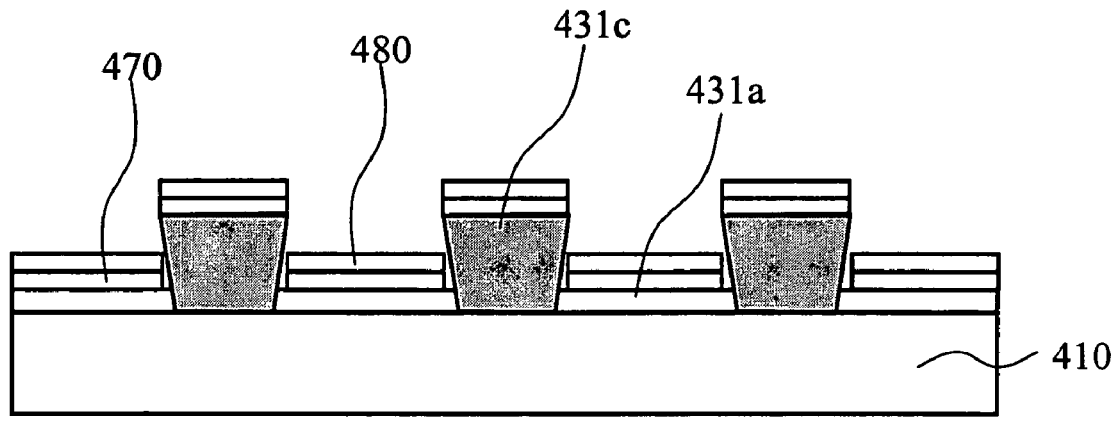
Figure 20G:
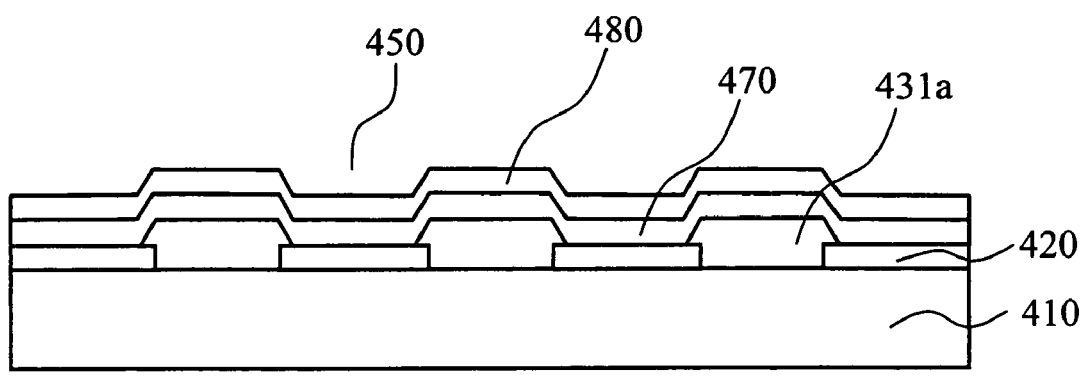

As shown in FIGS. 18G, 19G and 20G, after the development process has been completed, a dry process such as an air knife or a spin dry is carried out on the transparent substrate 420 at a temperature lower than 100° C. Then, the transparent substrate 410 undergoes a postbaking process and is then transferred to a vacuum deposition apparatus, and the organic light-emitting layers 470 are stacked on the transparent substrate 410 including the photoresist pattern in the vacuum deposition apparatus.

Thereafter, the second electrodes 480 are formed on the transparent substrate 410 including the organic light-emitting layers 470. The second electrodes 480 mainly use a metal having an excellent electric conductivity such as Al or the like, and are stacked by a vacuum deposition. And, an encapsulation layer (not shown) made of a metal, a glass, or the like is formed on an entire surface including the second electrodes 480 so as to make the organic light-emitting layers 470 vulnerable to moisture and oxygen airtight from the outside.

Hereinafter, a fabricating method of an organic electroluminescence display in accordance with a third preferred embodiment of the present invention will be described in detail with reference to FIGS. 21A to 21H, FIGS. 22A to 22H and FIGS. 23A to 23H.

FIGS. 21A to 21H provide cross-sectional views illustrating a process of the fabricating method of the organic electroluminescence display in accordance with the third preferred embodiment of the present invention, which are taken along the line A-A' in FIG. 12.

FIGS. 22A to 22H present cross-sectional views illustrating the process of the fabricating method of the organic electroluminescence display in accordance with the third preferred embodiment of the present invention, which are taken along the line B-B' in FIG. 12.

FIGS. 23A to 23H represent cross-sectional views illustrating the process of the fabricating method of the organic electroluminescence display in accordance with the third preferred embodiment of the present invention, which are taken along the line C-C' in FIG. 12.

Figure 22A:
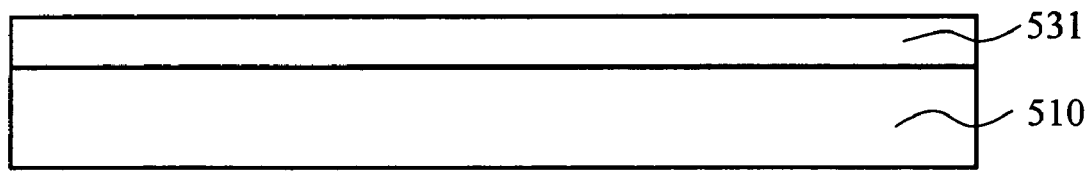
FIGS. 22A to 22H present cross-sectional views illustrating the process of the fabricating method of the organic electroluminescence display in accordance with the third preferred embodiment of the present invention, which are taken along the line B-B' in FIG. 12.
Figure 23A:
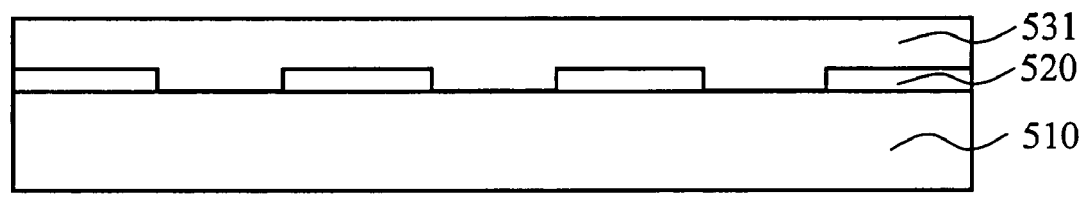
FIGS. 23A to 23H represent cross-sectional views illustrating the process of the fabricating method of the organic electroluminescence display in accordance with the third preferred embodiment of the present invention, which are taken along the line C-C' in FIG. 12.

As shown in FIGS. 21A, 22A and 23A, a transparent substrate 510 that has been cleaned is prepared. As for the transparent substrate 510, a glass substrate is generally used. An anode layer is deposited on the cleaned transparent substrate 510 by a sputtering, and a photoresist (not shown) is coated thereon. Then, an exposure and a development to the photoresist are carried out, thereby forming a stripe type of photoresist pattern (not shown). The anode layer is etched by using the photoresist pattern as a mask, thereby forming the stripe type first electrodes 520.

Thereafter, a process for forming an insulating layer is carried out in order to inhibit a leakage current from the edges of the first electrodes 520. Further, the insulating pattern 531 having an electrically insulating characteristic is coated with a thickness of about 4 μm on the transparent substrate 510 having the first electrodes 520 formed thereon. The photoresist 531 is formed of a positive photosensitive material, and a thickness thereof is 1 μm to 5 μm and, preferably, 3 μm to 5 μm.

Figure 22B:
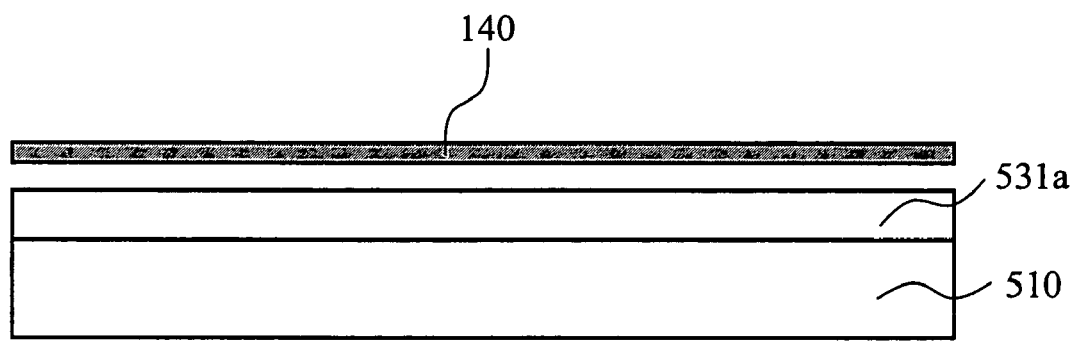
Figure 23B:
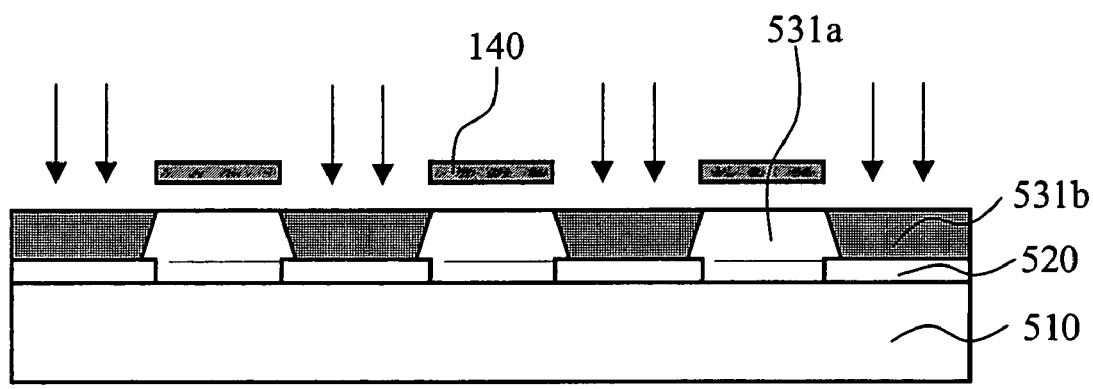

As can be seen from FIGS. 21B, 22B and 23B, after the photoresist 531 is applied thereon, a prebaking is carried out at 100° C. for about 60 seconds so as to dry the photoresist 531. Then, a first exposure process is carried out to shield an area between the first electrodes 520 and an area crossing with the first electrodes 520 and, then, expose the photoresist 231 over 330 mJ/cm$^2$ to 500 mJ/cm$^2$, using the first exposure mask 140 in FIG. 13A.

The photoresist 531 is divided into a non-exposure photoresist 531a and a first exposure photoresist 531b by the first exposure process. The non-exposure photoresist 531a becomes insoluble in a base developer, as same as the photoresist 531, and the first exposure photoresist 531b becomes removable by the base developer.

Figure 22C:
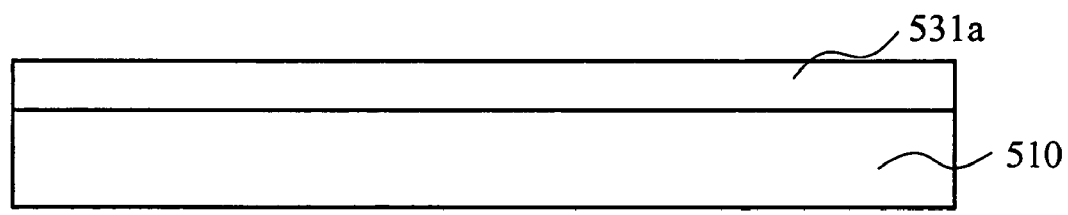
Figure 23C:
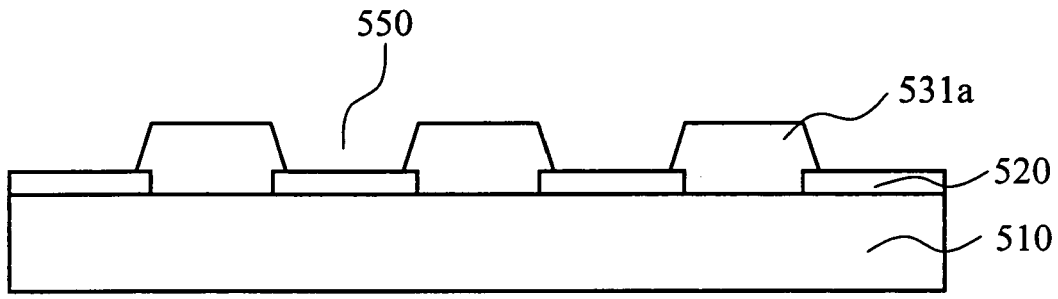

As depicted in FIGS. 21C, 22C and 23C, if the first exposure photoresist 531b is removed by the alkaline developer, the non-exposure photoresist 531a remains in an area between the first electrodes 520 and an area crossing with the first electrodes 520, thereby forming on the first electrodes 520 the lattice type insulating pattern 531 having the openings 550 for exposing an area where pixels are formed. In this case, the photoresist pattern has a positive profile.

Figure 22D:
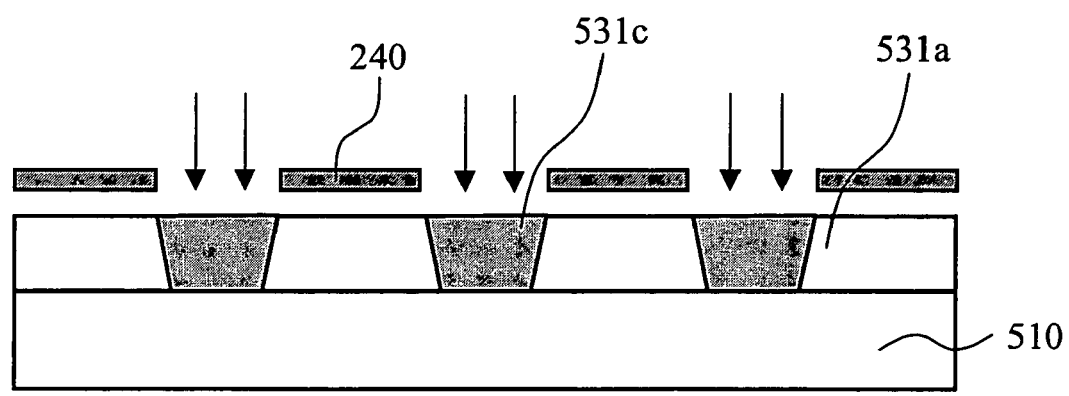
Figure 23D:
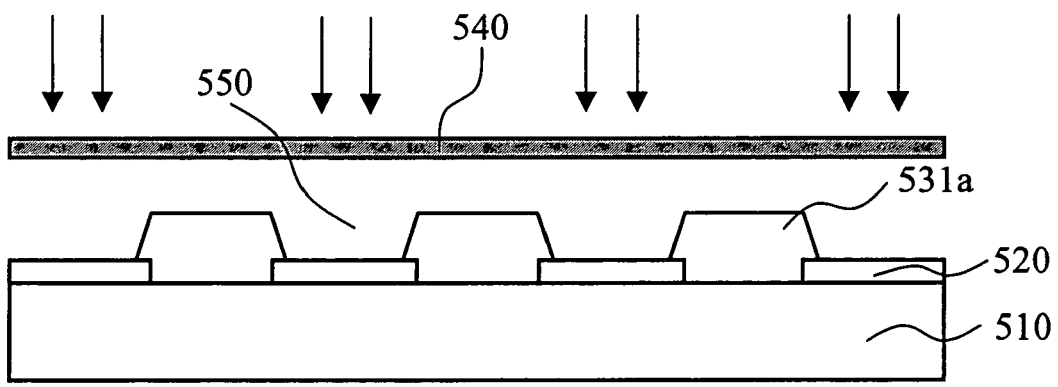

As described in FIGS. 21D, 22D and 23D, a second exposure process is carried out to expose the non-exposure photoresist 531a crossing with the first electrodes 520 by using the second exposure mask 240 in FIG. 13B. In this case, a width of a light-transmitting area of the second exposure mask 240 is designed to be narrower than that of the non-exposure photoresist 531a in an area crossing with the first electrodes 520.

Figure 22E:
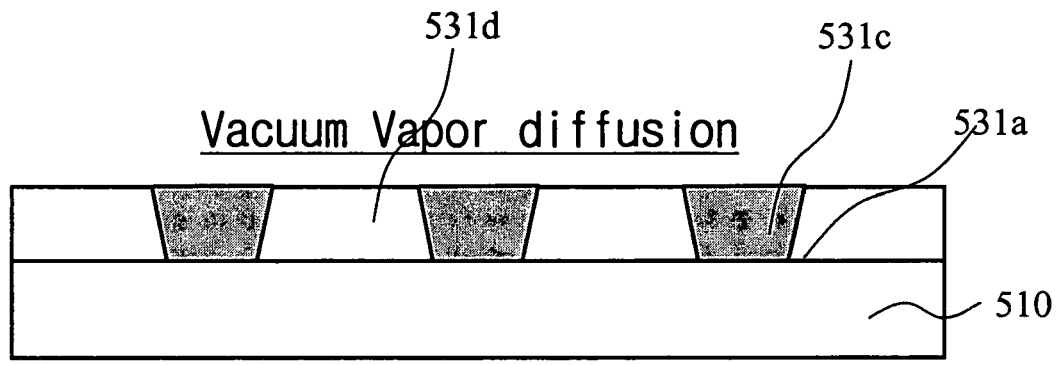
Figure 23E:
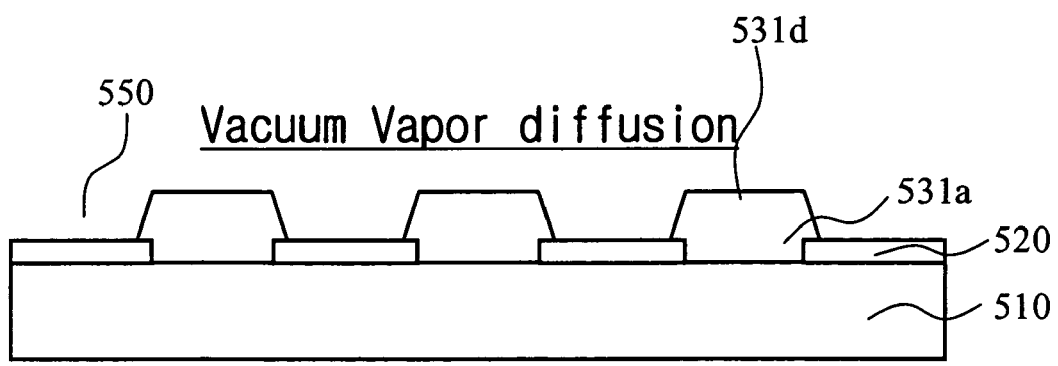

As depicted in FIGS. 21E, 22E and 23E, after carrying out the second exposure process, an image reversal base catalyst including amine such as imidazole, monazoline, triethanolamine and ammonia is diffused into the photoresist pattern 531.

After diffusing the image reversal base catalyst into the photoresist pattern 531, a baking process is carried out at a temperature 85° C. to 90° C. for more than 45 to 120 minutes, in a state that the base exists, thereby forming the second exposure photoresist 531c. In the second exposure process, as depicted in FIG. 21D, an unexposed portion is formed at a side of the non-exposure photoresist 531a perpendicular to the first electrodes 520.

The second exposure photoresist 531c has a negative property of being insoluble in a base developer. Further, since only the non-exposure photoresist 531a in an area crossing with the first electrodes 520 is exposed, the exposed portion is not shown in FIG. 16D taken along the line C-C' in FIG. 12.

Figure 22F:
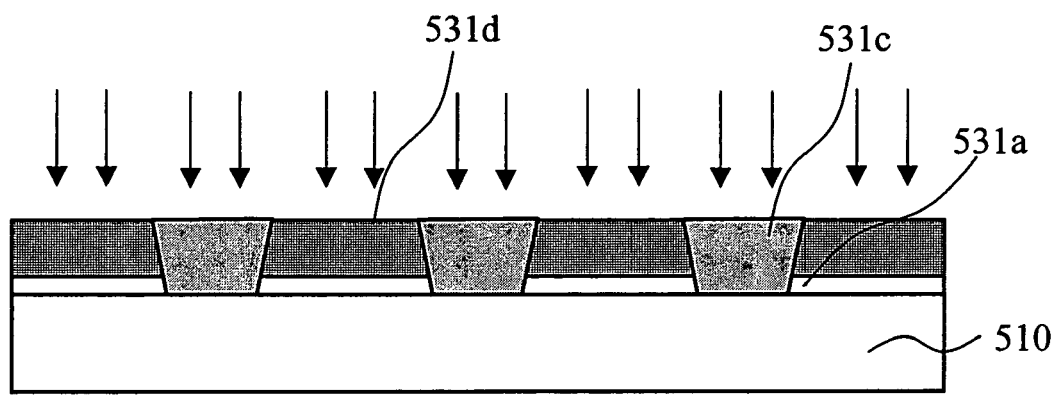
Figure 23F:
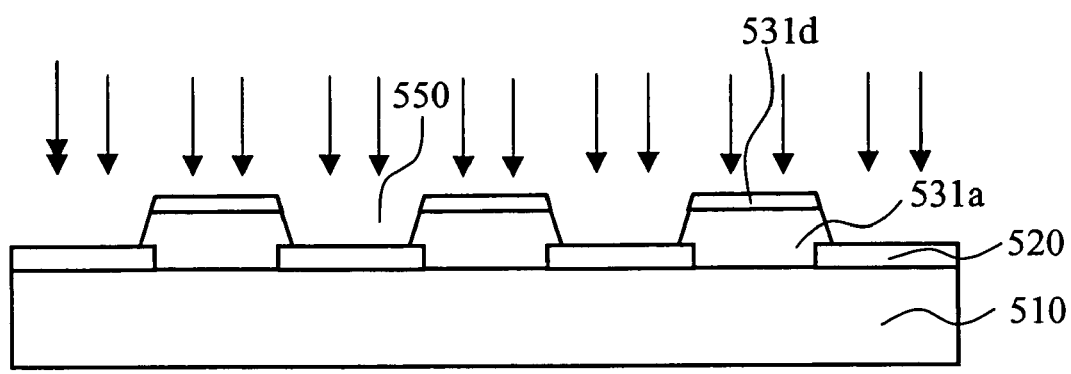

Next, as illustrated in FIGS. 21F, 22F and 23F, a third exposure process in which a flood exposure is carried out at about 140 mJ/cm$^2$ to 230 mJ/cm$^2$ without using a mask is performed. If the third exposure process is carried out, the second exposure photoresist 531c in an area perpendicular to the first electrodes 520, which is image-reversed to have a property of being insoluble in a developer, is maintained. However, the non-exposure photoresist 531a formed at the side of the second exposure photoresist 531c or the like is exposed, thereby forming a third exposure photoresist 531d. Since a uniform thickness of an insulating layer in parallel with the first electrodes 520 needs to remain in the third exposure process, an exposure amount is controlled to achieve the uniform thickness of the insulating layer in parallel with the first electrodes 520. Thus, a lower side portion of the insulating layer perpendicular to the first electrodes 520 remains as the non-exposure photoresist 531a after the development.

Figure 21G:
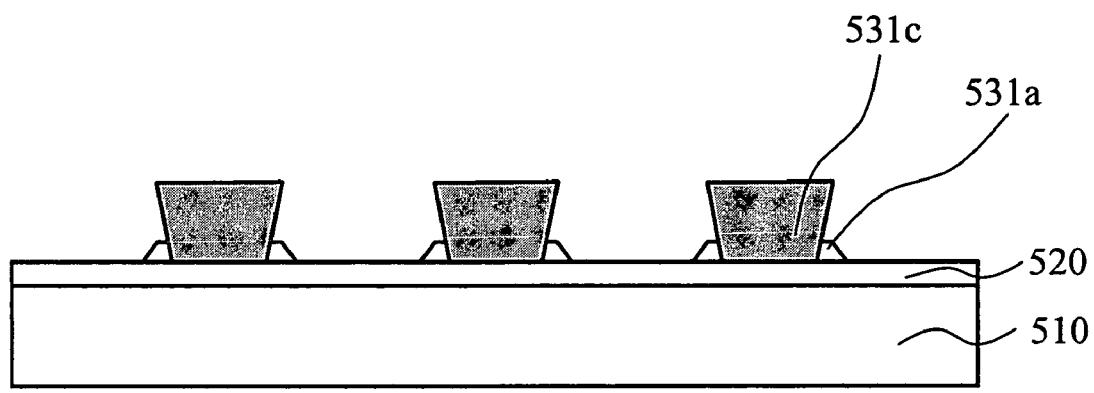
Figure 22G:
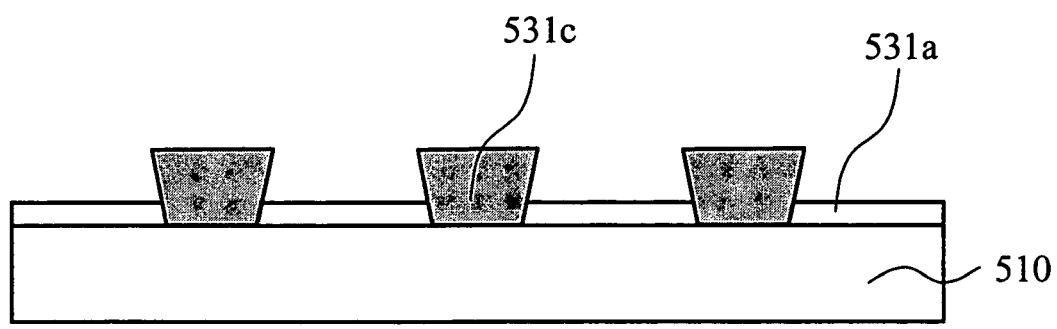
Figure 23G:
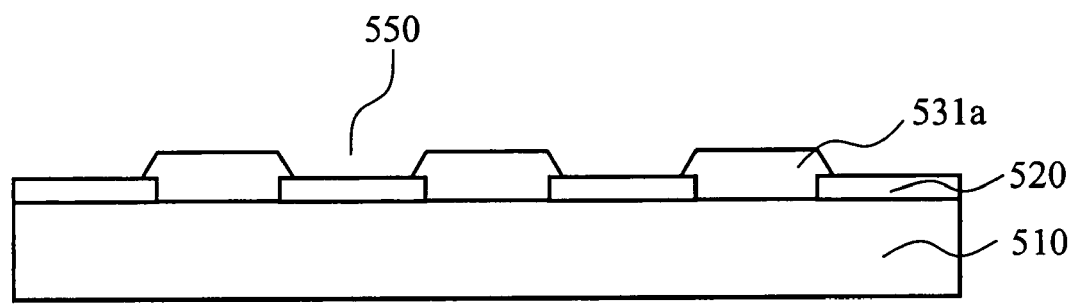

As illustrated in FIGS. 21G, 22G and 23G, if the development process is carried out, the second exposure photoresist 531c and the non-exposure photoresist 531a do not dissolve in a base developer, whereas only the third exposure photoresist 531d is removed. As a result, as illustrated in FIG. 21G, the photoresist pattern in an area crossing with the first electrodes 520 forms a negative profile due to an etching of the third exposure photoresist 531b, and the non-exposure photoresist 531a remains thereunder.

The photoresist pattern in parallel with the first electrodes 520, on which second electrodes 580 run, is shielded by the second exposure mask pattern in the second exposure process and, thus, the second exposure photoresist mask 531c is not formed as shown in FIG. 23G. In the third exposure process, the third exposure photoresist 531d is formed and developed by controlling an exposure amount, thereby comparatively lowering a thickness of the photoresist pattern in parallel with the first electrodes 520 than that of the photoresist pattern crossing with the first electrodes 520.

The reason for lowering the thickness of the photoresist pattern in parallel with the first electrodes 520, on which the second electrodes 580 run, is to exclude a possibility of a short circuit occurring since a film thickness of the second electrodes 580 formed in a direction perpendicular to the first electrodes 520 becomes thinner when the second electrodes 580 are deposited at a boundary between edges of the photoresist pattern and the first electrodes 520. In this case, the remaining thickness of the non-exposure photoresist 531a is about 0.5 to 2 μm.

Figure 21H:
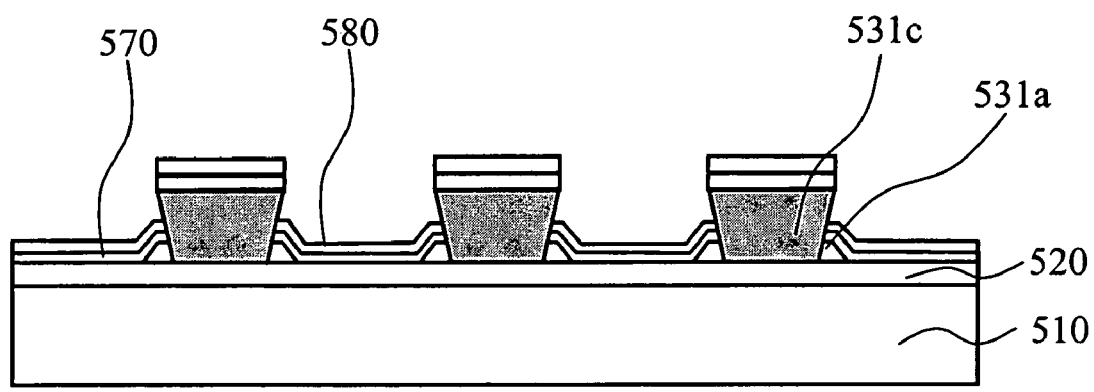
Figure 22H:
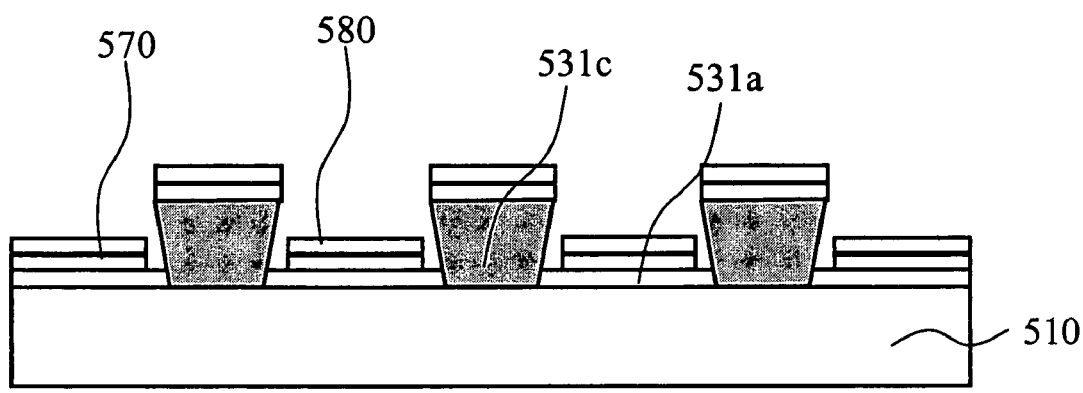
Figure 23H:
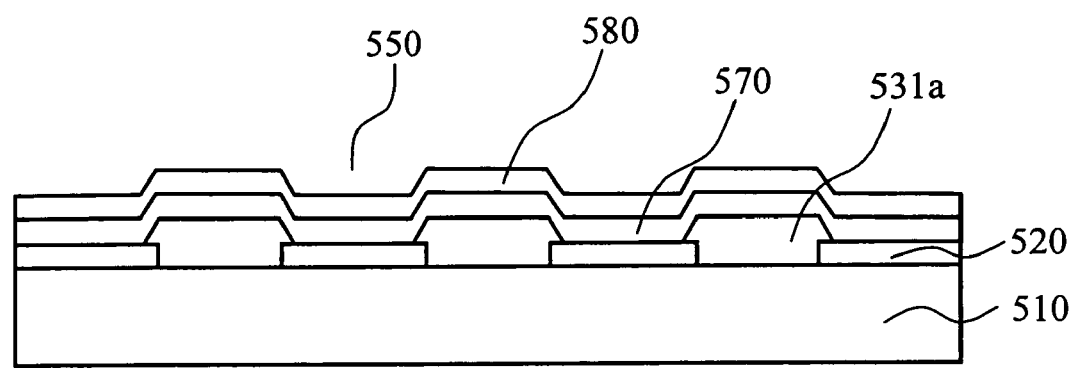

As shown in FIGS. 21H, 22H and 23H, after the development process has been completed, a dry process such as an air knife or a spin dry is carried out on the transparent substrate 520 at a temperature lower than 100° C. Then, the transparent substrate 510 undergoes a postbaking process and is then transferred to a vacuum deposition apparatus, and the organic light-emitting layers 570 are stacked on the transparent substrate 510 including the photoresist pattern in the vacuum deposition apparatus.

Thereafter, the second electrodes 580 are formed on the transparent substrate 510 including the organic light-emitting layers 570. The second electrodes 580 mainly use a metal having an excellent electric conductivity such as Al or the like, and are stacked by a vacuum deposition. And, an encapsulation plate (not shown) made of a metal, a glass, or the like is formed on an entire surface including the second electrodes 580 so as to make the organic light-emitting layers 570 vulnerable to moisture and oxygen airtight from the outside.

Hereinafter, a fabricating method of an organic electroluminescence display in accordance with a fourth preferred embodiment of the present invention will be described in detail with reference to the accompanying drawings.

FIG. 24 is a plan view of the organic electroluminescence display in accordance with the fourth preferred embodiment of the present invention.

A plurality of first electrodes 620 that have a specific width and are made of indium tin oxide (ITO) or the like are arranged on a transparent substrate 610 in a stripe type. A lattice type insulating pattern 631 composed of a photoresist pattern is stacked on an area between the adjacent first electrodes 620 and an area crossing with the first electrodes 620. Moreover, formed on the first electrodes 620 are openings 650 for exposing an area where pixels are formed. Therefore, the insulating pattern 631 in which the openings 650 where pixels are formed is exposed has a lattice shape.

Further, the insulating pattern 631 stacked in a direction in parallel with the first electrodes 620 is formed with a thickness thinner than that of the insulating pattern 631 stacked in a direction perpendicular to the first electrodes 620. This is for excluding a possibility of an open circuit occurring since the film thickness of second electrodes (not shown) formed in a direction perpendicular to the first electrodes 620 becomes thinner when the second electrodes are deposited at a boundary between edges of the insulating pattern 631 and the first electrodes 620.

Trenches 660 are formed on a central portion of the insulating pattern 631 stacked in a direction perpendicular to the first electrodes 620. Such trenches 660 have a function of preventing a short circuit between the second electrodes adjacent to each other. Herein, an organic light-emitting layers and the second electrodes (cathode layers) (not shown) are formed on the transparent substrate 610 including the openings 650.

Figure 25A:
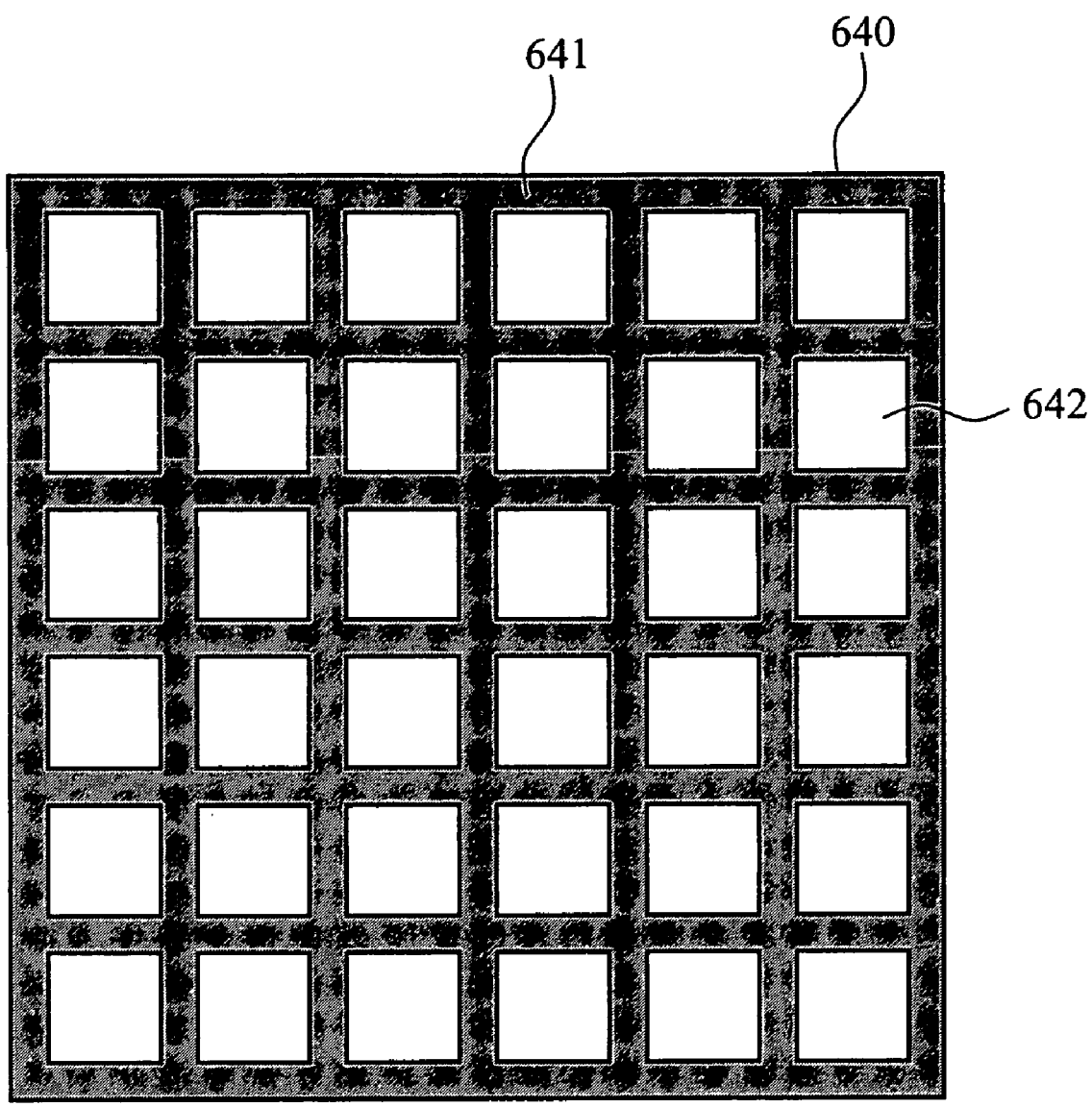
FIGS. 25A and 25B depict plan views of an exposure mask used in a fabricating method of the organic electroluminescence display in accordance with the fourth preferred embodiment of the present invention.
Figure 25B:
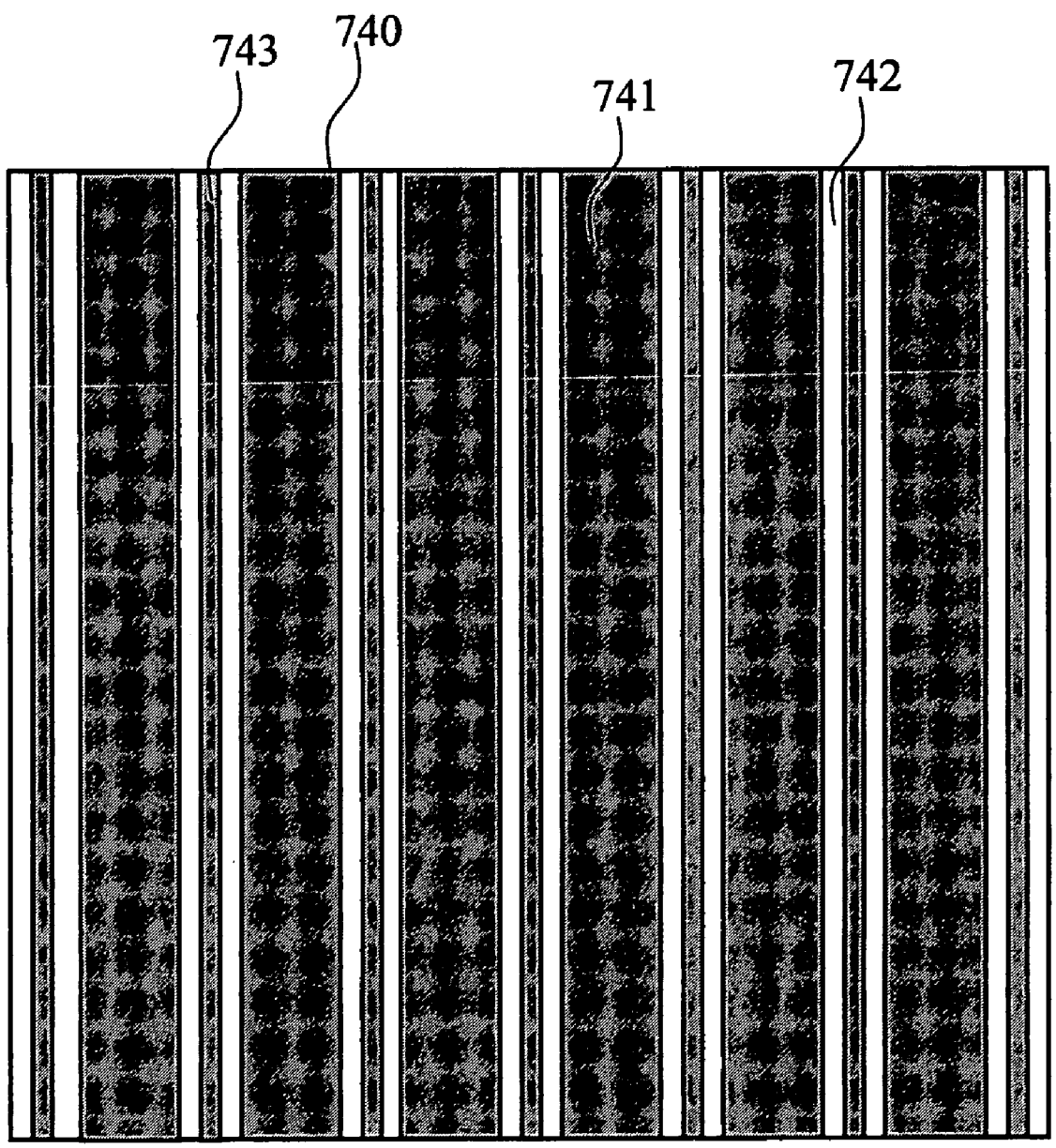

FIGS. 25A and 25B depict plan views of an exposure mask used in the fabricating method of the organic electroluminescence display in accordance with the fourth preferred embodiment of the present invention.

FIG. 25A shows a plan view of a first exposure mask 640. In the first exposure mask 640, a shield area 641 corresponds to the insulating pattern 631 between the first electrodes 610 in FIG. 24 and the insulating pattern 630b in a direction perpendicular to the first electrodes 620, and a light-transmitting area 642 corresponds to an opening 651 in FIG. 24.

FIG. 25B illustrates a plan view of a second exposure mask 740. In the second exposure mask 740, a shield area 741 corresponds to an area between the insulating pattern 631 in a direction perpendicular to the first electrodes 620 in FIG. 24, and a light-transmitting area 742 corresponds to the insulating pattern 631 in a direction perpendicular to the first electrodes 620 in FIG. 24. Further, a slit 743 having a shielding function is located at a central portion of the light-transmitting area 742.

Hereinafter, the fabricating method of the organic electroluminescence display in accordance with the fourth preferred embodiment of the present invention will be described in detail with reference to FIGS. 26A to 26G, FIGS. 27A to 27G and FIGS. 28A to 28G.

FIGS. 26A to 26G provide cross-sectional views illustrating a process of the fabricating method of the organic electroluminescence display in accordance with the fourth preferred embodiment of the present invention, which are taken along the line A-A' in FIG. 24.

FIGS. 27A to 27G present cross-sectional views illustrating the process of the fabricating method of the organic electroluminescence display in accordance with the fourth preferred embodiment of the present invention, which are taken along the line B-B' in FIG. 24.

FIGS. 28A to 28G represent cross-sectional views illustrating the process of the fabricating method of the organic electroluminescence display in accordance with the fourth preferred embodiment of the present invention, which are taken along the line C-C' in FIG. 24.

Figure 26A:
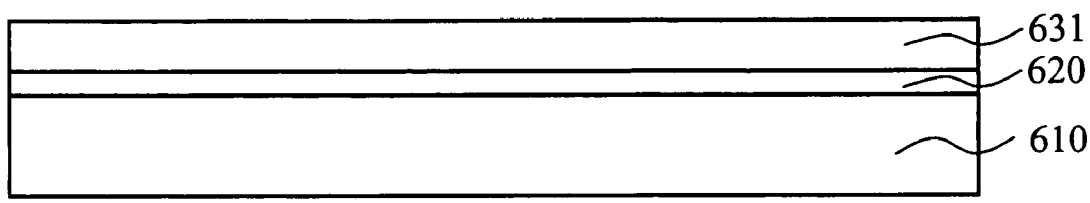
FIGS. 26A to 26G provide cross-sectional views illustrating a process of the fabricating method of the organic electroluminescence display in accordance with the fourth preferred embodiment of the present invention, which are taken along the line A-A' in FIG. 24.
Figure 27A:
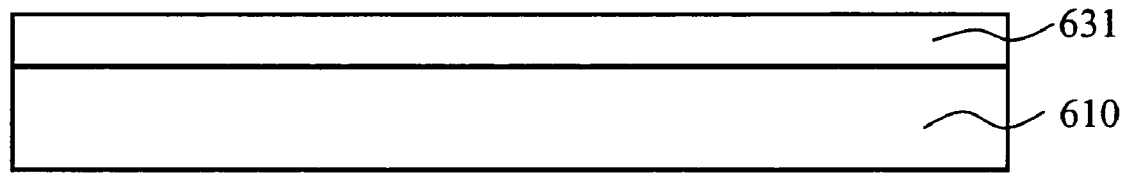
FIGS. 27A to 27G present cross-sectional views illustrating the process of the fabricating method of the organic electroluminescence display in accordance with the fourth preferred embodiment of the present invention, which are taken along the line B-B' in FIG. 24.
Figure 28A:
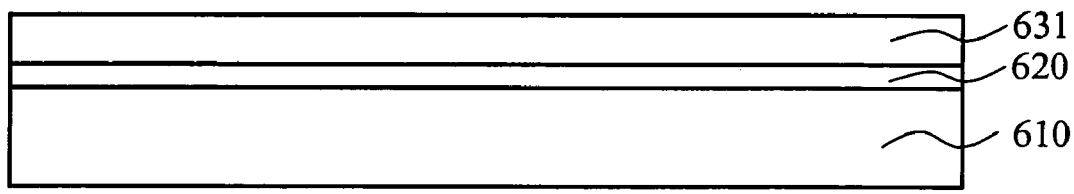
FIGS. 28A to 28G represent cross-sectional views illustrating the process of the fabricating method of the organic electroluminescence display in accordance with the fourth preferred embodiment of the present invention, which are taken along the line C-C' in FIG. 24.

As shown in FIGS. 26A, 27A and 28A, the transparent substrate 610 that has been cleaned is prepared. As for the transparent substrate 610, a glass substrate is generally used. An anode layer is deposited on the cleaned transparent substrate 610 by a sputtering, and a photoresist (not shown) is coated thereon. Then, an exposure and a development to the photoresist are carried out, thereby forming a stripe type photoresist pattern (not shown). The anode layer is etched by using the photoresist pattern as a mask, thereby forming the stripe type first electrodes 620.

Thereafter, a process for forming an insulating layer is carried out in order to inhibit a leakage current from the edges of the first electrodes 620. Further, the photoresist layer 631 having a property of an image reversal is coated on the transparent substrate 610 having the first electrodes 620 formed thereon. AZ 5214E (Clariant) is used for the photoresist 631. The photoresist 631 is formed to have 1 μm to 5 μm thick and, preferably, 3 μm to 5 μm thick. Such photoresist 631 basically has a property of a positive photosensitive material. Yet, once the heat is applied to the photoresist at a certain temperature, generally, from 115° C. to 125° C. for 90 to 120 seconds after the exposure, the exposed portion thereof is image-reversed and, then, becomes insoluble in a developer.

Figure 26B:
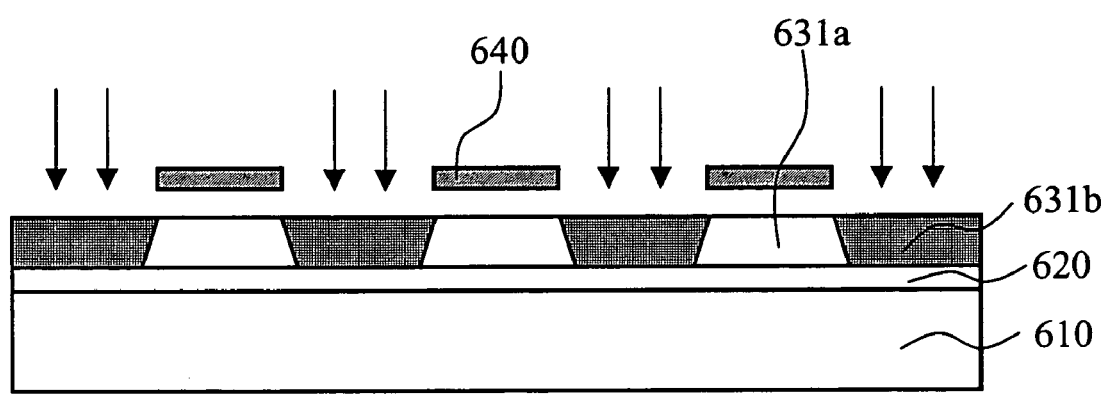
Figure 27B:
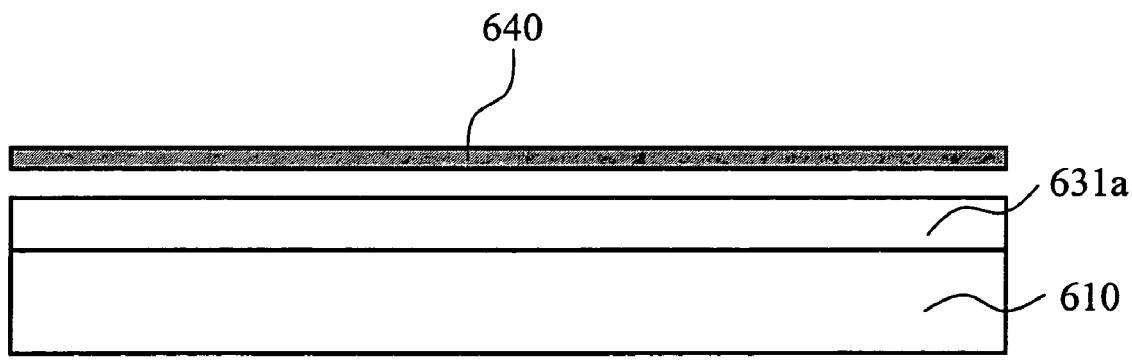
Figure 28B:
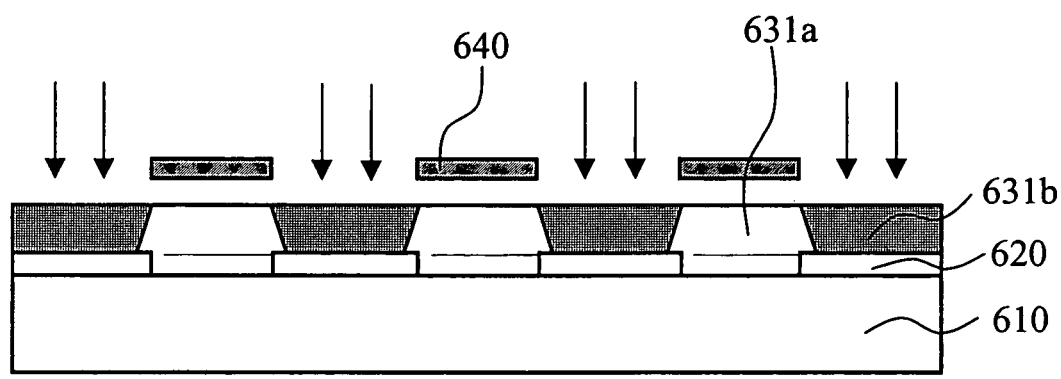

As can be seen from FIGS. 26B, 27B and 28B, after the photoresist 631 having a thickness of about 4 μm is coated on the transparent substrate 610 having the first electrodes 620 formed thereon, a prebaking is carried out at 100° C. for about 60 seconds so as to dry the photoresist 631. Then, a first exposure process is carried out to shield an area between the first electrodes 620 and an area crossing with the first electrodes 620 and, then, expose the photoresist 631 over 330 mJ/cm$^2$ to 500 mJ/cm$^2$, by using the first exposure mask 640 in FIG. 25A.

The photoresist 631 is divided into a non-exposure photoresist 631a and a first exposure photoresist 631b by the first exposure process. The non-exposure photoresist 631a becomes insoluble in an alkaline developer, as same as the photoresist 631, and the first exposure photoresist 631b becomes removable by the alkaline developer.

Figure 26C:
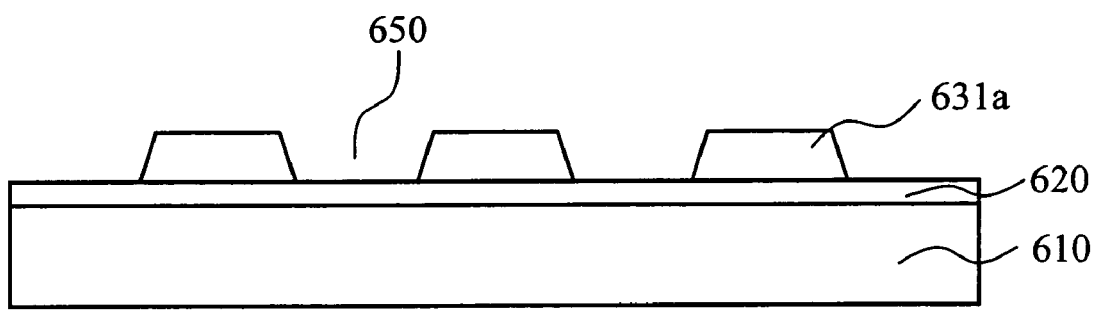
Figure 27C:
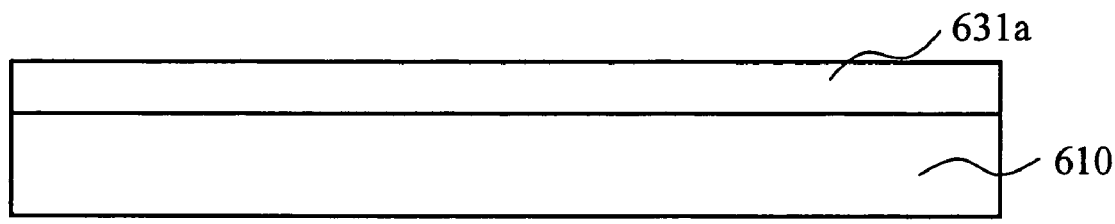
Figure 28C:
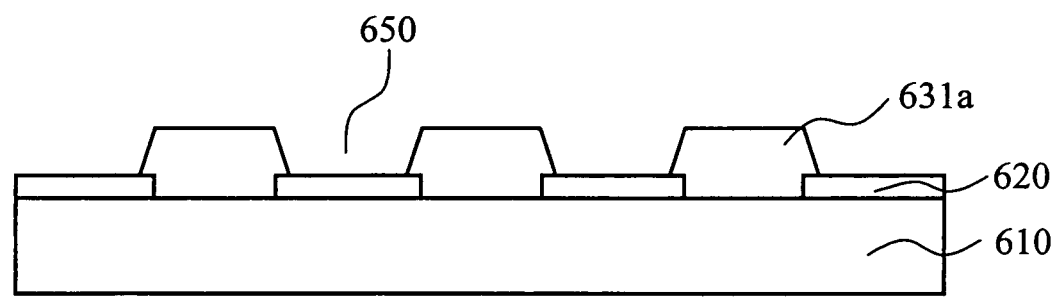

Sequentially, as depicted in FIGS. 26C, 27C and 28C, if the first exposure photoresist 631b is removed by the alkaline developer, the non-exposure photoresist 631a remains in an area between the first electrodes 620 and an area crossing with the first electrodes 620, thereby forming on the first electrodes 620 a lattice type photoresist pattern having the openings 650 for exposing an area where pixels are formed. In this case, the photoresist pattern has a positive profile.

Figure 26D:
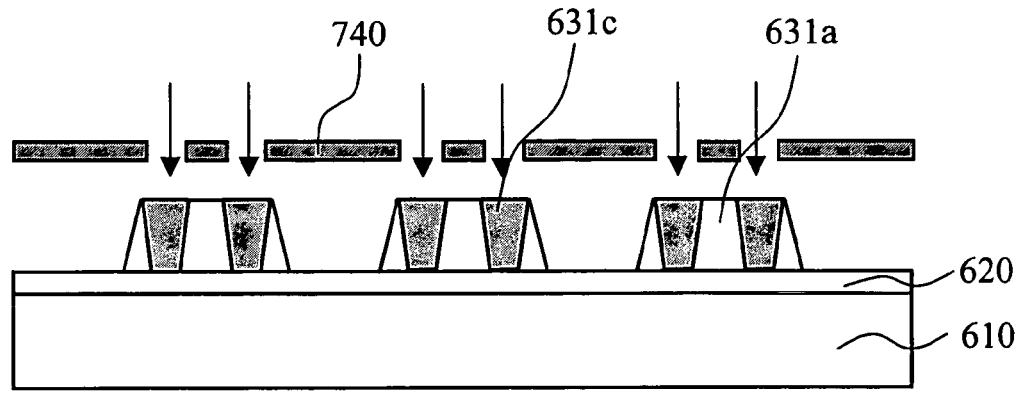
Figure 27D:
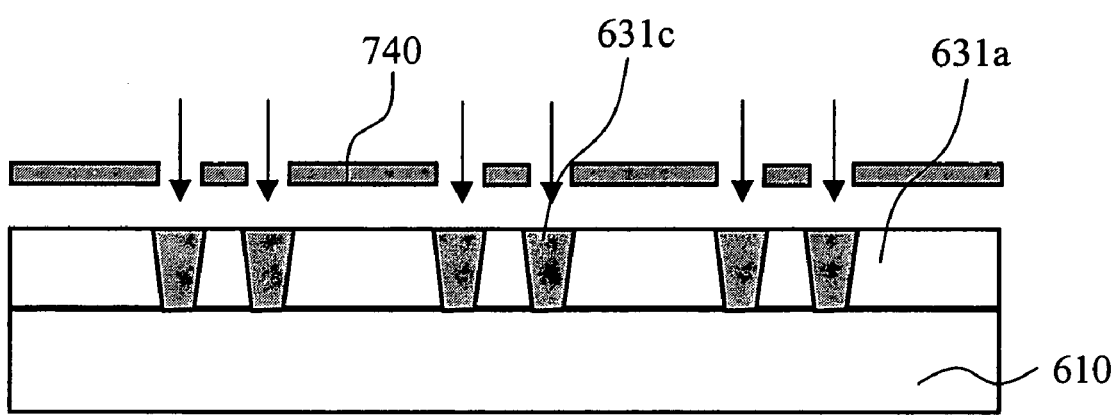
Figure 28D:
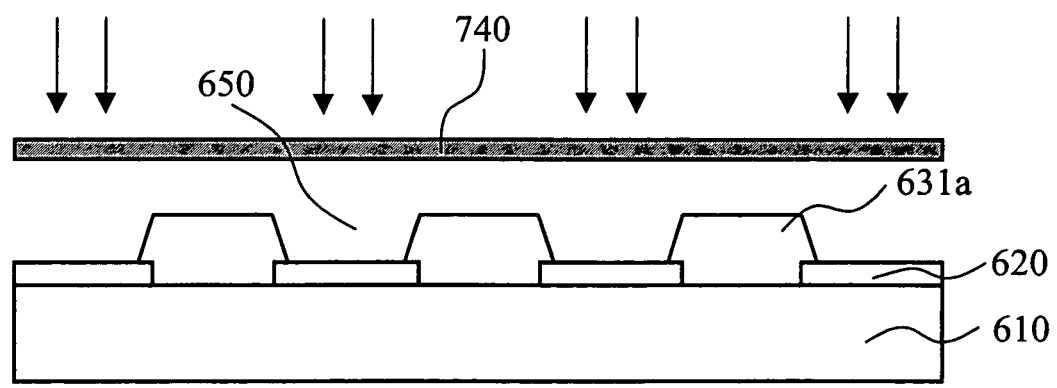

As described in FIGS. 26D, 27D and 28D, a second exposure process is carried out to expose the non-exposure layer 631a crossing with the first electrodes 620 at about 13 to 35 mJ/cm$^2$ by using the second exposure mask 740 in FIG. 25B.

In this case, in the second exposure mask 740, a width of a light-transmitting area including the slit 743 having the shielding function is designed to be narrower than that of the non-exposure photoresist 631a in an area crossing with the first electrodes 620.

In the second exposure mask 740, a shield area corresponds to a central portion of the non-exposure photoresist 631a and the removed first exposure photoresist 631b by the development, and a peripheral portion of the non-exposure photoresist 631a in a direction perpendicular to the first electrodes 620 forms a light-transmitting area. If the second exposure process is carried out, the peripheral portion of the non-exposure photoresist 631a in a direction perpendicular to the first electrodes 620 is exposed, whereas the central portion thereof is not exposed.

After the second exposure process is carried out, if the exposed portion is image-reversed by carrying out a heat treatment at 120° C. for 120 seconds, the peripheral portion of the non-exposure photoresist 631a is formed as a second exposure photoresist 631c, and a central portion and both sides thereof remain as the non-exposure photoresist 631a.

The second exposure photoresist 631c has a negative property and a characteristic of being insoluble in an alkaline developer. Further, since only the non-exposure photoresist 631a in an area crossing with the first electrodes 620 is exposed, the exposed portion is not shown in FIG. 28D taken along the line C-C' in FIG. 24.

Figure 26E:
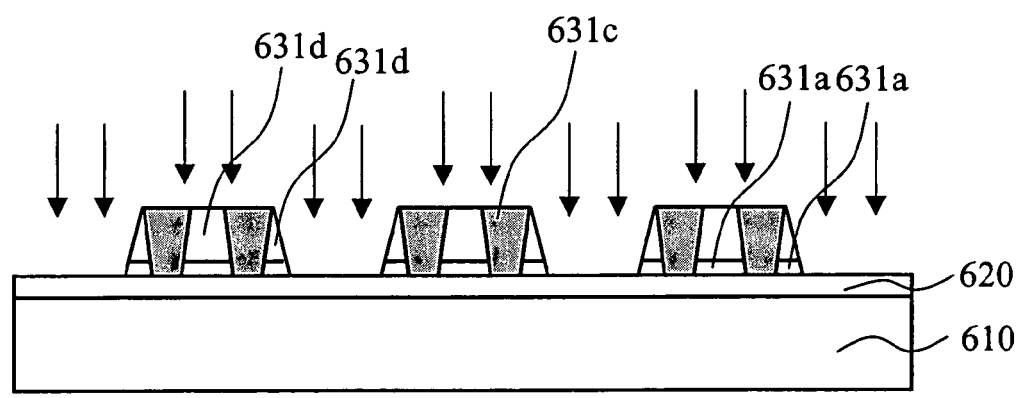
Figure 27E:
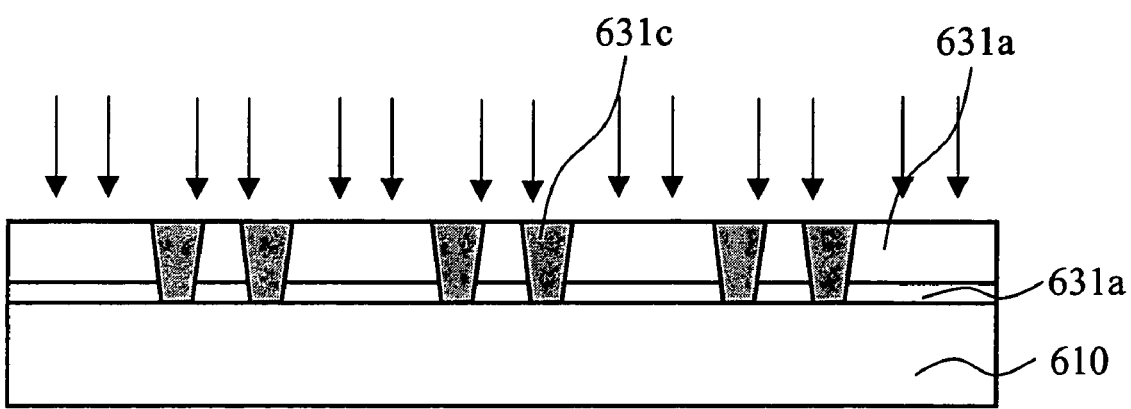
Figure 28E:
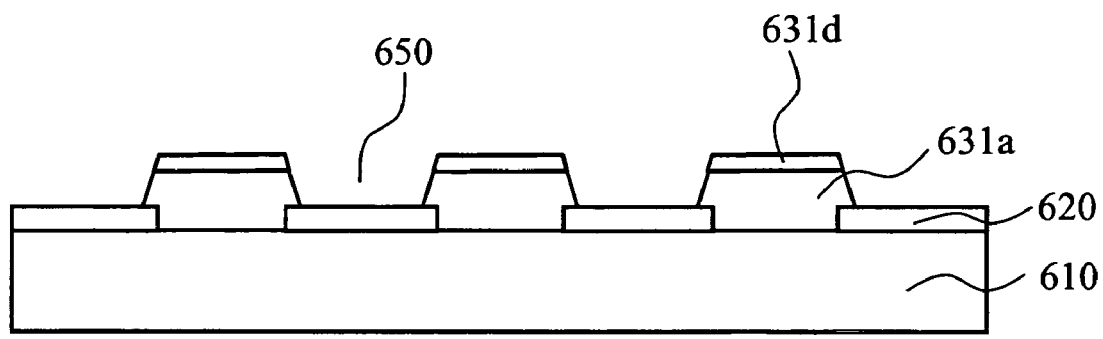

As illustrated in FIGS. 26E, 27E and 28E, a third exposure process in which a flood exposure is carried out at about 140 mJ/cm$^2$ to 230 mJ/cm$^2$ without using a mask is performed. If the third exposure process is carried out, the second exposure photoresist 631c in an area perpendicular to the first electrodes 620, which is image-reversed to have a property of being insoluble in a developer, is maintained. However, the non-exposure photoresist 631a formed at the side and the central portion of the second exposure photoresist 631c is exposed, thereby forming a third exposure photoresist 631d. Since a predetermined thickness of an insulating layer in parallel with the first electrodes 620 needs to remain in the third exposure process, an exposure amount is controlled to achieve the predetermined thickness of the insulating layer in parallel with the first electrodes 620 remains by controlling. Thus, a lower side portion of the insulating layer perpendicular to the first electrodes 620 remains as the non-exposure photoresist 631a after the development.

Figure 26F:
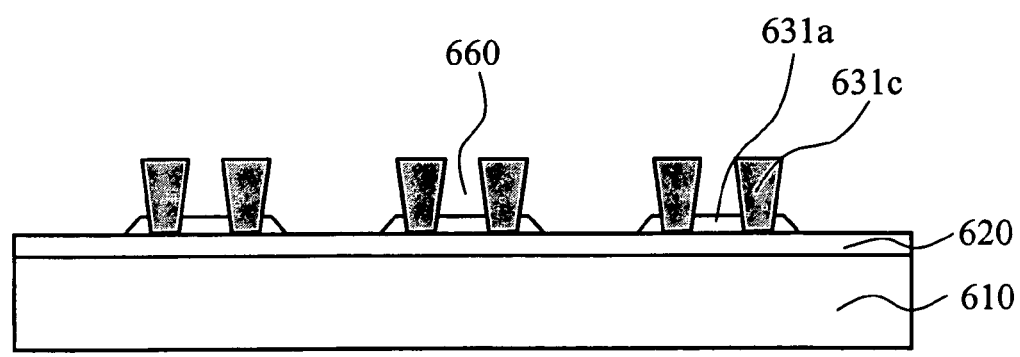
Figure 27F:
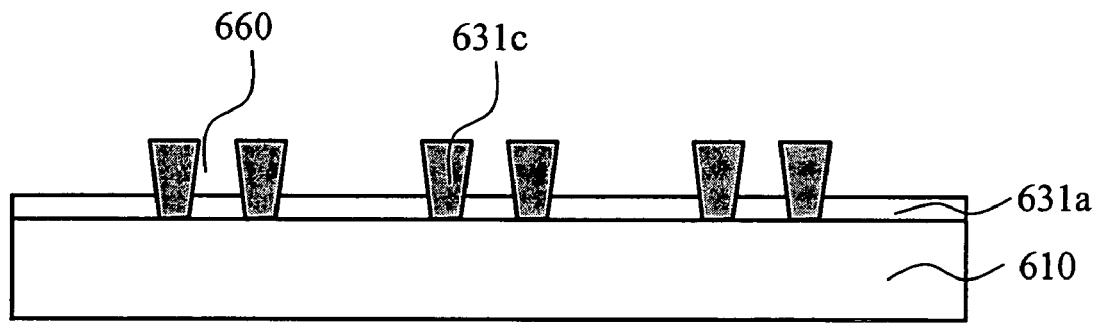
Figure 28F:
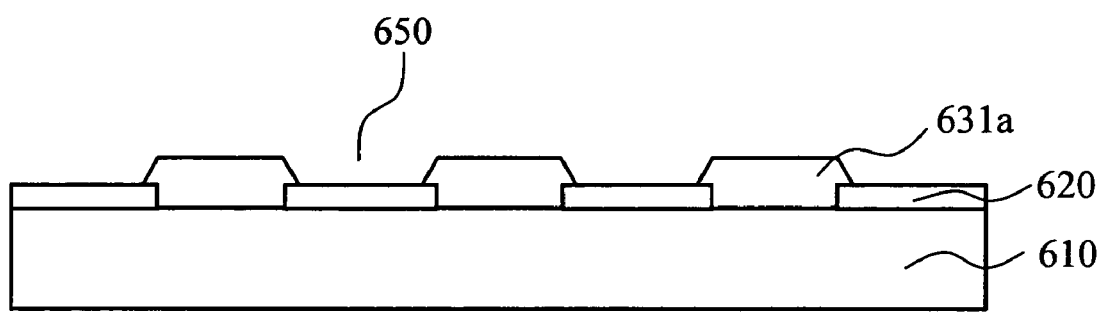

As illustrated in FIGS. 26F, 27F and 28F, if the development process is carried out, the second exposure photoresist 631c and the non-exposure photoresist 631a do not dissolve in the base developer, whereas only the third exposure photoresist 631d is removed. Accordingly, as illustrated in FIG. 27F, in a photoresist pattern in an area 0crossing with the first electrodes 620, the trenches 660 are formed at a central portion of the photoresist pattern due to an etching of the third exposure photoresist 631d; a negative profile is formed at the central portion and a side portion thereof by a development of the third exposure photoresist 631d; and the non-exposure photoresist 631a remains at a lower portion thereof.

The photoresist pattern in parallel with the first electrodes 620, on which the second electrodes 680 run, is shielded by the second exposure mask 740 in the second exposure process and, thus, the second exposure photoresist 631c is not formed as shown in FIG. 29F. In the third exposure process, the third exposure photoresist 631d is formed and developed by controlling an exposure amount, thereby comparatively lowering a thickness of the photoresist pattern in parallel with the first electrodes 620 than that of the photoresist pattern crossing with the first electrodes 620.

The reason for lowering the thickness of the photoresist pattern in parallel with the first electrodes 620, on which the second electrodes 680 run, is to exclude a possibility of a open circuit occurring since a film thickness of the second electrodes 680 formed in a direction perpendicular to the first electrodes 620 becomes thinner when the second electrodes 680 are deposited at a boundary between edges of the photoresist pattern and the first electrodes 620. In this case, the remaining thickness of the non-exposure photoresist 631a is about 0.5 to 2 μm.

Figure 26G:
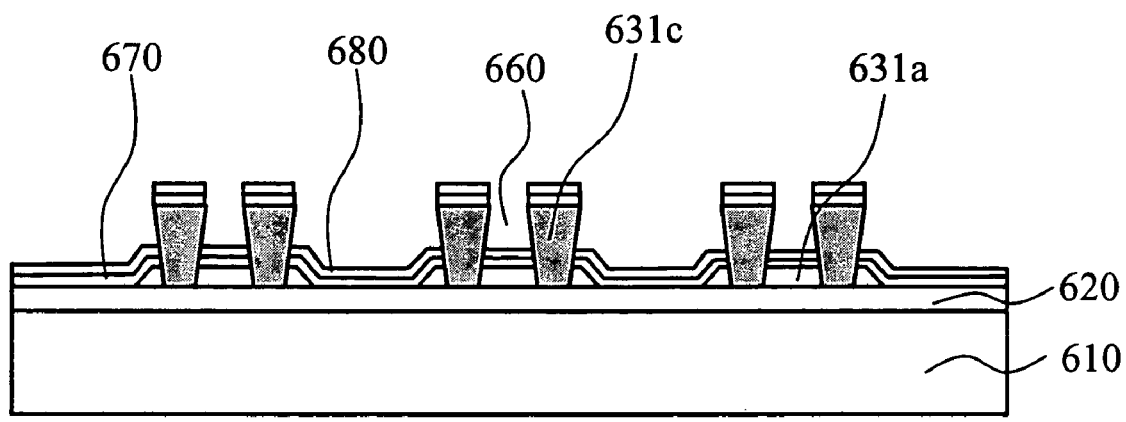
Figure 27G:
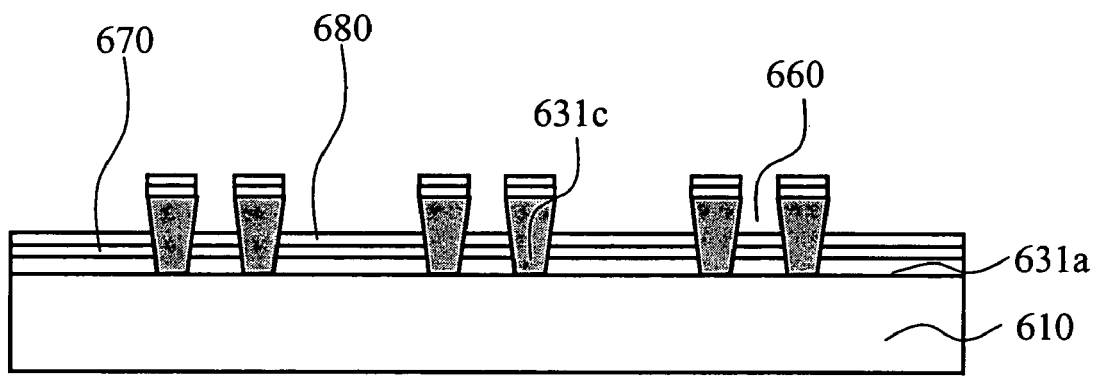
Figure 28G:
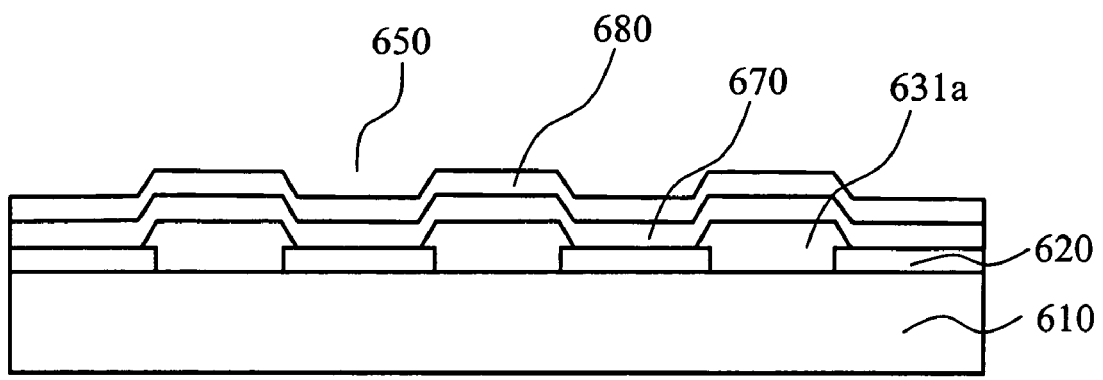

As shown in FIGS. 26G, 27G and 28G, after the development process has been completed, a dry process such as an air knife or a spin dry is carried out on the transparent substrate 620 at a temperature lower than 100° C. Then, the transparent substrate 610 is subject to a postbaking process, and then is transferred to a vacuum deposition apparatus. The organic light-emitting layers 670 are stacked on the transparent substrate 610 including the photoresist pattern in the vacuum deposition apparatus. Thereafter, the second electrodes 680 are formed on the transparent substrate 610 including the organic light-emitting layers 670.

The trenches 660 formed on the central portion of the photoresist pattern perpendicular to the first electrodes 620 have a function of preventing a possibility of a short circuit with adjacent pixels when the organic light-emitting layers 670 and the second electrodes 680 are being stacked. A depth of the trenches 660 is preferably greater than a sum of a deposition thickness of the organic light-emitting layers 670 and the second electrodes 680 that will be deposited later. Specifically, the depth of the trenches 660 is preferably greater than the sum of the thickness of the organic light-emitting layers 670 and the second electrodes 680 by 1.5 to 5 times.

The second electrodes 680 mainly use a metal having an excellent electric conductivity such as Al or the like, and are stacked by a vacuum deposition. And, an encapsulation plate (not shown) made of a metal, a glass, or the like is formed on an entire surface including the second electrodes 680 so as to make the organic light-emitting layers 670 vulnerable to moisture and oxygen airtight from the outside.

The followings are effects of the organic electroluminescence display in accordance with the present invention and the fabricating method thereof.

First, in a prior art, it is difficult to design a half tone mask that is necessary for a fabrication of an insulating film serving as an insulating layer and a separator as well and, further, a product cost increases due to a high cost of the half tone mask in comparison with that of a general mask by about 1.5 times or more. However, in the present invention, it is possible to easily fabricate as a single layer the insulating film serving as the insulating pattern and the separator by using the general mask without requiring an additional parameter manipulation. Accordingly, a fabrication process becomes simple, and a cost of materials is reduced.

Second, since the insulating pattern and the separators are formed as a single photoresist, there is no adhesion problem. Further, an alignment margin required for forming two layers of the insulating pattern and the separator is eliminated, thereby increasing an opening ratio and a yield and decreasing the product cost.

While the invention has been shown and described with respect to the preferred embodiments, it will be understood by those skilled in the art that various changes and modifications may be made without departing from the spirit and scope of the invention as defined in the following claims.

What is claimed is:

1. A method of fabricating an organic electroluminescence display, comprising the steps of:
    (a) forming a plurality of stripe type first electrodes on a substrate;
    (b) forming an insulating layer on the substrate including the first electrodes;
    (c) patterning the insulating layer to form a lattice type first insulating pattern in a first area crossing with the first electrodes and a second area between the first electrodes;

(d) carrying out an image reversal on the first insulating pattern on the first area;

(e) etching an upper portion of the first insulating pattern on the second area to form a second insulating pattern;

(f) forming a plurality of organic light-emitting layers on the first electrodes; and (g) forming a plurality of second electrodes on the organic light-emitting layers, wherein the step (d) includes the steps of:

exposing the first insulating pattern while aligning one side of a light-transmitting area of an exposure mask with an inner portion of the first insulating pattern on the first area and the other side of the light-transmitting area with an outer portion of the first insulating pattern on the first area; and carrying out an image reversal by performing a heat treatment on the exposed first insulating pattern on the first area.

2. The method of fabricating an organic electroluminescence display of claim 1, wherein the step (d) includes the steps of:

exposing the first insulating pattern by using the exposure mask having a light-transmitting area whose width is narrower than that of the first insulating pattern on the first area.

3. The method of fabricating an organic electroluminescence display of claim 2, wherein a center of the light-transmitting area of the exposure mask is aligned with a center of the first insulating pattern on the first area.

4. The method of fabricating an organic electroluminescence display of claim 1, wherein the step (e) includes the steps of:

exposing the upper portion of the first insulating pattern on the second area by carrying out a flood exposure; and developing the upper portion of the first insulating pattern on the second area to form the second insulating pattern.

5. The method of fabricating an organic electroluminescence display of claim 4, wherein an exposed and an unexposed insulating layer are respectively formed at an upper and a lower portion of both sides of the first insulating pattern on the first area by carrying out the flood exposure, and the exposed insulating layer is removed by a developing process.

6. The method of fabricating an organic electroluminescence display of claim 5, wherein the exposed insulating layer is removed from said both sides of the second insulating pattern on the first area, thereby forming a negative profile.

7. The method of fabricating an organic electroluminescence display of claim 1, wherein the step (e) includes the steps of:

exposing an upper central portion of the first insulating pattern on the first area by using an exposure mask having a light-transmitting area corresponding to the first insulating pattern on the first area;

carrying out an image reversal by performing a heat treatment on the exposed upper central portion of the first insulating pattern on the first area;

exposing an upper peripheral portion of the first insulating pattern on the first area and an upper portion of the first insulating pattern on the second area by carrying out a flood exposure; and etching the upper peripheral portion of the first insulating pattern on the first area and the upper portion of the first insulating pattern on the second area to form the second insulating pattern.

8. The method of fabricating an organic electroluminescence display of claim 1, wherein the step (e) includes the steps of:

exposing an upper portion of one side of the first insulating pattern on the first area and an upper portion of the first insulating pattern on the second area by carrying out a flood exposure; and etching the upper portion of said one side of the first insulating pattern on the first area and the upper portion of the first insulating pattern on the second area to form the second insulating pattern.

9. The method of fabricating an organic electroluminescence display of claim 8, wherein said one side of the first insulating pattern on the first area has a negative profile, and the other side thereof has a positive profile.

10. The method of fabricating an organic electroluminescence display of claim 1, the step (d) includes the steps of:

exposing the first insulating pattern on the first area by using the exposure mask having a shield area for shielding a portion corresponding to a central portion of the first insulating pattern on the first area and a light-transmitting area at a portion corresponding to a peripheral portion thereof; and carrying out an image reversal by performing a heat treatment on the peripheral portion of the exposed first insulating pattern on the first area.

11. The method of fabricating an organic electroluminescence display of claim 10, wherein the step (e) includes the steps of:

exposing an upper central portion and an upper portion of both sides of the first insulating pattern on the first area and an upper portion of the first insulating pattern on the second area by carrying out a flood exposure; and etching the upper central portion and the upper portion of said both sides of the first insulating pattern on the first area and the upper portion of the first insulating pattern on the second area to form the second insulating pattern.

12. The method of fabricating an organic electroluminescence display of claim 11, wherein a negative profile is formed at the central portion and said both sides of the first insulating pattern on the first area due to an etching of the exposed insulating layer.

13. The method of fabricating an organic electroluminescence display of claim 10, wherein trenches crossing with the first electrodes are formed at the central portion of the first insulating pattern on the first area.

14. The method of fabricating an organic electroluminescence display of claim 13, wherein a depth of the trenches is greater than a sum of a thickness of the organic light-emitting layers and the second electrodes by 1.5 to 5 times.

15. The method of fabricating an organic electroluminescence display of claim 1, wherein the image reversal is carried out on the exposed first insulating pattern by performed the heat treatment at a temperature from 115° C. to 125° C. for 90 to 120 seconds.

16. The method of fabricating an organic electroluminescence display of claim 1, wherein a thickness of the second insulating pattern is formed in a way that a thickness of the second area is thinner than that of the first area.

17. The method of fabricating an organic electroluminescence display of claim 1, wherein the insulating layer has a characteristic of an image reversal and a thickness of the insulating layer is 1 µm to 5 µm.

18. The method of fabricating an organic electroluminescence display of claim 1, wherein the insulating layer has a property of a positive photosensitive material, and the property of the insulating layer is changed into that of a negative photosensitive material if a flood exposure is carried out after exposing the insulating layer and carrying out a heat treatment at a temperature over at 115° C. to 125° C.

19. The method of fabricating an organic electroluminescence display of claim 1, wherein the first insulating pattern is formed by exposing and developing the photoresist at 330 mJ/cm2 to 500 mJ/cm2 by using a mask having a shield area located at a portion corresponding to the first area perpendicular to the first electrodes and the second area between the first electrodes.

20. The method of fabricating an organic electroluminescence display of claim 1, wherein the second insulating pattern is formed by exposing and developing the first insulating pattern at 140 mJ/cm2 to 230 mJ/cm2 after carrying out the image reversal.

21. A method of fabricating an organic electroluminescence display, comprising the steps of:
   (a) forming a plurality of stripe type first electrodes on a substrate;
   (b) forming an insulating layer on the substrate including the first electrodes;
   (c) patterning the insulating layer to form a lattice type first insulating pattern in a first area crossing with the first electrodes and a second area between the first electrodes;
   (d) carrying out an image reversal on the first insulating pattern on the first area;
   (e) etching an upper portion of the first insulating pattern on the second area to form a second insulating pattern;
   (f) forming a plurality of organic light-emitting layers on the first electrodes; and
   (g) forming a plurality of second electrodes on the organic light-emitting layers,
   wherein the step (d) includes the steps of:
   exposing the first insulating pattern while aligning one side of a light-transmitting area of an exposure mask with an inner portion of the first insulating pattern on the first area and the other side of the light-transmitting area with an outer portion of the first insulating pattern on the first area;
   diffusing an image reversal base catalyst containing an amine group into the first insulating pattern; and
   carrying out the image reversal on the exposed first insulating pattern on the first area by performing a baking process.

22. The method of fabricating an organic electroluminescence display of claim 21, wherein the amine group is selected from at least one of imidazole, monazoline, triethanolamine and ammonia.

23. The method of fabricating an organic electroluminescence display of claim 21, wherein the baking process is carried out at a temperature 85° C. to 105° C. for 45 to 120 minutes.

24. A method of fabricating an organic electroluminescence display comprising the steps of:
   (a) forming a plurality of stripe type first electrodes on a substrate;
   (b) forming an insulating layer on the substrate including the first electrodes;
   (c) forming a lattice type first insulating pattern in a first area crossing with the first electrodes and a second area between the first electrodes by patterning the insulating layer;
   (d) exposing the first insulating pattern while aligning one side of a light-transmitting area of an exposure mask with an inner portion of the first insulating pattern on the first area and the other side of the light-transmitting area with an outer portion of the first insulating pattern on the first area;
   (e) carrying out an image reversal by performing a heat treatment on the exposed first insulating pattern on the first area;
   (f) forming an exposed photoresist at an upper portion of the first insulating pattern on the second area and an upper portion of both sides of the first insulating pattern on the first area by carrying out a flood exposure;
   (g) forming a second insulating pattern in a way that the exposed insulating layer is removed by a developing process;
   (h) forming a plurality of organic light-emitting layers on the first electrodes; and
   (i) forming a plurality of second electrodes on the organic light-emitting layers.

25. A method of fabricating an organic electroluminescence display comprising the steps of:
   (a) forming a plurality of stripe type first electrodes on a substrate;
   (b) forming an insulating layer on the substrate including the first electrodes;
   (c) forming a lattice type first insulating pattern in a first area crossing with the first electrodes and a second area between the first electrodes by patterning the insulating layer;
   (d) exposing the first insulating pattern on the first area;
   (e) diffusing an image reversal base catalyst into the first insulating pattern;
   (f) carrying out an image reversal on the exposed first insulating pattern on the first area by performing a baking process;
   (g) forming an exposed photoresist at an upper portion of the first insulating pattern on the second area and an upper portion of both sides of the first insulating pattern on the first area by carrying out a flood exposure;
   (h) forming a second insulating pattern in a way that the exposed insulating layer is removed by a developing process;
   (i) forming a plurality of organic light-emitting layers on the first electrodes; and
   (j) forming a plurality of second electrodes on the organic light-emitting layers,
   wherein the step (d) includes exposing the first insulating pattern while aligning one side of a light-transmitting area of an exposure mask with an inner portion of the first insulating pattern on the first area and the other side of the light-transmitting area with an outer portion of the first insulating pattern on the first area.

26. A method of fabricating an organic electroluminescence display comprising the steps of:
   (a) forming a plurality of stripe type first electrodes on a substrate;
   (b) forming an insulating layer on the substrate including the first electrodes;
   (c) forming a lattice type first insulating pattern in a first area crossing with the first electrodes and a second area between the first electrodes by patterning the insulating layer;
   (d) exposing the first insulating pattern on the first area by using an exposure mask having a shield area for shielding a portion corresponding to a central portion of the first insulating pattern of the first area and a light-transmitting area at a portion corresponding to a peripheral portion thereof; and
   (e) carrying out an image reversal by performing a heat treatment on the peripheral portion of the exposed first insulating pattern on the first area;

(f) forming an exposed photoresist at an upper portion of the first insulating pattern on the second area and an upper central portion and an upper portion of both sides of the first insulating pattern on the first area by carrying out a flood exposure;

(g) forming a second insulating pattern in a way that the exposed insulating layer is removed by a developing process;

(h) forming a plurality of organic light-emitting layers on the first electrodes; and (i) forming a plurality of second electrodes on the organic light-emitting layers, wherein the step (d) includes exposing the first insulating pattern while aligning one side of a light-transmitting area of an exposure mask with an inner portion of the first insulating pattern on the first area and the other side of the light-transmitting area with an outer portion of the first insulating pattern on the first area.

* * * * *

UNITED STATES PATENT AND TRADEMARK OFFICE
CERTIFICATE OF CORRECTION

PATENT NO. : 7,622,899 B2  
APPLICATION NO. : 11/168665  
DATED : November 24, 2009  
INVENTOR(S) : Yi et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1183 days.

Signed and Sealed this

Fourteenth Day of December, 2010

David J. Kappos  
*Director of the United States Patent and Trademark Office*